US011843394B2

(12) United States Patent
Li et al.

(10) Patent No.: US 11,843,394 B2
(45) Date of Patent: *Dec. 12, 2023

(54) PROCESSING METHOD AND DEVICE FOR QUASI-CYCLIC LOW DENSITY PARITY CHECK CODING

(71) Applicant: ZTE Corporation, Guangdong (CN)

(72) Inventors: Liguang Li, Guangdong (CN); Jun Xu, Guangdong (CN); Jin Xu, Guangdong (CN)

(73) Assignee: ZTE Corporation, Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/843,677

(22) Filed: Jun. 17, 2022

(65) Prior Publication Data

US 2022/0337268 A1 Oct. 20, 2022

Related U.S. Application Data

(63) Continuation of application No. 16/651,303, filed as application No. PCT/CN2017/085786 on May 24, 2017, now Pat. No. 11,368,169.

(30) Foreign Application Priority Data

Mar. 24, 2017 (CN) ......................... 201710184762.5
May 22, 2017 (WO) ................ PCT/CN2017/085398

(51) Int. Cl.
*H03M 13/00* (2006.01)
*H03M 13/11* (2006.01)

(52) U.S. Cl.
CPC ....... *H03M 13/116* (2013.01); *H03M 13/616* (2013.01)

(58) Field of Classification Search
CPC .......................... H03M 13/116; H03M 13/616
See application file for complete search history.

(56) References Cited

U.S. PATENT DOCUMENTS 7,143,333 B2 11/2006 Blankenship et al.
8,356,232 B2 1/2013 Blankenship et al.
(Continued)

FOREIGN PATENT DOCUMENTS

CN 1808955 A 7/2006
CN 101005334 A 7/2007
(Continued)

OTHER PUBLICATIONS

Uropean Search Report for EP Application No. 16779550, dated Mar. 23, 2018, 12 pages.
(Continued)

*Primary Examiner* — Samir W Rizk
(74) *Attorney, Agent, or Firm* — Perkins Coie LLP

(57) ABSTRACT

Provided are a processing method and device for quasi-cyclic low density parity check (LDPC) coding. The processing method for LDPC coding includes: determining, according to a data feature of an information bit sequence to be encoded, a processing strategy for the quasi-cyclic LDPC coding according to a data feature of an information bit sequence to be encoded; and performing, according to the processing strategy and based on a base matrix and a lifting size, the quasi-cyclic LDPC coding and rate matching output on the information bit sequence according to the processing strategy, a base matrix and a lifting value. This technical solution is able to improve adaptability and flexibility of the quasi-cyclic LDPC coding.

20 Claims, 5 Drawing Sheets

(56) References Cited

U.S. PATENT DOCUMENTS

| | | | | |
|---|---|---|---|---|
| 8,607,125 | B2 | 12/2013 | Xu et al. | |
| 9,621,316 | B2 | 4/2017 | Kim et al. | |
| RE46,810 | E | 4/2018 | Jin et al. | |
| 10,320,419 | B2 | 6/2019 | Xu et al. | |
| 10,708,099 | B2 | 7/2020 | Xu et al. | |
| 2002/0103953 | A1 | 8/2002 | Das et al. | |
| 2004/0078392 | A1 | 4/2004 | Morita | |
| 2008/0098273 | A1 | 4/2008 | Blankenship et al. | |
| 2008/0141103 | A1 | 6/2008 | Miyazaki et al. | |
| 2008/0178065 | A1 | 7/2008 | Khandekar et al. | |
| 2008/0288850 | A1 | 11/2008 | Rhee et al. | |
| 2009/0199066 | A1 | 8/2009 | Kim et al. | |
| 2009/0228771 | A1 | 9/2009 | Shasha | |
| 2010/0208680 | A1 | 8/2010 | Nam et al. | |
| 2010/0251082 | A1 | 9/2010 | Cheng et al. | |
| 2010/0257425 | A1 | 10/2010 | Yue et al. | |
| 2010/0287441 | A1 | 11/2010 | Seo et al. | |
| 2011/0142168 | A1 | 6/2011 | Yano et al. | |
| 2011/0154154 | A1 | 6/2011 | Seo et al. | |
| 2011/0261775 | A1 | 10/2011 | Kim et al. | |
| 2011/0274059 | A1 | 11/2011 | Brown et al. | |
| 2012/0311397 | A1 | 12/2012 | Kim et al. | |
| 2012/0311414 | A1 | 12/2012 | Kim et al. | |
| 2013/0019145 | A1 | 1/2013 | Kim et al. | |
| 2013/0252624 | A1 | 9/2013 | Pajukoski et al. | |
| 2014/0185425 | A1 | 7/2014 | Kim et al. | |
| 2014/0198758 | A1 | 7/2014 | Nimbalker et al. | |
| 2014/0219386 | A1 | 8/2014 | Kim et al. | |
| 2014/0229789 | A1 | 8/2014 | Richardson | |
| 2014/0304574 | A1 | 10/2014 | Seo et al. | |
| 2015/0146644 | A1 | 5/2015 | Kim et al. | |
| 2016/0044534 | A1 | 2/2016 | Kim et al. | |
| 2016/0156432 | A1 | 6/2016 | Seo et al. | |
| 2016/0164537 | A1 | 6/2016 | Pisek et al. | |
| 2016/0204844 | A1 | 7/2016 | Sandberg et al. | |
| 2017/0187489 | A1 | 6/2017 | Myung et al. | |
| 2018/0013477 | A1 | 1/2018 | Kim et al. | |
| 2018/0098243 | A1 | 4/2018 | Kim et al. | |
| 2018/0226992 | A1 | 8/2018 | Panteleev et al. | |
| 2018/0278370 | A1 | 9/2018 | Jeong et al. | |
| 2019/0207703 | A1 | 7/2019 | Roh et al. | |
| 2019/0260390 | A1* | 8/2019 | Shutkin ............ | H03M 13/6393 |
| 2020/0235759 | A1 | 7/2020 | Ye et al. | |

FOREIGN PATENT DOCUMENTS

| | | | |
|---|---|---|---|
| CN | 101217337 | A | 7/2008 |
| CN | 101867440 | A | 10/2010 |
| CN | 102025441 | A | 4/2011 |
| CN | 102377437 | A | 3/2012 |
| CN | 102412842 | A | 4/2012 |
| CN | 102594492 | A | 7/2012 |
| CN | 104333390 | A | 2/2015 |
| CN | 104426553 | A | 3/2015 |
| CN | 104868925 | A | 8/2015 |
| EP | 1211839 | A2 | 6/2002 |
| EP | 2086143 | A2 | 8/2009 |
| JP | 2011-504038 | A | 1/2011 |
| JP | 2012-516621 | A | 7/2012 |
| KR | 20140123397 | A | 10/2014 |
| WO | 2009096658 | A1 | 8/2009 |
| WO | 2010093194 | A2 | 8/2010 |
| WO | 2010118592 | A1 | 10/2010 |
| WO | 2014007539 | A1 | 1/2014 |

OTHER PUBLICATIONS

International Search Report and Written Opinion for International Patent Application No. PCT/CN2016/078586, dated Jun. 27, 2016, 7 pages.

Ericsson: "Correction of reference measurement channel for 2048 kbps", 3GPP Draft; R4-020376, 3rd Generation Partnership Project (3GPP), Mobile Competence Centre; 650, Route Des Lucioles ; F-06921 Sophia-Antipolis Cedex; France, vol. RAN WG4, No. Sophia Antipolis, France; Jan. 28, 2002, Jan. 28, 2002 (Jan. 28, 2002), XP050170230, [retrieved on Jan. 28, 2002], 2 pages.

European Search Report for EP Application No. 20201352, dated Apr. 16, 2021, 12 pages.

Yan et al., "An Efficient LDPC Encoder Scheme with Low-power Low-parallel," Journal of Electronics & Information Technology, vol. 38, No. 9, Sep. 2016, Doi: 10.11999/JEIT 151362, 6 pages, English abstract included.

CATT, "Design of LDPC codes for eMBB data," 3GPP TSG RAN WG1 Meeting #88, Athens, Greece, Feb. 13-17, 2017, R1-1702107, 6 pages.

Xie, "Design of Rate-compatible Protograph-based LDPC Codes with Mixed Circulants," 2010 6th International Symposium on Turbo Codes & Iterative Information Processing, Sep. 28, 2010, 5 pages.

International Search Report and Written Opinion dated Dec. 27, 2017 for International Application No. PCT/CN2017/085786, filed on May 24, 2017 (12 pages).

Canadian office action issued in corresponding CA Patent Application No. 3,094,841, dated Oct. 12, 2021, 5 pages.

Canadian notice of allowance issued in corresponding CA Patent Application No. 3,094,841, dated Nov. 4, 2022, 1 page.

Chinese office action issued in corresponding CN Patent Application No. 201710184762.5, dated Oct. 9, 2021, 12 pages. English translation included.

Indonesian office action issued in corresponding ID Patent Application No. P00202007900, dated Oct. 5, 2022, 6 pages. English translation included.

Singapore office action issued in corresponding SG Patent Application No. 11202009379V, dated Feb. 8, 2022, 8 pages.

Huawei et al., "LDPC design for eMBB data," 3GPP TSG RAN WG1 Meeting #88, R1-1701706, Athens, Greece, Feb. 13-17, 2017, 7 pages.

Samsung, "Shift size granularity for LDPC code design," 3GPP TSG RAN WG1 #88, R1-1703089, Athens, Greece, Feb. 13-17, 2017, 3 pages.

Ericsson, "Code Block Segmentation for LDPC Codes," 3GPP TSG-RAN WG1 #88, R1-1701629, Athens, Greece, Feb. 13-17, 2017, 5 pages.

Intel Corporation, "LDPC design for data channel," 3GPP TSG RAN WG1 Meeting #87, R1-1612586, Reno, Nevada, Nov. 14-18, 2016, 7 pages.

Ericsson, "Design of LDPC Codes for NR," 3GPP TSG RAN WG1 Meeting #87, R1-1611321, Reno, USA, Nov. 14-18, 2016, 11 pages.

Nokia et al., "IR HARQ schemes for LDPC," 3GPP TSG-RAN WG1 #87, R1-1612281, Reno, USA, Nov. 14-18, 2016, 5 pages.

Tzimpragos et al., "Automatic Implementation of Low-Complexity QC-LDPC Encoders," School of Electrical and Computer Engineering, National Technical University of Athens, Athens, Greece, 978-1-4799-1170-7/13/, 2013, IEEE, pp. 243-246, 4 pages.

Park et al., "Structured Puncturing for Rate-Compatible B-LDPC Codes with Dual-Diagonal Parity Structure," IEEE Transactions on Wireless Communications, vol. 7, No. 10, Oct. 2008, pp. 3692-3696, 5 pages.

* cited by examiner

PROCESSING METHOD AND DEVICE FOR QUASI-CYCLIC LOW DENSITY PARITY CHECK CODING

CROSS-REFERENCE TO RELATED APPLICATIONS

This patent document is a continuation of U.S. patent application Ser. No. 16/651,303, filed on Sep. 21, 2020, which is a U.S. National Stage Application of and claims the benefit of priority to International Patent Application No. PCT/CN2017/085786, filed on May 24, 2017, which claims the benefit of priority to Chinese Patent Application No. 201710184762.5, filed on Mar. 24, 2017, and International Patent Application No. PCT/CN2017/085398, filed on May 22, 2017. The entire contents of the before-mentioned patent applications are incorporated by reference as part of the disclosure of this application.

TECHNICAL FIELD

The present disclosure relates to the field of communication technology, and in particular, to a processing method and device for quasi-cyclic low density parity check (LDPC) coding.

BACKGROUND

FIG. 1 is a structural block diagram of a digital communication system according to the related art. As shown in FIG. 1, the digital communication system generally includes three parts: a transmitting end, a channel, and a receiving end. The transmitting end can perform channel encoding on an information bit sequence to obtain encoded codewords, interleave the encoded codewords, and map interleaved bits into modulation symbols, and then process and transmit the modulation symbols according to information about the communication channel. In the channel, a specific channel response due to factors such as multipath and movement results in distorted data transmission, and noise and interference will further make the data transmission deteriorate. The receiving end receives modulation symbol data after passing through the channel, where the modulation symbol data has already been distorted at this point, and needs to perform specific processing to restore the original information sequence.

According to an encoding method used by the transmitting end for encoding the information sequence, the receiving end can perform corresponding processing on the received data to reliably restore the original information bit sequence. The encoding method must be visible to both the transmitting end and the receiving end. Generally, the encoding method is based on forward error correction (FEC) encoding. The FEC encoding adds some redundant information to the information sequence. The receiving end can reliably restore the original information sequence with the redundant information.

At the transmitting end, it is necessary to perform code block segmentation on a transmission block to be transmitted to obtain multiple small transmission blocks, and then perform the FEC encoding on the multiple small transmission blocks. The transmission block to be transmitted has a certain transmission block size (TBS) and encoding rate, the FEC encoding rate is generally defined as a ratio between the number of bits of an original information bit sequence entering the encoder and the number of bits of an actually transmitted bit sequence (or a rate matching output sequence). In a long term evolution (LTE) communication system, the transmission block size is relatively flexible, so that it can meet various transmission packet size requirements of the LTE communication system; and the LTE communication system uses a modulation and coding scheme (MCS) index to indicate different combinations of modulation order and code rate R; through some control information, such as downlink control information (DCI) or channel quality indication (CQI), etc., the TBS index is determined, and according to the number of resource blocks (RB) and the TBS index, the size of the actual information bit sequence is determined. The channel type may include a data channel and a control channel. The data channel generally carries data of a user equipment (UE), and the control channel carries control information, including control information such as an MCS index number, channel information, DCI, and CQI. The size of the bandwidth generally refers to a spectrum width occupied by the data transmission assigned by the system. In the LTE system, the bandwidth is divided into 20M, 10M and 5M. The data transmission direction includes uplink data and downlink data. The uplink data generally means that the UE transmits data to the base station, and the downlink data means that the base station transmits the data to the UE.

Some common FEC codes include: a convolutional code, a Turbo code, and a low density parity check (LDPC) code. In the FEC encoding process, an FEC encoded codeword with n bits (including n−k redundancy bits) is obtained by performing the FEC encoding on an information sequence with k bits. The LDPC code is a linear block code defined with a very sparse parity check matrix or a bipartite graph. The sparsity of the check matrix of the LDPC code contributes to achieve low-complexity encoding and decoding, thus making the LDPC more practical. Various practices and theories prove that the LDPC code has the best channel encoding performance which is very close to the Shannon limit under additive white Gaussian noise (AWGN).

In IEEE802.11ac, IEEE802.11ad, IEEE802.11aj, IEEE802.16e, IEEE802.11n, microwave communication, and optical fiber communication, the LDPC code has been widely used. In the parity check matrix of the LDPC code, each row is a parity check code. If an element value of a certain index position is equal to 1 in each row, it means that the bit at this position participates in the parity check code; if the element value is equal to 0, it means that the bit at this position does not participate in the parity check code. Since description of the quasi-cyclic LDPC coding is very simple and the decoder structure is simple, it has been applied in many communication standards. The quasi-cyclic LDPC coding can also be called structured LDPC coding. Its parity check matrix H is a matrix with mb×Z rows and nb×Z columns. It is composed of mb×nb sub-matrices, each sub-matrix is different powers of the basic permutation matrix with a size of Z×Z, the basic permutation matrix is a matrix obtained by performing 1-bit right-cyclic-shift (1-bit left-cyclic-shift) on an identity matrix; or it may also considered that each sub-matrix is a sub-matrix obtained by performing several-bit right-cyclic-shift (or several-bit left-cyclic-shift) on a Z×Z identity matrix. At this time, as long as the cyclic shift value and the size of the sub-matrix are known, the quasi-cyclic LDPC code can be determined, and all shift values corresponding to each sub-matrix form an mb×nb matrix. The mb×nb matrix may be called a base matrix, a basic check matrix or a base photograph (a base graph), the size of the sub-matrix may be called an expansion factor, a lifting size (lift size) or a sub-matrix size, which is described herein as the lifting size. Because the structure of the quasi-cyclic LDPC code is very compact and simple, which facilitates implementation by the decoder, the quasi-cyclic LDPC code is also called structured LDPC code. According to the definition of the quasi-cyclic LDPC code, the parity check matrix of quasi-cyclic LDPC code has the following form:

$$H=\begin{bmatrix} P^{hb_{11}} & P^{hb_{12}} & P^{hb_{13}} & \ldots & P^{hb_{1N}} \\ P^{hb_{21}} & P^{hb_{22}} & P^{hb_{23}} & \ldots & P^{hb_{2N}} \\ \ldots & \ldots & \ldots & & \ldots \\ P^{hb_{M1}} & P^{hb_{M2}} & P^{hb_{M3}} & \ldots & P^{hb_{MN}} \end{bmatrix}=P^{Hb}$$

If $hb_{ij}$==−1, $P^{hb_{ij}}$ is an all-zero matrix with the size of Z×Z, if $hb_{ij}$≠−1, $P^{hb_{ij}}$ equals to $hb_{ij}$ powers of the basic permutation matrix P; in order to mathematically describe the cyclic shift of the identity matrix, in the base matrix of quasi-cyclic LDPC code, the basic permutation matrix P with the size Z×Z is defined here. Performing a cyclic shift on the identity matrix is to obtain a corresponding number power of the basic permutation matrix P. The basic permutation matrix P is shown below.

$$P=\begin{bmatrix} 0 & 1 & 0 & \cdots & 0 \\ 0 & 0 & 1 & \cdots & 0 \\ \cdots & \cdots & \cdots & \cdots & \cdots \\ 0 & 0 & 0 & \cdots & 1 \\ 1 & 0 & 0 & \ldots & 0 \end{bmatrix}$$

Through such $hb_{ij}$ power, each block matrix can be uniquely identified. If a block matrix is the all-zero matrix, it is generally represented by −1 or a null value in the base matrix. If it is the identity matrix obtained by cyclic shifting s, it is equal to s, so all $hb_{ij}$ can form a base matrix Hb, and thus the base matrix (or the basic check matrix) Hb of the LDPC code can be represented as follows:

$$Hb-\begin{bmatrix} hb_{11} & hb_{12} & hb_{13} & \cdots & hb_{1N} \\ hb_{21} & hb_{22} & hb_{23} & \cdots & hb_{2N} \\ \cdots & \cdots & \cdots & & \cdots \\ hb_{M1} & hb_{M2} & hb_{M3} & \cdots & hb_{MN} \end{bmatrix}$$

Therefore, the quasi-cyclic LDPC code can be uniquely determined by the base matrix Hb and the lifting size Z. Therefore, the base matrix Hb of the quasi-cyclic LDPC code includes two types of elements: elements indicating an all-zero matrix and elements indicating a shift size of the cyclic shift of an identity matrix, the elements indicating the all-zero matrix are generally represented by −1 or a null value, the elements indicating the shift size of the cyclic shift of the identity matrix are represented by an integer from 0 to (Z−1). In the base matrix Hb, if there are q non-−1 elements (the elements indicating the shift size of the cyclic shift of the identity matrix) in any row, a row weight of the row is considered to be q. Similarly, a column weight may be defined as the number of all non-−1 elements (the elements indicating the shift size of the cyclic shift of the identity matrix) in any column in the base matrix Hb. The base matrix includes multiple parameters: mb, nb, and kb, where mb is the number of rows of the base matrix (which is equal to the number of check columns of the base matrix), nb is the total number of columns of the base matrix, and kb=nb−mb is the number of systematic columns of the base matrix. For example, the base matrix Hb (with 2 rows and 4 columns) is as follows and the lifting size z is equal to 4:

$$Hb=\begin{bmatrix} 0 & 1 & 0 & -1 \\ 2 & 1 & 2 & 1 \end{bmatrix}$$

Then the parity check matrix is:

$$H=\left[\begin{array}{cccc|cccc|cccc|cccc} 1&0&0&0&0&1&0&0&1&0&0&0&0&0&0&0 \\ 0&1&0&0&0&0&1&0&0&1&0&0&0&0&0&0 \\ 0&0&1&0&0&0&0&1&0&0&1&0&0&0&0&0 \\ 0&0&0&1&1&0&0&0&0&0&0&1&0&0&0&0 \\ \hline 0&0&1&0&0&1&0&0&0&0&1&0&0&1&0&0 \\ 0&0&0&1&0&0&1&0&0&0&0&1&0&0&1&0 \\ 1&0&0&0&0&0&0&1&1&0&0&0&0&0&0&1 \\ 0&1&0&0&1&0&0&0&0&1&0&0&1&0&0&0 \end{array}\right]$$

Since a quasi-cyclic LDPC codeword is a systematic code, i.e., systematic bits in the codeword are equal to information bits before encoding, so in the quasi-cyclic LDPC coding, only check bits need to be calculated, and the quasi-cyclic LDPC coding can be performed according to the parity check matrix. For example, the parity check matrix H may be described as 2 parts: H=[Hs; Hp], where Hs corresponds to a systematic bit matrix and Hp corresponds to a check bit matrix. According to an LDPC coding principle, for the quasi-cyclic LDPC codeword C (including systematic bits Cs, check bits Cp), satisfying a condition H×C=0, i.e., [Hs; Hp]×[Cs; Cp]=0; thus Hs×Cs=Hp×Cp can be derived, so that $Cp=(Hp)^{-1}\times Hs\times Cs$, where "x" in the formula is an binary matrix multiplication calculation, and $(x)^{-1}$ is an binary matrix inverse calculation; and then the check bit Cp of the quasi-cyclic LDPC codeword can be calculated, thus obtaining the quasi-cyclic LDPC codeword C=[Cs; Cp].

In the quasi-cyclic LDPC code described above, each element position in the base matrix has only one shift value or −1 value, this case may be regarded that the number of edges of the quasi-cyclic LDPC coding is equal to 1, i.e., a corresponding non-−1 element position has only 1 shift value; while in the quasi-cyclic LDPC coding, there is also a base matrix with a number of corresponding edges greater than 1, i.e., the non-−1 element position in the base matrix includes multiple shift values, i.e., for the parity check matrix, the sub-matrix is formed by superimposing cyclic shifts of multiple identity matrices, this case may be regarded that the number of edges of the quasi-cyclic LDPC coding is greater than 1, for example, the base matrix Hb (2 rows and 4 columns) is as follows and the lifting size z is equal to 4. Since the non-−1 element position in the base matrix includes at most two shift values, the number of edges of the exemplified base matrix is equal to 2, and the number of edges of the base matrix is equal to the maximum number of the shift values in the non-−1 element position in the base matrix.

$$Hb=\begin{bmatrix} (0,2) & 1 & 0 & -1 \\ 2 & (1,3) & 2 & 1 \end{bmatrix}$$

Then the parity check matrix is:

$$H=\left[\begin{array}{cccc|cccc|cccc|cccc}1&0&1&0&0&1&0&0&1&0&0&0&0&0&0&0\\0&1&0&1&0&0&1&0&0&1&0&0&0&0&0&0\\1&0&1&0&0&0&0&1&0&0&1&0&0&0&0&0\\0&1&0&1&1&0&0&0&0&0&0&1&0&0&0&0\\\hline 0&0&1&0&0&1&0&1&0&0&1&0&0&1&0&0\\0&0&0&1&1&0&1&0&0&0&0&1&0&0&1&0\\1&0&0&0&0&1&0&1&1&0&0&0&0&0&0&1\\0&1&0&0&1&0&1&0&0&1&0&0&1&0&0&0\end{array}\right]$$

During the LDPC coding process, the original information data to be transmitted (i.e., the information bit sequence) is processed by encoding, where the processing may include that: first, padding the information bit sequence with dummy bits (the dummy bits is known to the transceiver and do not need to be transmitted), so that a length of the padded information bit sequence reaches systematic bit length of the LDPC coding, and if an information bit sequence length is equal to the systematic bit length, there is no need to pad; next, performing the quasi-cyclic LDPC coding on the padded information bit sequence to obtain a LDPC coding output sequence; then performing a bit selection on the LDPC coding output sequence to obtain a rate matching output sequence, a ratio of the information bit sequence length and the rate matching output sequence length is a code rate of the rate matching output sequence; finally, sending the rate matching output sequence. For a receiving end, a decoding process needed to be performed is as follows: first, receiving data sent by the sending end, which is generally a log likelihood ratio (LLR) sequence (or, it may be described as a soft sequence or a soft bit information sequence); secondly, performing a de-bit selection (or de-rate matching) on the received log-likelihood ratio sequence, and assigning a relatively larger value (such as infinity) to data in a dummy bit position padded by the sending end, thereby obtaining a log-likelihood ratio sequence to be decoded which has a same length as the LDPC coded output sequence of the sending end; then perform LDPC decoding on the log-likelihood ratio sequence to be decoded to obtain an LDPC decoding output sequence; and finally, removing the padded dummy bits from the LDPC decoding output sequence to obtain the original data to be received (or the information bit sequence sent by the sending end).

In the LDPC encoding and decoding, characteristics such as excellent performance, high throughput, high flexibility and low complexity to be ensured, is closely related to the design of the LDPC coding parity check matrix. On the contrary, if the design of the LDPC parity check matrix is not good, its performance will be degraded, and at the same time complexity and flexibility may also be affected.

Although the quasi-cyclic LDPC code has been applied in multiple communication standards, it can be found that the code rate and the code length of various standards are relatively limited after analysis, i.e., the flexibility is relatively poor, and they are difficult to be compatible with various application scenarios, and complexity of decoding algorithms under different conditions of the decoding design is not sure to be better. For example, in IEEE802.11ad standards, there are only 1 code length (672) and 4 code rates (1/2, 5/8, 3/4, 13/16); in the IEEE802.11n standard, there are only 3 code length (648, 1296, 1944) and 4 code rates (1/2, 2/3, 3/4, 5/6). It can be found that since the quasi-cyclic LDPC is defined by a part of the base matrix, shortcomings of these quasi-cyclic LDPC codes are flexibility insufficient. The flexibility refers to flexible changes of the code rate and the code length. In a new radio access technology (new RAT) system, a channel coding scheme is required to support a flexible code rate and a flexible code length, i.e., to support that information length at least reaches a same or lower granularity as the LTE system, and the code rate can be flexibly changed. For example, a new RAT system includes application scenarios: an enhanced mobile broadband (eMBB) scenario, an ultra-reliable and low latency communications (URLLC) scenario, or a massive machine type communications (mMTC). In the eMBB scenario, the maximum downlink throughput can reach 20 Gbps, and the maximum uplink data throughput can reach 10 Gbps; in the URLLC, a block error rate (BLER) with a minimum reliability of 10e−5 may be supported and a minimum delay for uplink and downlink can reach 0.5 milliseconds; and the mMTC enables the device battery to last for many years.

However, there are problems on the adaptability of LDPC codes for various application scenarios, such as high-throughput scenarios and low-throughput scenarios, requirements for large coverage, small coverage and different operation modes. For the adaptability of LDPC codes in the related art, no effective solution has yet been proposed.

SUMMARY

The technical problem to be solved by embodiments of the present disclosure is to provide a processing method and device for quasi-cyclic LDPC coding, which is able to improve adaptability and flexibility of the quasi-cyclic LDPC coding.

An embodiment of the present disclosure provides a processing method for quasi-cyclic LDPC coding. The method includes:

- determining, according to a data feature of an information bit sequence to be encoded, a processing strategy for the quasi-cyclic LDPC coding; and
- performing, according to the processing strategy and based on a base matrix and a lifting size, the quasi-cyclic LDPC coding and rate matching output on the information bit sequence.

An embodiment of the present disclosure provides a processing device for quasi-cyclic LDPC coding. The device includes:

- a processing module, which is configured to determine, according to a data feature of an information bit sequence to be encoded, a processing strategy for the quasi-cyclic LDPC coding and perform, according to the processing strategy and based on a base matrix and a lifting size, the quasi-cyclic LDPC coding and rate matching output on the information bit sequence; and
- a storage module, which is configured to store the base matrix and the lifting size.

Compared with the related art, the embodiments of the present disclosure provide a processing method and device for quasi-cyclic LDPC coding. According to a data feature of an information bit sequence to be encoded, a processing strategy for the quasi-cyclic LDPC coding is determined. According to the processing strategy and based on a base matrix and a lifting size, the quasi-cyclic LDPC coding and rate matching output are performed on the information bit sequence. Technical solutions of the embodiments of the present disclosure are able to improve adaptability and flexibility of the quasi-cyclic LDPC coding.

DETAILED DESCRIPTION

The present disclosure will be described hereinafter in detail with reference to the accompanying drawings. It is to be noted that if not in collision, the embodiments and features therein in the present application can be combined with each other.

The processing method for quasi-cyclic LDPC coding provided in the embodiment of the present disclosure may be used in a new radio access technology (new RAT for short) communication system for an LTE mobile communication system, or a fifth-generation mobile in the future communication system or other wireless and wired communication systems.

A data transmission direction is that a base station sends data (downlink transmission service data) to a mobile user (user equipment (UE)), or the data transmission direction is that the mobile user (user equipment (UE)) sends data (uplink transmission service data) to the base station.

The mobile user includes: a mobile device, an access terminal, a user terminal, a user station, a user unit, a mobile station, a remote station, a remote terminal, a user agent, a user device, a user equipment, or devices named after other similar terms. The base station includes: an access point (AP), a node B, a radio network controller (RNC), an evolved node B (eNB), a base station controller (BSC), a base transceiver controller (BTS), a base station (BS), a transceiver function body, a radio router, a radio transceiver, a basic service unit (BSS), an expansion service set (ESS), a radio base station (RBS), or other devices named after other similar items.

Embodiment One

Figure 2:
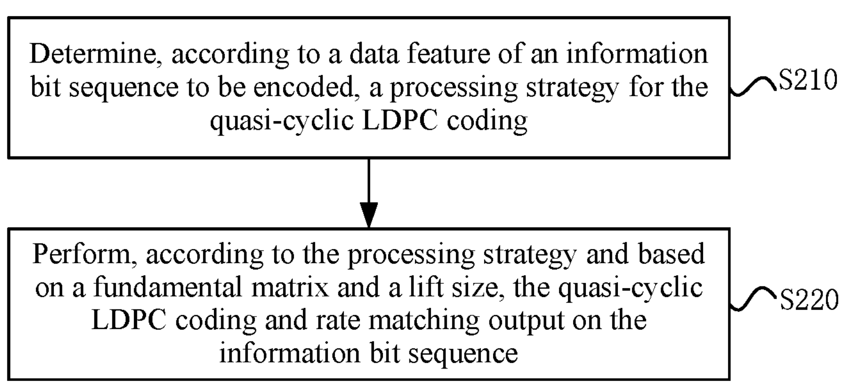
FIG. 2 is a flowchart of a method for processing quasi-cyclic LDPC coding according to embodiment one of the present disclosure.

As shown in FIG. 2, embodiment one of the present disclosure provides an example of a processing method for quasi-cyclic LDPC coding. The method includes steps described below.

In step S210, according to a data feature of an information bit sequence to be encoded, a processing strategy for the quasi-cyclic LDPC coding is determined.

In step S220, according to the processing strategy and based on a base matrix and a lifting size, the quasi-cyclic LDPC coding and rate matching output are performed on the information bit sequence.

In this embodiment, the information bit sequence refers to an original information bit sequence that enters the quasi-cyclic LDPC coding, and according to different usage cases of the information bit sequence (such as an application scenario, an operation mode, a transmission direction, a user equipment type, etc.), the information bit sequence has different data features.

In this embodiment, the data feature of the information bit sequence includes at least one of:

an operation mode corresponding to the information bit sequence, an application scenario corresponding to the information bit sequence, a link direction corresponding to the information bit sequence, a UE category, length information of the information bit sequence, a modulation and coding scheme (MCS) index of the information bit sequence, an aggregation level of a control channel unit (CCE) of the information bit sequence, a search space corresponding to the information bit sequence, a scrambling mode of the information bit sequence, a cyclic redundancy check (CRC) format of the information bit sequence, a channel type of the information bit sequence, a control information format corresponding to the information bit sequence, a channel state information (CSI) process corresponding to the information bit sequence, a subframe index of the information bit sequence, a carrier frequency corresponding to the information bit sequence, a release version of the information bit sequence, a coverage range of the information bit sequence, a length of a rate matching output sequence obtained by performing the quasi-cyclic LDPC coding and a bit selection on the information bit sequence, a code rate of a rate matching output sequence, a combination of a code rate of a rate matching output sequence and a length of the rate matching output sequence, a combination of a code rate of a rate matching output sequence and a length of the information bit sequence, or a hybrid automatic retransmission request (HARQ) data transmission version number of the information bit sequence.

A rate matching output sequence is a sequence obtained by performing a bit selection on the LDPC coding sequence obtained by performing quasi-cyclic LDPC coding.

In this embodiment, the processing strategy includes determining at least one of the following parameters:

determining the processing strategy for the quasi-cyclic LDPC coding includes determining at least one of:

a structure of a core matrix check block of a base matrix;

orthogonality of the base matrix;

characteristics of the base matrix; a maximum number of systematic columns of the base matrix;

a maximum number of systematic columns of the quasi-cyclic LDPC coding; a number of base matrices; an element modifying method of the base matrix; a number of edges of the base matrix;

a minimum code rate of the base matrix at a maximum length of the information bit sequence; a minimum code rate of the base matrix at a shortened coding; a pattern of selecting a lifting size;

a pattern of selecting a granularity of the lifting size; a maximum value of the lifting size; a number of systematic columns not to be transmitted of a rate matching output sequence obtained by performing the quasi-cyclic LDPC coding and a bit selection on the information bit sequence; a check column puncturing method of a rate matching output sequence; an interleaving method of a rate matching output sequence; a starting bit position of a bit selection of a rate matching output sequence; a maximum information length supported by the quasi-cyclic LDPC coding; a pattern of selecting an information bit length supported by the quasi-cyclic LDPC coding; a pattern of selecting a granularity of an information bit length supported by the quasi-cyclic LDPC coding;

a maximum number of columns of a shortened coding of the quasi-cyclic LDPC coding; a HARQ combining mode of the quasi-cyclic LDPC coding; a bit selection starting position of a rate matching output sequence; a maximum number of HARQ transmissions of the quasi-cyclic LDPC coding; or a number of HARQ transmission versions of the quasi-cyclic LDPC coding.

In an embodiment, the operation mode includes an in-band operation mode, an out-band operation mode, or a standalone operation mode;

In an embodiment, an application scenario of the information bit sequence includes: an enhanced mobile broadband (eMBB) scenario, an ultra-reliable low-latency communication (URLLC) scenario, or a massive machine type communication (mMTC) scenario.

In an embodiment, a link direction of the information bit sequence includes: uplink data or downlink data.

In an embodiment, the length information of the information bit sequence includes: length information greater than a positive integer value K0 or length information less than or equal to a positive integer value K0, where K0 is an integer greater than 128.

In an embodiment, the base matrix Hb is $$Hb = \begin{bmatrix} A & B & C \\ & D & E \end{bmatrix};$$

where a matrix [A B] formed by a sub-matrix A and a sub-matrix B is a core matrix of the base matrix, and the sub-matrix B is the core matrix check block;

the structure of the core matrix check block is selected from at least two structure types of the following: a lower-triangular structure, a double diagonal structure or a quasi-double-diagonal structure;

a matrix of the lower-triangular structure includes the following three features a)-c): a) elements with a row index number i and a column index number j in the matrix are equal to −1, and j>i; b) all elements on diagonal lines in the matrix are non-−1 elements; and c) all elements under the diagonal lines in the matrix at least have one non-−1 element;

a matrix of the double diagonal structure includes the following two features a)-b): a) a first column in the matrix comprises three non-−1 elements, where a first element and an end element of the first column are non-−1 elements; and b) elements with a column index number i and a row index number (i−1) as well as elements with a column index number i and a row index number i in the matrix are non-−1 elements, i=1, 2, . . . , (I0−1), where I0 is a number of rows of the matrix;

a matrix of the quasi-double-diagonal structure includes any one of the following features: a) elements indicated by a row index number (mb0−1) and a column index number 0 in the matrix are non-−1 elements, and a sub-matrix formed by (mb0−1) rows and (mb0−1) columns in an upper right corner in the matrix is the double-diagonal structure; b) elements indicated by a row index number (mb0−1) and a column index number (mb0−1) in the matrix are non-−1 elements, and a sub-matrix formed by (mb0−1) rows and (mb0−1) columns in an upper left corner in the matrix is the double-diagonal structure; c) elements indicated by a row index number 0 and a column index number 0 in the matrix are non-−1 elements, and a sub-matrix formed by (mb0−1) rows and (mb0−1) columns in a lower right corner in the matrix is the double-diagonal structure; where mb0 is a number of rows of the matrix.

In an embodiment, the base matrix Hb is $$Hb = \begin{bmatrix} A & B & C \\ & D & E \end{bmatrix};$$

where a number of columns of a sub-matrix D is less than or equal to a number of columns of a core matrix [A B] formed of a sub-matrix A and a sub-matrix B, the orthogonality of the base matrix is orthogonality of the sub-matrix D, the orthogonality of the base matrix is selected from at least two types of the following: an orthogonal property, a quasi-orthogonal property and a non-orthogonal property; and where the orthogonal property includes that: there is no intersection set among row index number sets RowSETi (i=0, 1, . . . , (I−1)), a union set of all row index number sets RowSETi (i=0, 1, . . . , (I−1)) forms all row index numbers of the sub-matrix D, and in the sub-matrix D, a sub-matrix Di formed by all rows indicated by a row index number set RowSETi has at most one non-−1 element in all elements indicated by any one column index number; where I is a positive integer less than a number of rows of the sub-matrix D, RowSETi (i=0, 1, . . . , (I−1)) includes at least two elements;

the quasi-orthogonal-property includes: two column index number set ColSET0 and ColSET1, where ColSET0 and ColSET1 have no intersection set and a union set of ColSET0 and ColSET1 forms all column index numbers of the sub-matrix D, a sub-matrix formed by all columns indicated by the column index number set ColSET0 in the sub-matrix D is D0, a sub-matrix formed by all columns indicated by the column index number set ColSET1 in the sub-matrix D is D1, and D1 has the orthogonal property while D0 does not have the orthogonal property;

the non-orthogonal-property includes that: the sub-matrix D does not have the orthogonal property and the non-orthogonal property.

In an embodiment, the maximum number of systematic columns of the base matrix is selected from at least two integer values of 2 to 32.

In an embodiment, the maximum number of systematic columns of the base matrix is selected from at least two integer values of: 4, 6, 8, 10, 16, 24, 30 or 32.

In an embodiment, the number of base matrices is selected from at least two integer values of: 1, 2, 3 or 4.

In an embodiment, the element modifying method of the base matrix is selected from at least two of the following methods: scale floor, a mixed modulo method, modifying and scale floor, number selecting by using a binary numeral sequence, a modulo method with a positive integer power of 2 as a modulus, modifying and a modulo method with a positive integer power of 2 as a modulus, a modulo method, a modulo method with a determined integer as a modulus, element modifying and a modulo method, a modulo method with a prime number as a modulus, element modifying and scale floor, or a modulo method with a prime number as a modulus related to row and column index numbers. The details are as follows.

Method One (Scale Floor)

One or more base matrices with a maximum lifting size Zmax, and all non-−1 elements of the base matrix corresponding to the lifting size Z less than Zmax are obtained by performing scale floor according to the base matrix of the maximum lifting size Zmax, for example, an element $P_{i,j}$ of the base matrix is calculated according to the following formula (1-1):

$$P_{i,j}=\begin{cases}-1 & V_{i,j}=-1\\ \lfloor V_{i,j}\times Z/Z_{max}\rfloor & V_{i,j}\neq -1\end{cases}. \quad (1\text{-}1)$$

Method Two (the Mixed Modulo Method)

Elements $P_{i,j}$ of the base matrix are calculated according to the following formula (1-2):

$$P_{i,j}=\begin{cases}V_{i,j} & V_{i,j}<Z\\ \lfloor V_{i,j}/2^t\rfloor & V_{i,j}\geq Z\end{cases}. \quad (1\text{-}2)$$

Method Three (Modifying and Scale Floor)

Elements $P_{i,j}$ of the base matrix are calculated according to the following formula:

$$P_{i,j}=\begin{cases}V_{i,j} & V_{i,j}<1\\ \lfloor((V_{i,j}+w)\bmod Z_{max})\times Z/Z_{max}\rfloor & V_{i,j}\geq 1\end{cases}.$$

Method Four (Number Selecting by Using a Binary Numeral Sequence)

The elements $P_{i,j}$ of the base matrix are obtained according to the following processing manner in which:

each non-−1 element position of the base matrix have a L-bit bit sequence, all lifting sizes form H groups of lifting size sets; in response to determining that Z belongs to a k-th group of the lifting size sets, for the base matrix of the k-th group of the lifting size sets, an element value corresponding to the non-−1 position is: selecting k bits, a 2k-th bit and a (2k−1)-th bit from the left of the L-bit bit sequence corresponding to the non-−1 element position to form a (k+2)-bit bit sequence, a value corresponding to the (k+2)-bit bit sequence is the element value of the corresponding non-−1 element position in the base matrix corresponding to the lifting size Z.

Method Five (the Modulo Method with a Positive Integer Power of 2 as a Modulus)

For example, elements $P_{i,j}$ of the base matrix are calculated according to the following formula:

$$P_{i,j}=\begin{cases}-1 & V_{i,j}=-1\\ V_{i,j}\bmod 2^s & V_{i,j}\neq -1\end{cases}.$$

Method Six (Modifying and the Modulo Method with a Positive Integer Power of 2 as a Modulus)

Elements $P_{i,j}$ of the base matrix are calculated according to the following formula:

$$P_{i,j}=\begin{cases}-1 & V_{i,j}=-1\\ (V_{i,j}+w)\bmod 2^s & V_{i,j}\neq -1\end{cases}.$$

Method Seven (the Modulo Method)

Elements $P_{i,j}$ of the base matrix are calculated according to the following formula:

$$P_{i,j}=\begin{cases}-1 & V_{i,j}=-1\\ V_{i,j}\bmod Z & V_{i,j}\neq -1\end{cases}.$$

Method Eight (the Modulo Method with a Determined Integer as a Modulus)

Elements $P_{i,j}$ of the base matrix are calculated according to the following formula:

$$P_{i,j}=\begin{cases}-1 & V_{i,j}=-1\\ V_{i,j}\bmod w & V_{i,j}\neq -1\end{cases}.$$

Method Nine (Element Modifying and a Modulo Method)

Elements $P_{i,j}$ of the base matrix according to the following formula:

$$P_{i,j}=\begin{cases}(V_{i,j}+\lfloor 256\times w/V_{i,j}\rfloor)\bmod Z & V_{i,j}>0\\ V_{i,j} & V_{i,j}\leq 0\end{cases}.$$

Method Ten (the Modulo Method with a Prime Number as a Modulus):

Elements $P_{i,j}$ of the base matrix are calculated according to the following formula:

$$P_{i,j}=V_{i,j}\bmod z_{prime}.$$

Method Eleven (Element Modifying and Scale Floor)

Elements $P_{i,j}$ of the base matrix are calculated according to the following formula:

$$P_{i,j}=\begin{cases}V_{i,j} & V_{i,j}<1\\ \lfloor(V_{i,j}+w\bmod Z\max)\times Z/Z\max\rfloor & V_{i,j}\geq 1\end{cases}.$$

Method Twelve (a Modulo Method with a Prime Number as a Modulus Related to Row and Column Index Numbers)

The element values of the modified base matrix are calculated according to a row index number i, a column index number j, and a lifting size Z of the base matrix, for example, the elements $P_{i,j}$ of the base matrix are calculated according to the following formula (1-12).

$$P_{i,j} = \begin{cases} (i \times j) \bmod Z_{prime} & 1 \le i \le 38 \\ ((Z - i + 38) \times j) \bmod Z_{prime} & 39 \le i \le 49 \end{cases} \quad (1\text{-}12)$$

where $z_{prime}$ is a maximum prime number less than or equal to the lifting size Z, where $V_{i,j}$ is a value of an element in an i-th row and a j-th column of the base matrix corresponding to $Z_{max}$, $P_{i,j}$ is a value of an element in an i-th row and a j-th column of the base matrix corresponding to Z, Z is a lifting size of the quasi-cyclic LDPC coding, $Z_{max}$ is an integer greater than 0, and Z is a positive integer less than or equal to $Z_{max}$;

$t$ is $t=\lceil Z_{max}/Z \rceil$;

s is a maximum integer so as to satisfy $2^s \le Z$;

w is a determined integer value corresponding to the rise value Z; $z_{prime}$ is a maximum prime less than or equal to Z.

In an embodiment, the minimum code rate of the base matrix at the maximum length of the information bit sequence is selected from at least two real number values greater than 0 and less than 1.

In an embodiment, the minimum code rate of the base matrix at the maximum length of the information bit sequence is selected from at least two code rate types of: 1/12, 1/8, 1/6, 1/5, 1/4, 1/3, 1/2 or 2/3.

In an embodiment, the minimum code rate of the base matrix at the shortened coding is selected from at least two real number values greater than 0 and less than 1.

In an embodiment, where the minimum code rate of the base matrix at the shortened coding is selected from at least two code rate types of: 1/12, 1/8, 1/6, 1/5, 1/4 or 1/3.

In an embodiment, the method for selecting the lifting size is selected from at least two types of the following methods: a method of multiplying a positive integer power of 2 by a positive integer, a method of selecting continuous values, a method of intervally selecting continuously increasing values, a segmentation method, a method of calculating through an information bit sequence length and a number of systematic columns of the base matrix and making fine adjustment, and a positive integer power of 2. Specifically:

Method One:

the lifting size is a product of d powers of 2 multiplied by a positive integer c; where c is an element in a positive integer set C, and d is a positive integer and an element in an non-negative integer set D;

Method Two:

lifting sizes are continuous integers taken from Zmin to Zmax;

where Zmin and Zmax are integers greater than 0, and Zmax is greater than Zmin;

Method Three:

a difference between magnitude-adjacent lifting sizes is equal to an integer power of 2;

where all lifting sizes constitute a set Zset, and the set Zset includes multiple subsets, and a difference between any two magnitude-adjacent lifting sizes in the subsets is equal to a non-negative integer power of 2;

Method Four:

determining the lifting size by a length of the information bit sequence and a number of systematic columns of the base matrix;

Method Five:

determining the lifting size by a length of the information bit sequence, a number of systematic columns of the base matrix and an integer set W; or Method Six:

the lifting size is equal to a positive integer power of 2.

In an embodiment, in the method one for selecting the lifting size value, the set C and the set D includes one of set pairs of the following: C={4,5,6,7} and D={1, 2, 3, 4, 5, 6, 7}; C={4, 5, 6, 7} and D={0, 1, 2, 3, 4, 5, 6, 7}; C={3, 4, 5, 6, 7, 8} and D={0, 1, 2, 3, 4, 5, 6}; C={4, 5, 6, 7} and D={0, 1, 2, 3, 4, 5, 6, 7}; C={16, 20, 24, 28} and D={0, 1, 2, 3, 4, 5}; C={16, 20, 24, 28} and D={0, 1, 2, 3, 4}; C={1, 2, 3, 4, 5, 6, 7} and D={1, 2, 3, 4, 5, 6, 7}; C={1, 2, 3, 4, 5, 6, 7} and D={0, 1, 2, 3, 4, 5, 6, 7};

In an embodiment, in the method three for selecting the lifting size, a set Zset includes one of: {{1:1:8}, {9:1:16}, {18:2:32}, {36:4:64}, {72:8:128}, {144:16:256}}, {{1:1:8}, {9:1:16}, {18:2:32}, {36:4:64}, {72:8:128}, {144:16:256}, {288:32:320}}, {{1:1:8}, {9:1:16}, {18:2:32}, {36:4:64}, {72:8:128}, {144:16:256}, {288:32:512}}, {{1:1:8}, {10:2:16}, {20:4:32}, {40:8:64}, {80:16:128}, {160:32:256}}, {{1:1:8}, {10:2:16}, {20:4:32}, {40:8:64}, {80:16:128}, {160:32:256}, {320:64:512}}, {{2:2:16}, {20:4:32}, {40:8:64}, {80:16:128}, {160:32:256}}, {{2:2:16}, {20:4:32}, {40:8:64}, {80:16:128}, {160:32:256}, {320:64:512}};

where in the set {a:b:c}, a is a first element in the set, c is a last element in the set, and b is a value of interval between two adjacent elements in the set.

In an embodiment, in the method four for selecting the lifting size, the lifting size Z is $Z=\lceil K/kb \rceil$, where K is the length of the information bit sequence and kb is the number of systematic columns of the base matrix.

In an embodiment, in the method five for selecting the lifting size, the lifting size Z is $Z=Z_{orig}+W(Z_{orig})$;

where $Z_{orig}=\lceil K/kb \rceil$, K is the length of the information bit sequence, kb is the number of systematic columns of the base matrix, and $W(Z_{orig})$ is a value of one element corresponding to the $Z_{orig}$ in the integer set W.

In an embodiment, in the method six for selecting the lifting size, the lifting size is one of the following sets: {2, 4, 8, 16, 32, 64, 128, 256, 512}, {2, 4, 8, 16, 32, 64, 128, 256}, {2, 4, 8, 16, 32, 64, 128}, {2, 4, 8, 16, 32, 64}, or {2, 4, 8, 16, 32}.

In an embodiment, the granularity of the lifting size is a difference between any two magnitude-adjacent lifting size among all lifting sizes, the method of selecting the granularity of the lifting size is to select from at least two types of: a method of a non-negative integer power of 2; a method of a fixed positive integer; or a method of multiplying a first positive integer set by a second positive integer.

In an embodiment, in response to determining that the method of selecting the granularity of the lifting size adopts the method of the non-negative integer power of 2, a set of granularities of the lifting size includes one of the following: {1, 2, 4, 8, 16}, {1, 2, 4, 8, 16, 32}, {1, 2, 4, 8, 16, 32, 64}, {1, 2, 4, 8, 16, 32, 64, 128}; or in response to determining that the method of selecting the granularity of the lifting size adopts the method of the fixed positive integer, the fixed positive integer is a positive integer less than or equal to 128.

In an embodiment, the maximum value of the lifting size is selected from at least two integer values of 4 to 1024.

In an embodiment, the maximum value of the lifting size is selected from at least two integer values of the following: 16, 32, 64, 128, 256, 320, 384, 512, 768, or 1024.

In an embodiment, the maximum information length supported by the quasi-cyclic LDPC coding is selected from at least two integer values of 128 to 8192.

In an embodiment, the maximum information length supported by the quasi-cyclic LDPC coding is selected from at least two integer values of the following: 256, 512, 768, 1024, 2048, 4096, 6144, 7680, or 8192.

In an embodiment, the granularity of the information bit length supported by the quasi-cyclic LDPC coding is a difference between any two magnitude-adjacent lengths of all supported information bit lengths, the method of selecting the granularity of the information bit length is to select from at least two integer values of 2 to 256.

In an embodiment, the method of selecting the granularity of the information bit length supported by the quasi-cyclic LDPC coding is to select from at least two integer values of the following: 2, 4, 8, 16, 32, 64, 128, or 256.

a maximum number of columns of a shortened coding of the quasi-cyclic LDPC coding is $\lceil \Delta K/Z \rceil$, where AK is a maximum number of bits padded in the quasi-cyclic LDPC coding, Z is a lifting size, and the maximum number of columns of the shortened coding is selected from at least two integer values of 1 to 24.

In an embodiment, the maximum number of columns of the shortened coding of the quasi-cyclic LDPC coding is selected from at least two integer values: 0, 1, 2, 3, 4, 5, 6, 8, 12, 16, or 24.

In an embodiment, the number of systematic columns not to be transmitted of the rate matching output sequence is selected from at least two integer values of the following: 0, 1, 2, or 3.

In an embodiment, the HARQ combining mode of the quasi-cyclic LDPC coding is selected from at least two types: a soft combining mode, an incremental redundant combining mode, a mixed mode of a soft combination and an incremental redundant combination.

In an embodiment, a maximum number of HARQ transmissions of the quasi-cyclic LDPC coding is selected from at least two integer values: 1, 2, 3, 4, 5, or 6.

In an embodiment, the number of HARQ transmission versions is selected from at least two integer values of 1 to 64.

In an embodiment, the number of HARQ transmission versions is selected from at least two integer values of 2, 4, 6, 8, 12, 16, 24, or 32.

In an embodiment, the base matrix selects one from Y base matrices, and Y is an integer greater than 1;

where Y base matrices at least includes one of the following characteristics:

at least two base matrices with a same base graph existing in the Y base matrices;

at least two base matrices with a quasi-identical base graph existing in the Y base matrices;

at least two base matrices with a quasi-identical matrix element existing in the Y base matrices;

at least two base matrices with base graph nesting existing in the Y base matrices;

at least two base matrices with a same base graph subset existing in the Y base matrices;

at least two base matrices with a same base matrix subset existing in the Y base matrices;

where the base graph is a matrix obtained by assigning "1" to positions of non-−1 elements in the base matrix and "0" to positions of −1 elements in the base matrix;

the base graph quasi-identical means that two base graphs have different elements, with number a, and a is an integer greater than 0 and less than or equal to 10;

the matrix element quasi-identical means that: two base matrices have different elements with number b, where b is an integer greater than 0 and less than or equal to 10;

in the two base matrices with the base graph nesting, a base graph of a small base matrix is a sub-matrix of a base graph of a large base matrix;

the same base graph subset means that: a sub-matrix in the base graph of a base matrix 1 is equal to a sub-matrix in the base graph of a base matrix 2;

the same base matrix subset means that: a sub-matrix existing in the base matrix 1 is equal to a sub-matrix in the base matrix 2.

The base matrix and lifting size are described below.

In the base matrix of the quasi-cyclic LDPC coding, elements in the base matrix include 2 types: 1) elements indicating an all-zero matrix, generally represented by −1 or a null value, and −1 is adopted here; 2) elements indicating a shift size of the cyclic shift of an identity matrix, which have an integer value from 0 to (Z−1), where Z is the lifting size of the quasi-cyclic LDPC coding.

The base matrix of the quasi-cyclic LDPC coding is in the following form:

$$Hb = \begin{bmatrix} A & B & C \\ & D & E \end{bmatrix};$$

where a matrix [A B] composed of a sub-matrix A and a sub-matrix B is a core matrix (or a kernel matrix) of the base matrix of the quasi-cyclic LDPC coding, the sub-matrix A is a core matrix systematic block, and the sub-matrix B is a core matrix check block; a sub-matrix C, a sub-matrix D and a sub-matrix E are 3 sub-matrices for extending the core matrix in order to obtain a lower code rate. The submatrix A, the submatrix B, and the submatrix C have the same number of rows, and the submatrix D and the submatrix E have the same number of rows. A total number of columns of the sub-matrix A, the sub-matrix B and the sub-matrix C is equal to a total number of columns of the sub-matrix D and the sub-matrix E.

Figure 3:
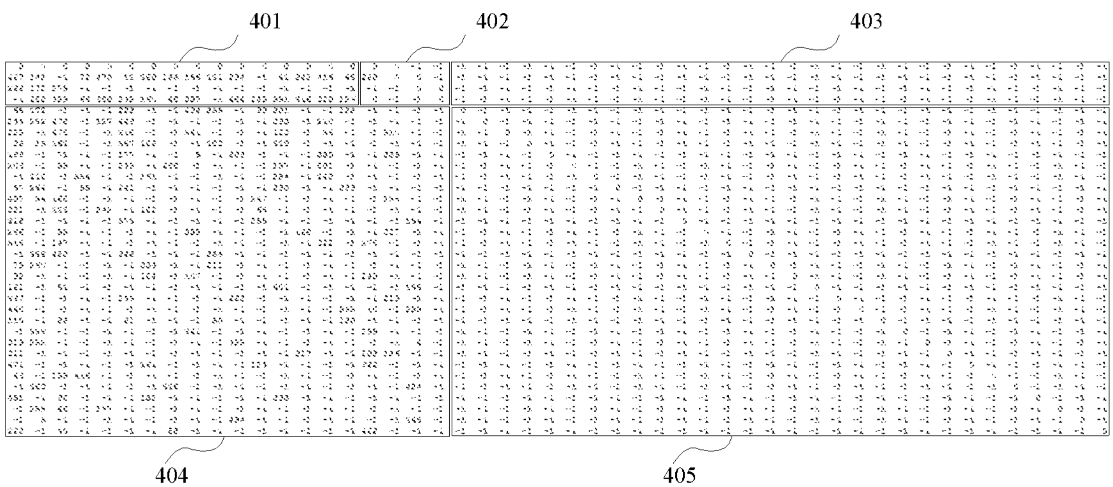
FIG. 3 is a schematic diagram of an example one of a base matrix according to embodiment one of the present disclosure.

In an example of the base matrix shown in FIG. 3, the sub-matrix A is 401, the sub-matrix B is 402, the sub-matrix C is 403, the sub-matrix D is 404, and the sub-matrix E is 405. The structure of the core matrix check block (B) of the base matrix may be selected from at least two structure types of the following: a lower-triangular structure, a double diagonal structure or a quasi-double-diagonal structure.

The lower-triangular structure means that the matrix includes three characteristics: 1) elements with a row index number i and a column index number j in the matrix are equal to −1 (elements indicating the all-zero matrix), and the column index number j is greater than the row index number i; 2) all elements on diagonal lines of the matrix are non-−1 elements; 3) at least one non-−1 element exists in all elements below the diagonal lines in the matrix. The matrix example shown in FIG. 4 (*a*) has the lower triangular structure.

The double-diagonal structure means that the matrix includes two features: 1) a first column in the matrix includes three non--1 elements, where a first element and an end element of the first column are non--1 elements; and 2) elements with a column index number i and a row index number (i−1) and elements indicated by a row index number i in the matrix are non--1 elements, i=1, 2, . . . , (I0−1), where I0 is a number of rows of the matrix. The matrix example shown in FIG. 4 (*b*) has the double-diagonal structure.

Figure 4:
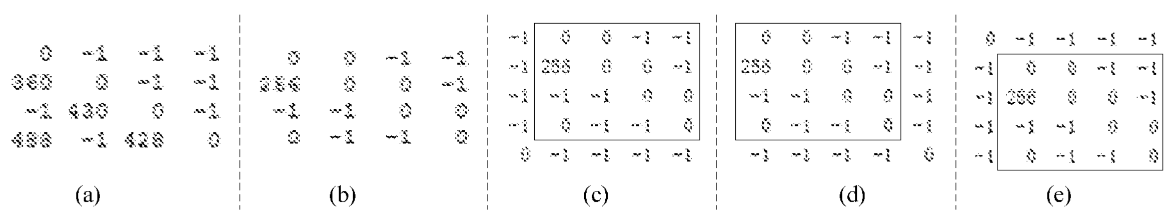
FIG. 4 is a schematic diagram of an example one of a core matrix check block B in a base matrix according to embodiment one of the present disclosure.

The quasi-double-diagonal structure includes one of: a) elements indicated by a row index number (mb0−1) and a column index number 0 in the matrix are non--1 elements, and a sub-matrix formed by (mb0−1) rows and (mb0−1) columns in an upper right corner in the matrix is the double-diagonal structure; in an example of the matrix in a structure of mb0×mb0=5×5 shown in FIG. 4 (*c*), the 4×4 sub-matrix in the upper right corner is in the double-diagonal structure, and elements in 4th row and 0th column are non--1 elements; 2) elements indicated by a row index number (mb0−1) and a column index number (mb0−1) in the matrix are non--1 elements, and a sub-matrix formed by (mb0−1) rows and (mb0−1) columns in an upper left corner in the matrix is the double-diagonal structure; in an example of the matrix in the structure of mb0×mb0=5×5 shown in FIG. 4 (*d*), the 4×4 sub-matrix in the upper left corner is in the double-diagonal structure, and the element in 4th row and 4th column is a non--1 element; or 3) the element indicated by row index number 0 and column index number 0 in the matrix is a non--1 element, and a sub-matrix formed by (mb0−1) rows and (mb0−1) columns in a lower right corner in the matrix is the double-diagonal structure; in an example of the matrix in a structure of mb0×mb0=5×5 shown in FIG. 4 (*e*), the 4×4 sub-matrix in the lower right corner is in the double-diagonal structure, and element in 0th row and 0th column is a non--1 element; where mb0 is the number of rows of the matrix.

Orthogonality of the base matrix refers to orthogonality of the sub-matrix D in the base matrix of the quasi-cyclic LDPC coding described above. The orthogonality of the base matrix may be selected from at least two of the following: orthogonal property, quasi-orthogonal property, non-orthogonal property, or quasi-non-orthogonal property.

The orthogonal property means that: there is no intersection set among row index number sets RowSETi (i=0, 1, . . . , (I−1)), a union set of all row index number sets RowSETi (i=0, 1, . . . , (I−1)) forms all row index numbers of the sub-matrix D, and in a sub-matrix Di, formed by all rows indicated by a row index number set RowSETi, in the sub-matrix D, there is at most one non--1 element (an element indicating the shift size of the cyclic shift of the identity matrix) among all elements indicated by any one column index number, where I is a positive integer less than a number of rows of the sub-matrix D. All elements in a row index number set RowSETi are consecutive positive integers, i=0, 1, . . . , (I−1).

Figure 5:
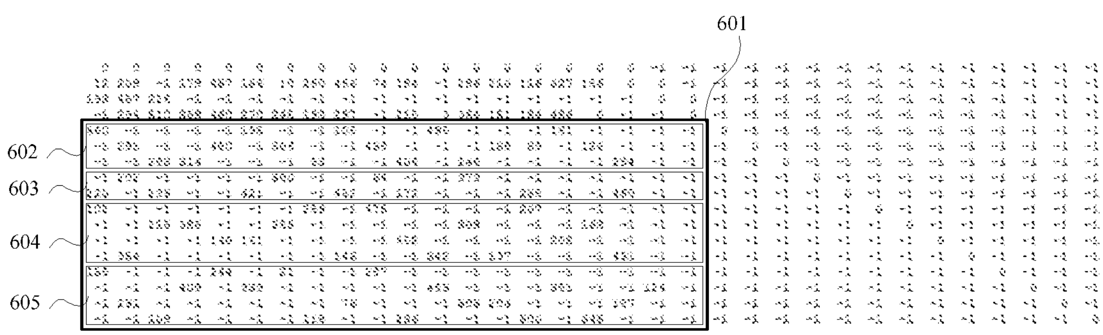
FIG. 5 is a schematic diagram of an example two of a base matrix according to embodiment one of the present disclosure.

In an example of the base matrix shown in FIG. 5, the sub-matrix D is 601 in FIG. 5, and there are four sets of row index numbers in the sub-matrix D: RowSET0={0, 1, 2}, RowSET1={3, 4}, RowSET2={5, 6, 7, 8}, RowSET3={9, 10, 11, 12}, it can be seen that all elements (three elements) indicated by any column index number in a sub-matrix 602 (3 rows and 20 columns) formed by all rows indicated by the row index number set RowSET0 in the sub-matrix D (601) at most have one non--1 element (the element indicating the shift size of the cyclic shift of the identity matrix); similarly, it can be seen that all elements (two elements) indicated by any column index number in a sub-matrix 603 (2 rows and 20 columns) formed by all rows indicated by a row index number set RowSET1 in the sub-matrix D (601) at most have one non--1 element (the element indicating the shift size of the cyclic shift of the identity matrix), and sub-matrices 604 and 605 also have the same property, the sub-matrix D has the orthogonal property, and at the same time, it may be considered that the base matrix shown in FIG. 5 has the orthogonal property, and other base matrices with the same orthogonal property also belong to an orthogonal property category.

the quasi-orthogonal-property means that: two column index number set ColSET0 and ColSET1, where ColSET0 and ColSET1 have no intersection set and a union set of ColSET0 and ColSET1 forms all column index numbers of the sub-matrix D, a sub-matrix formed by all columns indicated by the column index number set ColSET0 in the sub-matrix D is D0, a sub-matrix formed by all columns indicated by the column index number set ColSET1 in the sub-matrix D is D1, and D1 has the orthogonal property while D0 does not have the orthogonal property.

Figure 6:
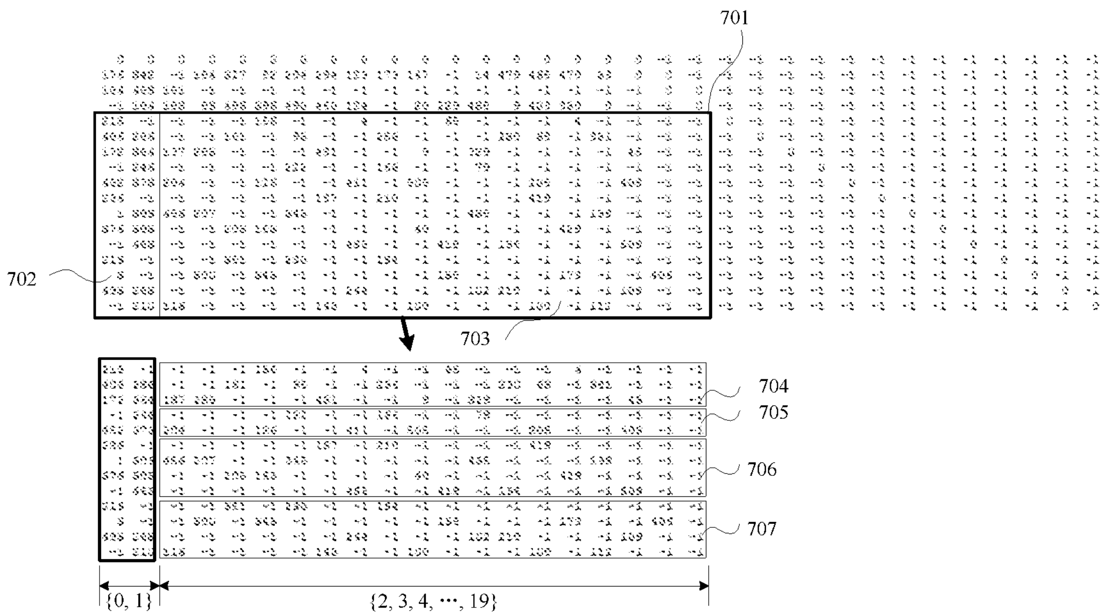
FIG. 6 is a schematic diagram of an example three of a base matrix according to embodiment one of the present disclosure.

In an example of the base matrix shown in FIG. 6, the sub-matrix D (13 rows and 20 columns) is 701 as shown in the figure, ColSET0={0, 1}, ColSET1={2, 3, 4, . . . , 19}, the sub-matrix D0 formed by all columns indicated by a column index number set ColSET0 in the sub-matrix D is 702 as shown in FIG. 6, the sub-matrix D1 formed by all columns indicated by a column index number set ColSET1 in the sub-matrix D is 703 shown in FIG. 6. It can be found that the sub-matrix D1 has the orthogonal property as described above while the sub-matrix D° does not have the orthogonal property. And other base matrices with the same quasi-orthogonal property also belong to a quasi-orthogonal property category. During a rate matching process, a rate matching output sequence obtained by a bit selection does not include systematic bits of (F×Z) bits, the systematic bits of (F×Z) bits corresponding to a column index number of the base matrix is ColSET2, and the ColSET2 is a subset of ColSET0. In the example of the base matrix shown in FIG. 6, ColSET2={0, 1}, i.e., F=2, and the rate matching output sequence does not include foremost systematic bits of (F×Z=2×Z) bits of the quasi-cyclic LDPC mother codewords.

Figure 7:
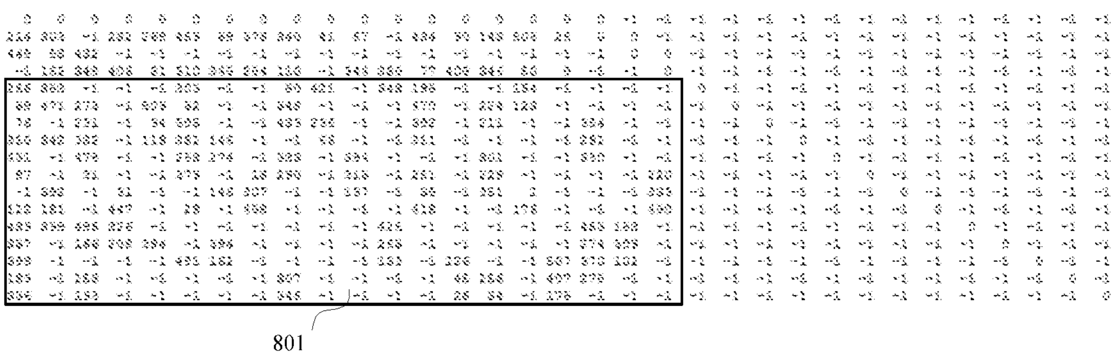
FIG. 7 is a schematic diagram of an example four of a base matrix according to embodiment two of the present disclosure.

The non-orthogonal property means that the sub-matrix does not have the orthogonal property and the quasi-orthogonal property as described above, such as the sub-matrix D (801) of the base matrix exemplified in FIG. 7.

Figure 8:
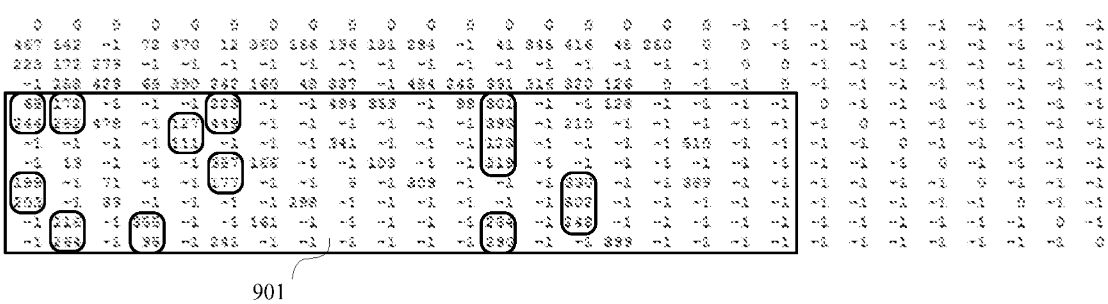
FIG. 8 is a schematic diagram of an example five of a base matrix according to embodiment two of the present disclosure.

The quasi-non-orthogonal property means that the sub-matrix D does not have the orthogonal property and the quasi-orthogonal property as described above, and the sub-matrix D satisfies that: remainders obtained through dividing two adjacent non--1 elements on any column in the matrix by a positive integer P are equal, the positive integer P is an integer greater than 1. In the example of the base matrix shown in FIG. 8, the sub-matrix is 901, remainders obtained through dividing two adjacent non--1 elements on any column in the sub-matrix D by a positive integer P=2 are equal, i.e., values of two adjacent non--1 elements are all even numbers or are all odd numbers, such as two or more adjacent non--1 elements circled in FIG. 8. The beneficial effect lies in: enabling a design of a quasi-cyclic LDPC decoder to be simpler, eliminating a problem of address conflicts between rows in row parallel decoding or block parallel decoding, which can greatly improve a decoding throughput.

Characteristics of the base matrix may be described as: the base matrix of the quasi-cyclic LDPC coding may also be described as: [Hb0 Hb1], where the number of columns of the sub-matrix Hb0 is equal to the number of columns of the core matrix of the base matrix, and the number of rows of the sub-matrix Hb0 is equal to the number of rows of the base matrix. The characteristic of the base matrix refers to the characteristic of the sub-matrix Hb0. The sub-matrix Hb0 includes: two row index number sets RowX and RowY, where RowX and RowY have no intersection and a union set of RowX and RowY constitutes a set formed by all row index numbers of the sub-matrix Hb0; 2 column index number sets ColX and ColY, where ColX and ColY have no intersection and a union set of ColX and ColY constitutes a set formed by all column index numbers of the sub-matrix Hb0.

The base matrix characteristic includes at least two of the following: 1) a column-blocking quasi-equal-remainder characteristic: remainders obtained through dividing two adjacent non-−1 elements on any column in the sub-matrix formed by all rows indicated by the row index number set RowX in the sub-matrix Hb0 by a positive integer P0 are equal, remainders obtained through dividing the positive integer P0 of two adjacent non-−1 elements on any column in the sub-matrix formed by all rows indicated by the row index number set RowY in the sub-matrix Hb0 are not equal, the positive integer P is an integer greater than 1; 2) a row-blocking quasi-equal-remainder characteristic: remainders obtained through dividing two adjacent non-−1 elements on any column in the sub-matrix formed by all columns indicated by the column index number set ColX in the sub-matrix Hb0 by a positive integer P1 are equal, remainders obtained through dividing two adjacent non-−1 elements on any column in the sub-matrix formed by all columns indicated by the column index number set ColY in the sub-matrix Hb0 by the positive integer P1 are not equal, the positive integer P0 is an integer greater than 1.

The number of base matrices means that a number of base matrices used in the quasi-cyclic LDPC coding process, and it is considered here that if base graphs of the base matrices are different, the base matrices are considered to be different. The base graphs refers to a matrix obtained by assigning "1" to a non-−1 element position and "0" to a −1 element position in the base matrix of the quasi-cyclic LDPC coding; and if the mother-base matrices with different number of rows or different number of columns used by the quasi-cyclic LDPC coding, the base matrices are also considered to be different. The number of the base matrices may be selected from at least two of the following: 2, 3, 4, 5, or 6.

A method (pattern) for selecting values of a lifting size means that: a value range of different lifting sizes. A selected-value pattern of the lifting size includes at least two of the following:

Manner one for the selected-value pattern of the lifting size is: selecting a product of a positive integer power of 2 multiplied by a positive integer, such as the lifting size $Z=c\times 2^d$, where c is an element in a set C, d is an element selected in a set D. For example, if the set C is {4,5,6,7} and the set D is {0, 1, 2, 3, 4, 5, 6, 7}, then a lifting size set is: {4, 5, 6, 7, 8, 10, 12, 14, 16, 20, 24, 28, 32, 40, 48, 56, 64, 80, 96, 112, 128, 160, 192, 224, 256, 320, 384, 448, 512, 640, 768, 896}; the set C is {4,5,6,7}, the set D is {1, 2, 3, 4, 5, 6, 7}; the set C is {4, 5, 6, 7}, the set D is {1, 2, 3, 4, 5, 6, 7}; the set C is {3, 4, 5, 6, 7, 8}, the set D is {0, 1, 2, 3, 4, 5, 6}.

Manner two for the selected-value pattern of the lifting size is: selecting continuous values, {1, 2, 3, 4, 5, . . . , Zmax} or {2, 3, 4, 5, . . . , Zmax}, where Zmax is an integer greater than or equal to 128.

Manner three for the selected-value pattern of the lifting size is: intervally selecting continuously increasing values. Continuously increasing values are a positive integer power of 2, for example, {1:1:8, 9:1:16, 18:2:32, 36:4:64, 72:8:128, 144:16:256, 288:32:Zmax}, where Zmax is an integer greater than or equal to 128, where an expression x0:g:x1 means taking an integer not greater than an integer x1 starting from an integer x0 with an interval of a positive integer g, if x0 is greater than x1, the expression is null; and {2:1:8, 10:2:16, 20:4:32, 40:8:64, 80:16:128, 160:32:256, 320:64:Zmax}, where Zmax is an integer greater than or equal to 128; and {2:2:8, 12:4:32, 40:8:64, 80:16:128, 160:32:256}.

Manner four for the selected-value pattern of the lifting size is: a segmentation method, including at least one of the following lifting size sets: {8, 16, 24}; {32, 48, 64, 96}; {128, 192, 256}; {8, 16, 24}; {32, 48, 64, 96}.

Manner five for the selected-value pattern of the lifting size is: a method of calculating through an information bit sequence length and a number of systematic columns of the base matrix and making fine adjustment. For example, the lifting size is determined by the information bit sequence length K and the number of systematic columns kb of the base matrix, where kb is the number of systematic columns of the base matrix of the quasi-cyclic LDPC coding (which is equal to a total number of columns nb minus a total number of rows mb of the base matrix); acquiring the lifting size includes one of: 1) $Z_{orig}=\lceil K/kb\rceil$, an actual coding lifting size s $Z=Z_{orig}+\Delta Z$, the value of $\Delta Z$ is obtained according to different values of $Z_{orig}$; 2) the actual coding lifting size is $Z=\lceil K/kb\rceil$.

Manner six for the selected-value pattern of the lifting size is: selecting a positive integer power of 2, {2 4 8 16 32 64 128 256 512}.

Manner seven for the selected-value pattern of the lifting size is: {256, 192, 144, 108, 81, 61, 46, 35, 27, 21} or {256, 156, 96, 64, 40, 25, 16, 10, 6}.

Manner eight for the selected-value pattern of the lifting size is: satisfying $a\times 2^j$, a={16, 20, 24, 28}, j=0, 1, 2, . . . , J. If a=16 J=5; otherwise, J=4, i.e., the lifting size is a set of {16, 20, 24, 28, 32, 40, 48, 56, 64, 80, 96, 112, 128, 160, 192, 224, 256, 320, 384, 448, 512}.

A granularity pattern of the lifting size refers to an interval, between any two adjacent lifting sizes in a lifting size set, preset and saved of the quasi-cyclic LDPC coding. The granularity pattern of the lifting size may be selected from at least two of the following: 1) a selecting method with an interval of a non-negative integer power of 2, such as a lifting size set is {2:2:8, 12:4:32, 40:8:64, 80:16:128, 160:32:256}, i.e., the granularity pattern of the lifting size is {2, 4, 8, 16, 32}; 2) a selecting method with an interval of a positive integer, such as a lifting size set {2:2:256}, i.e., the granularity pattern of the lifting size is {2}; 3) a selecting method with an interval of a second positive integer multiple of a first positive integer set. The first positive integer set is G0, and all second positive integers constitute a set G1; for example, a set G0 is a non-negative integer power of 2, an example of G0 is {1, 2, 4}, and the set G0 is {1, 4}, the granularity pattern of the lifting size is {1, 2, 4, 8, 16}, and an example of the lifting size set is {1:1:16, 18:2:32, 36:4:64, 72:8:128, 144:16:256}; in another example, an example of G0 is {1, 2, 3} and the set G1 is {1, 4}, then a set of the granularity pattern of the lifting size is {1, 2, 3, 4, 8, 16}.

A maximum value of the lifting size is selected from at least two types of the following: 16, 32, 64, 128, 256, 384, 512, 768, or 1024.

The maximum number of systematic columns of the base matrix is equal to a difference between the total number of columns and the total number of rows of the base matrix of the quasi-cyclic LDPC coding, i.e. kb=nb-mb, kb is the maximum number of systematic columns of the base matrix, nb is the total number of columns of the base matrix, mb is the total number of rows of the base matrix. The maximum number of systematic columns kb of the base matrix may be selected from at least two of the following: 1) kb=8; 2) kb=10; 3) kb=16; 4) kb=24; 5) kb=30; 6) kb=32.

The maximum number of systematic columns of the quasi-cyclic LDPC coding is equal to the maximum number of systematic columns of the base matrix actually used for the quasi-cyclic LDPC coding. For example, the maximum number of the systematic columns of an original base matrix is kb, while the maximum number of systematic columns of the base matrix actually used for the quasi-cyclic LDPC coding is less than or equal to kb, i.e., the base matrix actually used for the quasi-cyclic LDPC coding is formed by part or all of systematic columns and part or all of the check columns of the original base matrix. The maximum number of the systematic columns of the quasi-cyclic LDPC coding is selected from at least 2 integers from 2 to 32; preferably, the maximum number of the systematic columns of the quasi-cyclic LDPC coding may be selected from at least two types of: 1) 3; 2) 4; 3) 5; 4) 6; 5) 7; 6) 8.

An information bit length pattern supported by the quasi-cyclic LDPC coding refers to the information bit sequence length that can be supported by the quasi-cyclic LDPC coding in a case that some certain dummy bits are padded. The information bit length pattern supported by the quasi-cyclic LDPC coding may be selected from at least two of the following: 1) having a fixed bit number interval, such as the information bit length pattern is a set of TBS', TBS'+ΔTBS, TBS'+2×ΔTBS, . . . , TBSmax}, where TBS' is equal to 8, 16, 24, 32 or 40, TBSmax is equal to 2048, 4096, 6144 or 8192, ΔTBS is a fixed positive integer; 2) having intervals of a set {8, 16, 32, 64}, such as the information bit length pattern is sets of {{TBS0, TBS0+8, TBS0+2×8, . . . , TBS0+L1×8}, {TBS0+L1×8+16, TBS0+2×16, . . . , TBS0+L1×8+L2×16}, {TBS0+L1×8+L2×16+32, TBS0+L1×8+L2×16+2×32, . . . , TBS0+L1×8+L2×16+L3×32}, {TBS0+L1×8+L2×16+L3×32+64, TBS0+L1×8+L2×16+L3×32+2×64, . . . , TBS0+L1×8+L2×16+L3×32+L4×64}}, where TBS0 is equal to 8, 16, 24, 32 or 40; 3) being equal to a positive integer power of 2, the information bit length pattern is a set of {2, 4, 8, 16, 32, 64, 128, 256, 512, 1024, 2048, 4096, 8192, 16384}.

The number of base matrices refers to the number of base matrices that need to be used in the quasi-cyclic LDPC coding process. The number of base matrices may be selected from at least two of: 1) 1 base matrix; 2) 2 base matrices; 3) 3 base matrices; 4) 4 base matrices.

The maximum information length supported by the quasi-cyclic LDPC coding refers to the maximum information bit sequence length supported by the base matrix of the quasi-cyclic LDPC coding, which is generally equal to an integer value obtained by the maximum number of systematic columns of the base matrix of the quasi-cyclic LDPC coding times a maximum lifting size. The maximum information length supported by the quasi-cyclic LDPC coding may be selected from at least two of the following: maximum information bit sequence length one: Kmax=1024; maximum information bit sequence length two: Kmax=2048; maximum information bit sequence length three: Kmax=4096; maximum information bit sequence length four: Kmax=6144; maximum information bit sequence length five: Kmax=8192; maximum information bit sequence length six: Kmax=512; maximum information bit sequence length seven: Kmax=12288; and maximum information bit sequence length eight: Kmax=768.

A minimum code rate of the base matrix at the maximum information bit sequence length refers to a minimum code rate supported by the base matrix of the quasi-cyclic LDPC coding at the maximum information bit sequence length, and the minimum code rate of the base matrix at the maximum information bit sequence length may be selected from at least two of minimum code rate one: 1/12; minimum code rate two: 1/8; minimum code rate three: 1/6; minimum code rate four: 1/5; minimum code rate five: 1/4; minimum code rate six: 1/3; minimum code rate seven: 1/2; or minimum code rate eight: 2/3.

The value selecting method of the lifting size is that: the lifting size is a product of d powers of 2 multiplied by a positive integer c; where c is an element in a positive integer set C, and d is a positive integer and an element in an non-negative integer set D. Preferably, the positive integer set C is selected from at least two methods of the following: all integers from a positive integer cmin to a positive integer cmax, all odd numbers from a positive integer cmin to a positive integer cmax, all even numbers from a positive integer cmin to a positive integer cmax, all prime numbers from a positive integer cmin to a positive integer cmax, or all positive integers with an interval of g starting from a positive integer cmin and ending at a positive integer cmax; where cmax is greater than cmin, g is an integer greater than 1. Preferably, the non-negative integer set D is selected from at least two methods: all integers from a positive integer dmin to a positive integer dmax, all odd numbers from a positive integer dmin to a positive integer dmax, all even numbers from a positive integer dmin to a positive integer dmax, all prime numbers from a positive integer dmin to a positive integer dmax, or all positive integers with an interval of g starting from a positive integer dmin and ending at a positive integer dmax; where dmax is greater than dmin, g is an integer greater than 1.

A pattern of systematic columns not to be transmitted of the rate matching output sequence refers to a number of systematic columns corresponding to systematic bits which are not transmitted during a rate matching process of the quasi-cyclic LDPC coding, the pattern of systematic columns not to be transmitted may be selected from at least two of: pattern one of systematic columns not to be transmitted: 0; pattern two of systematic columns not to be transmitted: 1; pattern three of systematic columns not to be transmitted: 2; or pattern four of systematic columns not to be transmitted: 3.

A shortened coding pattern of the quasi-cyclic LDPC coding refers to an at most number of systematic columns occupied by dummy bits padded in the quasi-cyclic LDPC coding process, and the shortened coding pattern may be selected from at least two of: shortened coding pattern one: 0; shorten coding pattern two: 1; shorten coding pattern three: 2; shorten coding pattern four: 3; shorten coding pattern five: 4; shorten coding pattern six: 5; shorten coding pattern seven: 6; shorten coding pattern eight: 8; shorten coding pattern nine: 12; or shorten coding pattern nine: 16. When shortening the coding, the quasi-cyclic LDPC coding may obtain a lower bit rate. For example, a size of the base matrix is mb rows and nb columns, the number of systematic columns is kb=nb−mb, and the bit rate is R=kb/nb. When shortening the coding for Δkb columns, the code rate becomes R'=(kb−Δkb)/(nb−Δkb), i.e., a lower code rate can be achieved.

A check column puncturing pattern of the rate matching output sequence means that check bits generated by the core matrix are rearranged in units of Z (coding lifting size) bits during the rate matching in the quasi-cyclic LDPC coding, the rearranged index sequence is the check column punching pattern, and the check column punching pattern may be selected from at least two types of the following: check column punching pattern one: a set of arranging even numbers from 0 to mb'−1 followed by odd numbers from 0 to mb'−1; check column punching pattern two: a set of arranging odd numbers from 0 to mb'−1 followed by even numbers from 0 to mb'−1; check column punching pattern three: [0, 1, 2, . . . , mb'−1]; check column punching pattern four: [mb'−1, mb'−2, . . . 2, 1, 0]; where mb' is a number of check columns in the core matrix and mb' is an integer greater than or equal to 3.

The granularity pattern of the information bit length supported by the quasi-cyclic LDPC coding refers to: an interval of any two adjacent information transmission block values determined by the system, and the granularity pattern of the information bit sequence may be selected from at least two of the following: information bit length granularity pattern one: 2 bits; information bit sequence length granularity pattern two: 4 bits; information bit sequence length granularity pattern three: 8 bits; information bit sequence length granularity pattern four: 16 bits; information bit sequence length granularity pattern five: 32 bits; information bit sequence length granularity pattern six: 64 bits; information bit sequence length granularity pattern seven: 128 bits; information bit sequence length granularity pattern eight: 256 bits. A set of all information bit lengths supported by the quasi-cyclic LDPC coding may be described by a formula or a data table.

The number of edges of the base matrix refers to a maximum value of the number of shift values of all element positions in the base matrix of the quasi-cyclic LDPC coding. The number of edges of the base matrix may be selected from at least two types: the number of edges of the base matrix one: 1 edge; the number of edges of the base matrix two: 2 edges; the number of edges of the base matrix three: 3 edges.

A HARQ combining mode of the quasi-cyclic LDPC coding refers to a data combining mode adopted by the quasi-cyclic LDPC coding when data retransmission occurs. The HARQ combining mode may be selected from at least two of: the HARQ combining mode 1: a chase combining (CC) mode; the HARQ combining mode 2: an incremental redundancy (IR) combining mode; the HARQ combining mode 3: a mixed mode of the chase combining and the incremental redundancy combining mode.

A starting bit position of a bit selection of the rate matching output sequence refers to a starting bit position for performing the bit selection of the retransmission data when the retransmission data occurs of the quasi-cyclic LDPC coding. The starting bit position of the bit selection of the rate matching output sequence may be selected from at least two types of the following: the starting bit position of the bit selection of the rate matching output sequence 1 is: a next cyclic bit position of an end bit of data transmitted last time; the starting bit position of the bit selection of the rate matching output sequence 2 is: related to a code length L of a quasi-cyclic LDPC code mother code, a maximum number of HARQ transmissions TXmax, a number of systematic columns not to be transmitted P, and the lifting size Z, for example, the starting bit position of the bit selection of the rate matching output sequence transmitted for (RV)th time is $RV\times\lfloor L/TX\max\rfloor+P\times Z$; the starting bit position of the bit selection of the rate matching output sequence 3 is: related to the code length L of the quasi-cyclic LDPC code mother code, a number RVnum of HARQ transmission versions, the number P of systematic columns not to be transmitted, and the lifting size Z, for example, the starting bit position of the bit selection of the rate matching output sequence transmitted for the (RV)th time is $RV\times\lfloor L/RVnum\rfloor+P\times Z$.

The maximum number of HARQ transmissions of the quasi-cyclic LDPC coding refers to a maximum number of transmissions (including a first transmission and a retransmission) of the quasi-cyclic LDPC coding if a transmission error occurs during data transmission. The maximum number of HARQ transmissions may be transmitted from at least 2 types of the following: mode one of the maximum number of HARQ transmissions: twice; mode two of the maximum number of HARQ transmissions: 3 times; mode three of the maximum number of HARQ transmissions: 4 times; mode four of the maximum number of HARQ transmissions: 5 times; mode five of the maximum number of HARQ transmissions: once.

The number of HARQ transmission versions of the quasi-cyclic LDPC coding refers to a number of transmission versions provided by the quasi-cyclic LDPC coding if the data transmission error occurs during the data transmission. And each transmission version number corresponds to a start position of the bit selection of the data transmission. The number of transmission versions is an integer greater than or equal to the maximum number of HARQ transmissions of quasi-cyclic LDPC coding. When the data requires to be retransmitted for the transmission error, a transmission version number needs to be selected from the plurality of transmission versions, and rate matching and transmission are performed on a corresponding start position of the bit selection for data transmission. The number of HARQ transmission versions may be selected from at least two types: HARQ transmission version number one: 2; HARQ transmission version number two: 4; HARQ transmission version number three: 6; HARQ transmission version number four: 8; HARQ transmission version number five: 12; HARQ transmission version number six: 16; HARQ transmission version number seven: 24; HARQ transmission version number eight: 32; HARQ transmission version number nine: 48; and HARQ transmission version number ten: 64.

The interleaving pattern of the rate matching output sequence refers to: an interleaving operation performed on the rate matching output sequence obtained by performing rate matching after the quasi-cyclic LDPC coding, and the interleaving pattern may be selected from at least two types: 1. bit rearrangement, i.e., dispersing and interleaving check bits and systematic bits of the rate matching output sequence, the check bits are dispersed in the systematic bits, for example, adopting a row-in and column-out block interleaving method, a depth of the block interleaving method is related to at least one of the following parameters: the lifting size Z, the total number of columns of the base matrix, the number of systematic columns kb, the number of rows of the base matrix mb, the information length K, the code rate R and the code length; 2. in a constellation modulation process of retransmission data, bit rearrangement is performed on an overlapping part of the retransmission data and data transmitted last time, so that the data of the overlapping part at low-reliability bits of constellation modulation symbols in a last transmission are at high-reliability bits of constellation modulation symbols in this retransmission to compensate for amplitude fluctuations of soft information due to higher-order constellation modulation; 3. cyclic interleaving, cyclic interleaving of W×Z bits is performed on the rate matching output sequence, where Z is the lifting size used by the quasi-cyclic LDPC coding, and W is an integer greater than 0.

Embodiment Two

Embodiment two of the present disclosure provides a processing method for quasi-cyclic LDPC coding. The method includes steps described below.

In step S310: according to a maximum information length supported by the quasi-cyclic LDPC coding, a transmission block before encoding is divided into code blocks so that multiple information bit sequences are obtained, and an information bit sequence length is not greater than the maximum information length.

In step S320: according to a pattern of the information bit length supported by the quasi-cyclic LDPC coding, padding bits are added at the end of the multiple information bit sequences, so that a length of the information bit sequence reaches a length in the pattern of the information bit length supported by the quasi-cyclic LDPC coding, and the added padding bits are the least.

In step S330: according to the length of the information bit sequence after addition, a lifting size used by the quasi-cyclic LDPC coding is selected from a pattern of the lifting size, and the base matrix used by the quasi-cyclic LDPC coding is acquired; and elements in the base matrix is modified according to the lifting size to obtain the modified base matrix.

In step S340: according to the lifting size and the modified base matrix, the quasi-cyclic LDPC coding is performed on the information bit sequence after addition to obtain an LDPC coding output sequence.

In step S350, rate matching interleaving is performed on the LDPC coding output sequence to obtain the interleaved output sequence, and according to a start bit position of the bit selection determined by the transmission version number, a bit selection is performed on the interleaved output sequence to obtain a rate matching output sequence. The purpose of the rate matching interleaving is to enable the order of the bit selection to be consecutive.

In step S360: an interleaving method is selected according to an interleaving pattern of the rate matching output sequence, the rate matching output sequence is interleaved to obtain the interleaved bit sequence.

In step S370: a constellation symbol modulation is performed on the interleaved bit sequence to obtain a constellation modulation symbol sequence, and the constellation modulation symbol sequence is sent.

In an embodiment, a processing strategy of the quasi-cyclic LDPC coding may be determined according to a release version of the information bit sequence.

An example of the release version includes different release version numbers in the 3GPP standard protocol, such as release12, release13, release14, release15, release16, release17, release18, release19, etc., and more version numbers provided in the future will also be applicable.

In an embodiment, a processing strategy of the quasi-cyclic LDPC coding may be determined according to an operation mode of the information bit sequence.

The operation mode at least includes: an in-band operation mode, an out-of-band operation mode, an independent operation mode and a mixed operation mode, etc., and definitions of other operation modes are also applicable.

In an embodiment, a processing strategy of the quasi-cyclic LDPC coding may be determined according to a user equipment (UE) category of the information bit sequence.

The UE category includes at least: various UE categories defined in the LTE system, which are divided into multiple user categories according to different transmission peak rates, other user equipment categories are also applicable.

In an embodiment, the processing strategy of quasi-cyclic LDPC coding may be determined according to a coverage area.

The coverage area includes at least: a large coverage area, a small coverage area, etc. The large coverage area may be a scenario where signals are easily transmitted, such as outdoors, etc., or a small coverage area, such as indoor, etc. Other coverage area definitions are also applicable.

In an embodiment, a processing strategy of the quasi-cyclic LDPC coding may be determined according to a code rate of the rate matching output sequence.

The code rate at least includes that: there are G code rate thresholds, and a code rate is selected from code rates among the G code rate thresholds. For example, if G is equal to 1, there is (G=1) code rate threshold R0, the code rate is divided into a code rate less than or equal to R0, and a code rate greater than R0; if G is equal to 2, there are G=2 code rate thresholds R0 and R1 (R0 is less than R1), the code rate is divided into a code rate less than or equal to R0, a code rate greater than R0 and less than or equal to R1, and a code rate greater than R1, and other coverage area definitions are also applicable.

In an embodiment, a processing strategy of the quasi-cyclic LDPC coding may be determined according to the length of the information bit sequence (an information length).

The length of the information bit sequence at least includes: providing G1 information length thresholds, and the length of the information bit sequence is selected in information length sets among the G1 information length thresholds. For example, if G1 is equal to 1, there is G1=1 information length threshold K0, then the information length is divided into a set of information lengths less than or equal to K0, and a set of information lengths greater than K0; if G1 is equal to 2, there are G1=2 information length thresholds K0 and K1 (K0 is less than K1), then the information length is divided into a set of information lengths less than or equal to K0, a set of information lengths greater than K0 and less than or equal to K1, and a set of information lengths greater than K1; and other definitions of information length ranges are also applicable.

In an embodiment, the processing strategy of the quasi-cyclic LDPC coding may be determined according to a combination of the code rate and a length (code length) of the rate matching output sequence.

The code rate at least includes that: there are G code rate thresholds, and a code rate is selected from code rates among the G code rate thresholds. For example, if G is equal to 1, there is (G=1) code rate threshold R0, the code rate is divided into a code rate less than or equal to R0, and a code rate greater than R0; if G is equal to 2, there are G=2 code rate thresholds R0 and R1 (R0 is less than R1), the code rate is divided into a code rate less than or equal to R0, a code rate greater than R0 and less than or equal to R1, and a code rate greater than R1, and other definitions of code rate ranges are also applicable.

The code length at least includes that: there are G1 length thresholds, and the code length is selected in length sets among the G1 length thresholds. For example, if G1 is equal to 1, there is G1=1 length threshold K0, then the code length is divided into a set of lengths less than or equal to K0, and a set of lengths greater than K0; if G1 is equal to 2, there are G1=2 length thresholds K0 and K1 (K0 is less than Ki), then the code length is divided into a set of lengths less than or equal to K0, a set of lengths greater than K0 and less than or equal to Ki, and a set of lengths greater than K1; and other definitions for the code length range are also applicable.

In an embodiment, the processing strategy of the quasi-cyclic LDPC coding may be determined according to a combination of the code rate of the rate matching output sequence and a length (information length) of the information bit sequence.

In an embodiment, a processing strategy of the quasi-cyclic LDPC coding may be determined according to a control information format of the information bit sequence.

The control information format is determined by the system and includes a downlink control information (DCI) format, for example, including control information such as the modulation and coding scheme (MCS), HARQ retransmission, or resource scheduling information.

In an embodiment, a processing strategy of the quasi-cyclic LDPC coding is determined according to a cyclic redundancy check (CRC) of the information bit sequence.

A CRC scrambling format is determined by the system, and downlink data or control information is scrambled to improve system robustness, such as carrying some pieces of control information, etc.

In an embodiment, a processing strategy of the quasi-cyclic LDPC coding is determined according to a search space corresponding to the information bit sequence.

The search space refers to a common search space and a UE-specific search space defined by the LTE system, and may also include other search space definitions.

In an embodiment, a processing strategy of the quasi-cyclic LDPC coding is determined according to the CSI corresponding to the information bit sequence.

The CSI process refers to the channel state information defined by the LTE system, and may also include other channel state information definitions, such as definitions in the 5G or NR system.

In an embodiment, a processing strategy of the quasi-cyclic LDPC coding may be determined according to a subframe set index number of the information bit sequence.

The subframe set index number refers to: radio frame data is divided into multiple subframes (for example 10 subframes are included in the LTE system, each subframe includes 2 slots), a subframe index is assigned to each subframe, and the subframe index is the subframe set index. And the subframe set index number may also include other subframe set index number definitions defined by the system, such as those defined in the 5G or NR system.

In an embodiment, a processing strategy of the quasi-cyclic LDPC coding may be determined according to an MCS index of the information bit sequence.

The MCS index of the information bit sequence is a level index number used by the communication system to indicate a modulation order and a code rate, such as 16 levels, 32 levels, or 64 levels, and the MCS index may also include MCS definitions defined by the other system, such as those defined in the 5G or NR system.

In an embodiment, the processing strategy of quasi-cyclic LDPC coding may be determined according to at least one of: a link direction of the information bit sequence, an aggregation level of a control channel unit (CCE) of the information bit sequence, an scrambling mode of the information bit sequence; a channel type of the information bit sequence, a carrier frequency of the information bit sequence, an HARQ data transmission version number of the information bit sequence.

The link direction of the information bit sequence includes: uplink data or downlink data; the uplink data is data transmitted by the user equipment to the base station, and the downlink data is data transmitted by the base station to the user equipment.

The aggregation level of the control channel element (CCE) of the information bit sequence refers to a number of resource elements allocated to control signaling, such as {1, 2, 4, 8} in the LTE system, and other communication systems, and for example, the corresponding definitions in the 5G system or NR system are also applicable.

The scrambling mode of the information bit sequence refers to scrambling the information bit sequence to scramble or randomize the information bit sequence. There may be many kinds of scrambling modes, such as performing an XOR operation with random sequences having same lengths, and the random sequence may have various forms.

The channel type of the information bit sequence may include: a data channel, a control channel, a broadcast channel; or more specifically, may include: a physical downlink shared channel (PDSCH, used for carrying downlink user information and higher layer signaling), a physical broadcast channel (PBCH, used for carrying main system information block information, and transmitting for initial access), a physical multicast channel (PMCH, used for carrying multimedia/multicast information), a physical control format indication channel (PCFICH, used to for carrying information about a size of a control region on a subframe), a physical downlink control channel (PDCCH, used for carrying downlink control information, such as an uplink scheduling instruction, a downlink data transmission, common control information, etc.) and a physical HARO indication channel (PHICH, used for carrying ACK/NACK feedback information for terminal uplink data).

A carrier frequency of the information bit sequence refers to a center frequency within a frequency bandwidth carrying the information bit sequence. Generally speaking, the bandwidth which can be used by a high carrier frequency is large, while the bandwidth which can be used by a low carrier frequency is small.

The HARQ data transmission version number of the information bit sequence is an HARQ version number of the current data transmission acquired in the control information.

In an embodiment, a processing strategy of the quasi-cyclic LDPC coding may be determined according to an application scenario of the information bit sequence.

The application scenario includes: an enhanced mobile broadband (eMBB), an ultra-reliable and low-latency communications (URLLC) scenario, or a massive machine type communications (mMTC) scenario, and other application scenario definitions are also applicable.

In an embodiment, the quasi-cyclic LDPC coding includes Y base matrices, and according to the data feature representing the information bit sequence, the quasi-cyclic LDPC coding is performed on one base matrix selected form the Y base matrices to obtain an LDPC coding sequence, where Y is an integer greater than 1.

where Y base matrices at least includes one of the following characteristics:

1) There are at least 2 base matrices with a same base graph in the Y base matrices. The same base graph means that the 2 base matrices are M1 and M2, and the base graph of M1 is equal to the base graph of M2, and at least one value of non-−1 elements in one of two base matrices is not equal to that in the other base matrix; the base graph is matrix obtained by assigning "1" to positions of non-−1 elements in the base matrix and "0" to positions of −1 elements. Beneficial effects of the same feature of the base graph are that: there are nesting features between the base matrices, which enables the structure of the quasi-cyclic LDPC decoder to be more unified, routes for storing and reading soft information to be unified, and the decoder to be more compact and simpler.

2) There are at least two base matrices with a same-quasi-base-graph in the Y base matrices. The same-quasi-base-graph means that two base graphs have different elements with the number a, and a is an integer greater than 0 and less than or equal to 10, for example, the two base matrices are M3 and M4, the number of rows of M3 is equal to the number of rows of M4, the number of columns of M3 is equal to the number of columns of M4, a set of row and column index pairs corresponding to all non-−1 elements in M3 is SET3, a set of row and column index pairs corresponding to all non-−1 elements in M4 is SET4, a difference set between the SET3 and the SET4 is DS3, the number of elements in the DS3 is less than or equal to TH3, a difference set between the SET4 and the SET3 is DS4, and the number of elements in the DS4 is less than or equal to TH4, where TH3 and TH4 are positive integers less than 10.

Figure 9:
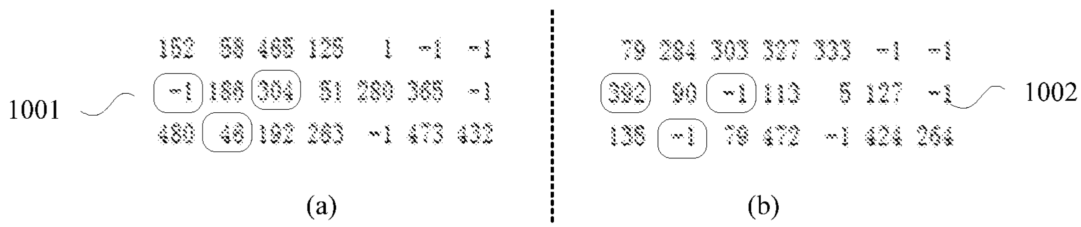
FIG. 9 is a schematic diagram of an example six of a base matrix according to embodiment two of the present disclosure.

In an example of the base matrix shown in FIG. 9, the SET3 formed by the row and column index pairs corresponding to all non-−1 elements of the base matrix (a) (as shown in FIG. 9 (*a*)) is {[0, 0], [2, 0], [0, 1], [1, 1], [2, 1], [0, 2], [1, 2], [2, 2], [0, 3], [1, 3], [2, 3], [0, 4], [1, 4], [1, 5], [2, 5], [2, 6]}, the SET4 formed by the row and column index pairs corresponding to all non-−1 elements of the base matrix (b) (as shown in FIG. 9 (*b*)) is {[0, 0], [1, 0], [2, 0], [0, 1], [1, 1], [0, 2], [2, 2], [0, 3], [1, 3], [2, 3], [0, 4], [1, 4], [1, 5], [2, 5], [2, 6]}, it may be found that the difference set DS3 between the SET3 and the SET4 is {[2, 1], [1, 2]}, the difference set DS4 between the SET4 and the SET3 is {[1,0]}, i.e., the base graph of the base matrix (a) and the base graph of the base matrix (b) have 3 different elements, which may be considered that template-matrices of the two base matrix are quasi-identical.

Beneficial effects of the base graph having the quasi-identical feature are enabling the structure of the quasi-cyclic LDPC decoder to be more unified, soft information storage and a reading route to be more unified, and the decoder to be more compact and simple; and each base matrix has some particularities, which enables the performance of quasi-cyclic LDPC coding to be good without changing the decoder structure or making fairly minor changes to the decoder structure.

Figure 10:
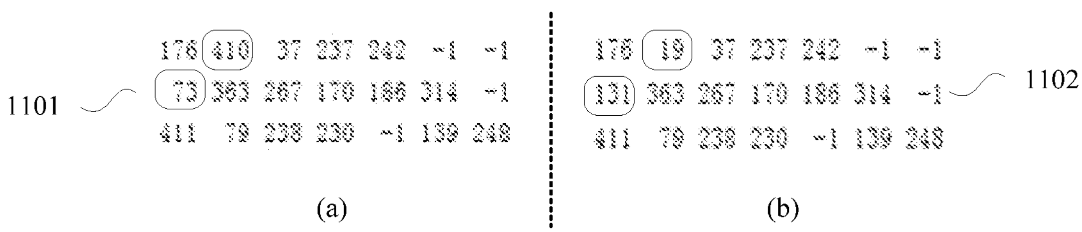
FIG. 10 is a schematic diagram of an example seven of a base matrix according to embodiment two of the present disclosure.

3) At least two base matrices with a quasi-identical matrix element exist in the Y base matrices, the matrix element quasi-identical means that: two base matrices have different elements with number b, where b is an integer greater than 0 and less than or equal to 10; for example, 2 base matrices are M5 and M6, for at most row and column index number pairs with number TH5, elements indexed by the row and column index number pairs in the M5 are not equal to elements indexed by the same row and column index number pairs in the M6; the base graph is a matrix obtained by assigning "1" to positions of non-−1 elements and "0" to positions of −1 elements in the base matrix. The beneficial effect of the quasi-identical matrix element is enabling an interleaved network in the quasi-cyclic LDPC decoder to be unified, although some elements are different, it has little effect on the increased complexity, and the decoder is simple and easy to design. In the example of the base matrix shown in FIGS. 10 (*a*) and 10 (*b*), TH5=2, where row and column index pairs of TH5=2 are [1, 0] and [0, 1]. Of course, in the case that the base graphs of two base matrices are different, the two base matrices may also have the characteristic of having the quasi-identical matrix element.

Figure 11:
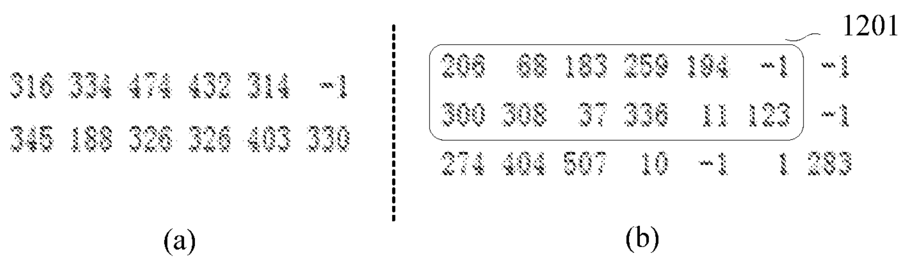
FIG. 11 is a schematic diagram of an example eight of a base matrix according to embodiment two of the present disclosure.

4) At least two base matrices with base graph nesting exist in the Y base matrices. The base graph nesting means that in the two base matrices with the base graph nesting, a base graph of a small base matrix is a sub-matrix of a base graph of a large base matrix, for example, two base matrices is M7 and M8, the number of rows of the M7 is less than the number of rows of the M8, the number of columns of the M7 is less than the number of columns of the M8, and the base graph of the M7 is a sub-matrix of the base graph of the M8. The base graph is a matrix obtained by assigning "1" to positions of non-−1 elements in the base matrix and "0" to positions of −1 elements. The beneficial effect of the feature of the same base graph subset is that under base matrices having different sizes, the small base matrix is a subset of the large base matrix, i.e., the small base matrix is nested in the large base matrix, which may enable the quasi-cyclic LDPC decoder to be compatible, and the same decoder can be used for decoding base matrices having different sizes, the decoding is simple and convenient to be designed. As shown in FIG. 11, the base matrix (a) (as shown in FIG. 11 (*a*)) is a sub-matrix of the base matrix (b) (as shown in FIG. 11 (*b*)).

5) At least two base matrices with a same base graph subset exist in the Y base matrices; the same base graph subset means that: a sub-matrix in the base graph of a base matrix 1 is equal to a sub-matrix in the base graph of a base matrix 2; for example, the two base matrices are M9 and M10, the number of rows of M9 is less than the number of rows of M10, the number of columns of M9 is less than the number of columns of M10, the base matrices M9 and M10 both have the following structure:

$$Hb = \begin{bmatrix} A & B & C \\ D1 & D2 & E \end{bmatrix}.$$

A sub-matrix A and a sub-matrix B constitute a core matrix of the base matrix. A sub-matrix C, a sub-matrix D1, a sub-matrix D2, and a sub-matrix E are all extended on the basis of the core matrix and support a lower code rate. The same base graph subset includes one of the following features: 1) the core matrix of the base graph M9 is a sub-matrix of the core matrix of the base graph M10; 2) the sub-matrix D1 of the base graph M9 is a sub-matrix of the sub-matrix D1 of the base graph M10; 3) the sub-matrix D2 of the base graph M9 is a sub-matrix of the sub-matrix D2 of the base graph M10. The base graph is a matrix obtained by assigning "1" to positions of non-−1 elements in the base matrix and "0" to positions of −1 elements. The beneficial effect of the same base graph subset is that the base matrix is more convenient to design, the optimization is performed on the unified template, the design of the decoders is unified, and the routing network required is consistent.

6) At least two base matrices with a same base matrix subset exist in the Y base matrices; i.e., the same base matrix subset means that: a sub-matrix existing in the base matrix 1 is equal to a sub-matrix in the base matrix 2. For example, the two base matrices have a matrix structure as described above (including a sub-matrix A, a sub-matrix B, a sub-matrix C, a sub-matrix D1, a sub-matrix D2, and a sub-matrix E), and the same base matrix subset means that the two base matrices are M11 and M12, the number of rows of the M11 is less than the number of rows of the M12, the number of columns of the M11 is less than the number of columns of the M12, and the same base matrix subset includes one of the following features: 1) a core matrix of the M11 is a sub-matrix of a core matrix of the M12; 2) the sub-matrix D1 of the M11 is a sub-matrix of the sub-matrix D1 of the M12; 3) the sub-matrix D2 of the M11 is a sub-matrix of the sub-matrix D2 of the M12. The beneficial effect of the feature of the same base matrix subset is that: part of sub-matrices in the base matrices are equal, not only a decoder routing network and a shift network are unified, but also element characteristics of the base matrices are enabled to be basically consistent, which is beneficial to ensure the performance of the quasi-cyclic LDPC coding to remain good. The sub-matrix D1 may correspond to a sub-matrix formed by systematic columns that are not transmitted during the process of rate matching.

In an embodiment, the base matrix at least includes a preset ratio of non-−1 elements positions of which are same as positions of "1" in a reference base graph, and the reference base graph is a sub-matrix of the following base graph:

1 1 1 1 1 1 1 1 1 1 1 1 1 1 1 1 1 1 0 0 0 0 0 0 0 0 0 0 0 0 0 0 0 0 0 0 0 0 0 0 0 0 0 0 0 0 0 0 0 0;
1 1 0 1 1 1 1 1 1 1 1 1 1 1 1 0 1 1 1 0 0 0 0 0 0 0 0 0 0 0 0 0 0 0 0 0 0 0 0 0 0 0 0 0 0 0 0 0 0 0;
1 1 0 0 0 0 0 0 0 0 0 0 0 0 0 0 0 0 1 1 0 0 0 0 0 0 0 0 0 0 0 0 0 0 0 0 0 0 0 0 0 0 0 0 0 0 0 0 0 0;
0 1 1 1 1 1 1 1 1 0 1 1 1 1 1 1 1 0 0 1 0 0 0 0 0 0 0 0 0 0 0 0 0 0 0 0 0 0 0 0 0 0 0 0 0 0 0 0 0 0;
1 1 0 0 0 1 0 0 0 1 0 0 0 0 0 0 1 0 0 0 1 0 0 0 0 0 0 0 0 0 0 0 0 0 0 0 0 0 0 0 0 0 0 0 0 0 0 0 0 0;
1 1 0 1 0 0 0 1 0 0 0 0 0 1 0 0 0 0 0 0 0 1 0 0 0 0 0 0 0 0 0 0 0 0 0 0 0 0 0 0 0 0 0 0 0 0 0 0 0 0;
1 1 1 0 1 0 1 0 0 0 1 0 0 0 0 1 0 0 0 0 0 0 1 0 0 0 0 0 0 0 0 0 0 0 0 0 0 0 0 0 0 0 0 0 0 0 0 0 0 0;
1 0 0 0 0 0 0 0 1 0 0 1 1 0 0 0 1 0 0 0 0 0 0 1 0 0 0 0 0 0 0 0 0 0 0 0 0 0 0 0 0 0 0 0 0 0 0 0 0 0;
1 1 0 0 0 1 0 1 0 0 0 1 0 0 0 0 0 0 0 0 0 0 0 0 1 0 0 0 0 0 0 0 0 0 0 0 0 0 0 0 0 0 0 0 0 0 0 0 0 0;
1 1 1 0 1 0 0 0 0 1 0 0 0 1 0 1 0 0 0 0 0 0 0 0 0 1 0 0 0 0 0 0 0 0 0 0 0 0 0 0 0 0 0 0 0 0 0 0 0 0;
1 1 0 0 0 0 1 0 0 0 1 0 0 0 0 0 1 0 0 0 0 0 0 0 0 0 1 0 0 0 0 0 0 0 0 0 0 0 0 0 0 0 0 0 0 0 0 0 0 0;
1 1 0 1 0 0 0 1 0 0 0 0 0 0 1 0 0 1 0 0 0 0 0 0 0 0 0 1 0 0 0 0 0 0 0 0 0 0 0 0 0 0 0 0 0 0 0 0 0 0;
1 1 1 0 1 0 0 0 0 0 0 1 0 0 0 0 0 0 0 0 0 0 0 0 0 0 0 0 1 0 0 0 0 0 0 0 0 0 0 0 0 0 0 0 0 0 0 0 0 0;
1 1 0 0 0 0 1 0 0 0 0 0 1 0 0 0 1 0 0 0 0 0 0 0 0 0 0 0 0 1 0 0 0 0 0 0 0 0 0 0 0 0 0 0 0 0 0 0 0 0;
1 1 0 0 0 0 0 0 1 0 0 0 0 0 0 1 0 1 0 0 0 0 0 0 0 0 0 0 0 0 1 0 0 0 0 0 0 0 0 0 0 0 0 0 0 0 0 0 0 0;
1 1 0 1 0 0 0 0 0 1 0 0 0 0 1 0 0 0 0 0 0 0 0 0 0 0 0 0 0 0 0 1 0 0 0 0 0 0 0 0 0 0 0 0 0 0 0 0 0 0;
0 1 0 0 1 0 0 0 0 0 0 1 0 0 0 0 0 0 1 0 0 0 0 0 0 0 0 0 0 0 0 0 1 0 0 0 0 0 0 0 0 0 0 0 0 0 0 0 0 0;
1 1 0 0 0 1 0 0 0 0 0 0 0 0 0 0 1 0 0 0 0 0 0 0 0 0 0 0 0 0 0 0 0 1 0 0 0 0 0 0 0 0 0 0 0 0 0 0 0 0;
1 0 1 0 0 0 1 0 0 0 0 0 0 1 0 0 0 0 0 0 0 0 0 0 0 0 0 0 0 0 0 0 0 0 1 0 0 0 0 0 0 0 0 0 0 0 0 0 0 0;
0 1 0 0 0 0 0 1 0 0 0 0 0 0 1 0 0 1 0 0 0 0 0 0 0 0 0 0 0 0 0 0 0 0 0 1 0 0 0 0 0 0 0 0 0 0 0 0 0 0;
1 0 0 0 0 0 0 0 1 0 0 0 0 0 0 0 0 0 1 0 0 0 0 0 0 0 0 0 0 0 0 0 0 0 0 0 1 0 0 0 0 0 0 0 0 0 0 0 0 0;
0 1 0 0 1 0 0 0 0 0 1 0 0 0 0 0 1 0 0 0 0 0 0 0 0 0 0 0 0 0 0 0 0 0 0 0 0 1 0 0 0 0 0 0 0 0 0 0 0 0;
1 0 1 0 0 1 0 0 0 0 0 0 0 1 0 0 0 0 0 0 0 0 0 0 0 0 0 0 0 0 0 0 0 0 0 0 0 0 1 0 0 0 0 0 0 0 0 0 0 0;
1 1 0 0 0 0 0 0 0 0 0 0 1 0 0 0 0 1 0 0 0 0 0 0 0 0 0 0 0 0 0 0 0 0 0 0 0 0 0 1 0 0 0 0 0 0 0 0 0 0;
1 1 0 1 0 0 1 0 1 0 0 0 0 0 0 0 0 0 0 0 0 0 0 0 0 0 0 0 0 0 0 0 0 0 0 0 0 0 0 0 1 0 0 0 0 0 0 0 0 0;
1 1 0 0 0 0 0 0 0 0 1 0 0 0 0 0 1 0 0 0 0 0 0 0 0 0 0 0 0 0 0 0 0 0 0 0 0 0 0 0 0 1 0 0 0 0 0 0 0 0;
1 1 1 0 0 0 0 1 0 0 0 0 0 0 0 0 0 0 0 0 0 0 0 0 0 0 0 0 0 0 0 0 0 0 0 0 0 0 0 0 0 0 1 0 0 0 0 0 0 0;
0 1 0 0 0 1 0 0 0 0 0 0 0 0 0 0 0 0 1 0 0 0 0 0 0 0 0 0 0 0 0 0 0 0 0 0 0 0 0 0 0 0 0 1 0 0 0 0 0 0;
0 1 0 0 1 0 0 0 0 0 0 0 0 0 1 0 0 1 0 0 0 0 0 0 0 0 0 0 0 0 0 0 0 0 0 0 0 0 0 0 0 0 0 0 1 0 0 0 0 0;
0 1 0 0 0 0 1 0 0 1 0 0 0 0 0 0 1 0 0 0 0 0 0 0 0 0 0 0 0 0 0 0 0 0 0 0 0 0 0 0 0 0 0 0 0 1 0 0 0 0;
0 1 1 1 0 0 0 0 0 0 0 0 0 0 0 0 0 0 0 0 0 0 0 0 0 0 0 0 0 0 0 0 0 0 0 0 0 0 0 0 0 0 0 0 0 0 1 0 0 0;

where in the base graph, the element which is equal to "1" indicates that an element of a corresponding position in the base matrix has an element value of non-−1, and the element which is equal to "0" indicates that an element of a corresponding position in the base matrix has an element value of −1. Preferably, the preset ratio is a real number greater than 60% and less than or equal to 100%.

Figure 12:
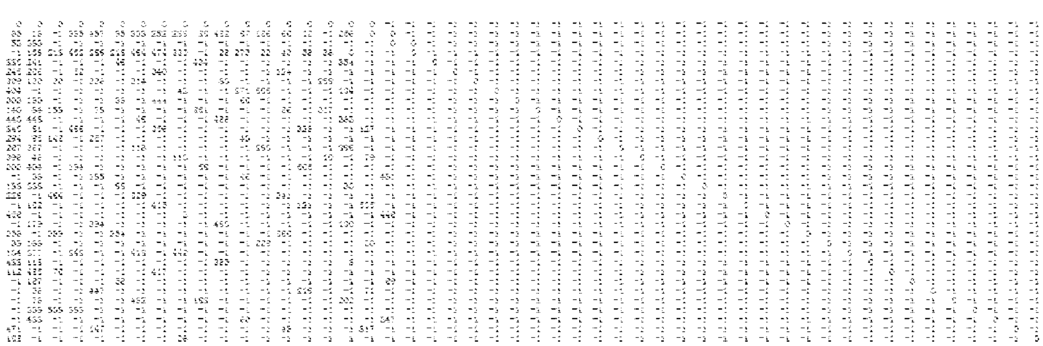
FIG. 12 is a schematic diagram of an example nine of a base matrix according to embodiment two of the present disclosure.

Preferably, the base matrix is an example of the base matrix as shown in FIG. 12, and the preset ratio is equal to 100%.

Embodiment Three

Embodiment three of the present disclosure provides a processing method for quasi-cyclic LDPC coding. The method includes:

a base graph $H_{BG}$ of the base matrix is the same as a first base graph $H^1_{BG}$;

the first base graph includes t sub-matrices, i.e., $$H^1_{BG} = \begin{bmatrix} H^1_{BGsub1} \\ H^1_{BGsub2} \\ \vdots \\ H^1_{BGsubt} \end{bmatrix},$$

where $H^1_{BGsub1}$, $H^1_{BGsub2}$, . . . , $H^1_{BGsubt}$ are respectively a first, second, . . . , t-th sub-matrix of the first base graph. Each sub-matrix $H_{BGsubi}$ includes a plurality of consecutive rows of the first base graph, and rows corresponding to a sub-matrix with a small index value are above rows corresponding to a sub-matrix with a large index value, where a number of rows of an i-th sub-matrix is $R^1_{subi}$, and $0<R^1_{subi}\leq R^1_{BG}$, i=1, 2, . . . , t, where $R^1_{BG}$ is a number of rows of the first base graph $H^1_{BG}$; where an index value t of each sub-matrix is a positive integer, and 1≤t≤11;

where elements in the base graph of the base matrix only have two values of "0" or "1", and the base graph has a same number of rows and a same number of columns as the base matrix, elements of "1" and elements of "0" respectively correspond to non-−1 elements and −1 elements in the base matrix.

A second base graph is provided, where the second base graph has a same number of rows and a same number of columns as the first base graph; and a second base graph $H^2_{BG}$ includes t sub-matrices, i.e., $$H^2_{BG} = \begin{bmatrix} H^2_{BGsub1} \\ H^2_{BGsub2} \\ \vdots \\ H^2_{BGsubt} \end{bmatrix},$$

where $H^2_{BGsub1}$, $H^2_{BGsub2}$, . . . , $H^2_{BGsubt}$ are respectively a first, a second, . . . , a $t^{th}$ sub-matrix of the second base graph; each sub-matrix $H^2_{BGsubi}$ includes a plurality of consecutive rows of the second base graph, and rows corresponding to a sub-matrix with a small index value are above rows corresponding to a sub-matrix with a large index value, where a number of rows of an i-th sub-matrix is $R^2_{subi}$, and $0\leq R^2_{subi}\leq R^2_{BG}$, i=1, 2, . . . , t, where $R^2_{BG}$ is a number of rows of the second base graph $H^2_{BGi}$; where an index value t of each sub-matrix is a positive integer, and 1≤t≤11.

In an embodiment, the first base graph and the second base graph have the following relationship:

an i-th sub-matrix $H^1_{BGsubi}$ of the first base graph is the same as an i-th sub-matrix $H^2_{BGsubi}$ of the second base graph, where i is a positive integer and i=0, or 1, or 2, . . . , or t.

In an embodiment, an i-th sub-matrix $H^1_{BGsubi}$ of the first base graph is the same as an i-th sub-matrix $H^{T}_{BGsubi}$ of the second base graph after adjustment; where i is a positive integer and i=0, or 1, or 2, . . . , or t.

In an embodiment, a first row of a first sub-matrix $H^{T}_{BGsubi}$ of the second base graph after adjustment is increased by x1 "1" elements and/or reduced by x1' "1" elements than a first row of the sub-matrix $H^2_{BGsub1}$ before adjustment, where x1 and x' are integers, and 0≤x1≤15, 0≤x1'≤15.

In an embodiment, a second row of a first sub-matrix $H^{2'}_{BGsub1}$ of the second base graph after adjustment is increased by x2 "1" elements and/or reduced by x2' "1" elements than a second row of the sub-matrix $H^2_{BGsub1}$ before adjustment, where x2 and x2' are integers, and 0≤x2≤15, 0≤x2'≤15.

In an embodiment, a third row of a first sub-matrix $H^{2'}_{BGsub1}$ of the second base graph after adjustment is increased by x3 "1" elements and/or reduced by x3' "1" elements than a third row of the sub-matrix $H^2_{BGsub1}$ before adjustment, where x3 and x3' are integers, and 0≤x3≤15, 0≤x3'≤15.

In an embodiment, a fourth row of a first sub-matrix $H^{2'}_{BGsub1}$ of the second base graph after adjustment is increased by x4 "1" elements and/or reduced by x4' "1" elements than a fourth row of the sub-matrix $H^2_{BGsub1}$ before adjustment, where x4 and x4' are integers, and 0≤x4≤15, 0≤x4'≤15.

In an embodiment, a fifth row of a first sub-matrix $H^{2'}_{BGsub1}$ of the second base graph after adjustment is increased by x5 "1" elements and/or reduced by x5' "1" elements than a fifth row of the sub-matrix $H^2_{BGsub1}$ before adjustment, where x5 and x5' are integers, and 0≤x5≤15, 0≤x5'≤15.

In an embodiment, a six row of a first sub-matrix $H^{2'}_{BGsub1}$ of the second base graph after adjustment is increased by x6 "1" elements and/or reduced by x6' "1" elements than a first row of the sub-matrix $H^2_{BGsub1}$ before adjustment, where x6 and x6' are integers, and 0≤x6≤15, 0≤x6'≤15.

In an embodiment, the i-th sub-matrix $H^{2'}_{BGsubi}$ of the second base graph after adjustment is a matrix obtained by rearranging rows of the i-th sub-matrix $H^2_{BGsubi}$ before adjustment; where rearranging the rows of the i-th sub-matrix $H^2_{BGsubi}$ refers to changing an arrangement order of the rows of the sub-matrix $H^2_{BGsubi}$.

In an embodiment, a matrix portion of first (Kb+M) columns of an i-th sub-matrix $H^{2'}_{BGsubi}$ of the second base graph after adjustment is a matrix obtained by rearranging L rows of a matrix portion of first (Kb+M) columns of an i-th sub-matrix $H^2_{BGsubi}$ before adjustment; where Kb is a difference between a number of columns and a number of rows of the second base graph, Kb is an integer greater than 0, and L and M are single digits. A more specific example is that the second base graph is:

1 1 0 1 1 0 1 1 1 0 1 1 1 1 1 0 1 1 1 0 1 1 1 1 0 0 0 0 0 0 0 0 0 0 0 0 0 0 0 0 0 0 0 0 0 0 0 0 0 0 0 0 0 0 0 0 0 0 0 0 0 0 0 0 0
0 0 0
1 1 1 0 1 1 1 1 1 1 1 0 0 1 1 1 0 1 1 1 1 0 0 1 1 0 0 0 0 0 0 0 0 0 0 0 0 0 0 0 0 0 0 0 0 0 0 0 0 0 0 0 0 0 0 0 0 0 0 0 0 0 0 0 0
0 0 0
1 0 1 1 1 1 0 1 1 1 0 1 1 0 1 1 1 1 0 1 0 1 1 0 1 1 0 0 0 0 0 0 0 0 0 0 0 0 0 0 0 0 0 0 0 0 0 0 0 0 0 0 0 0 0 0 0 0 0 0 0 0 0 0 0
0 0 0
1 1 1 1 0 1 1 0 0 1 1 1 1 1 0 1 1 0 1 1 1 1 1 0 0 1 0 0 0 0 0 0 0 0 0 0 0 0 0 0 0 0 0 0 0 0 0 0 0 0 0 0 0 0 0 0 0 0 0 0 0 0 0 0 0
0 0 0
1 1 0 0 0 0 0 0 0 0 0 0 0 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0
0 0 0
1 1 0 0 0 0 0 0 0 1 1 0 1 0 0 0 0 1 1 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0
0 0 0
1 0 0 0 1 0 1 0 0 0 0 1 0 1 0 0 0 0 0 1 1 0 0 0 0 0 0 0 1 0 0 0 0 0 0 0 0 0 0 0 0 0 0 0 0 0 0 0 0 0 0 0 0 0 0 0 0 0 0 0 0 0 0 0 0
0 0 0
1 1 0 0 0 0 0 0 1 1 1 0 1 0 0 0 0 1 0 0 0 1 1 0 0 0 0 0 0 1 0 0 0 0 0 0 0 0 0 0 0 0 0 0 0 0 0 0 0 0 0 0 0 0 0 0 0 0 0 0 0 0 0 0 0
0 0 0
1 1 0 0 0 0 1 0 0 0 0 1 0 1 0 0 0 0 1 1 0 0 0 0 1 0 0 0 0 0 1 0 0 0 0 0 0 0 0 0 0 0 0 0 0 0 0 0 0 0 0 0 0 0 0 0 0 0 0 0 0 0 0 0 0
0 0 0
0 1 0 0 0 0 0 0 0 1 1 0 1 0 0 0 1 1 0 0 1 0 0 0 0 0 0 0 0 0 0 1 0 0 0 0 0 0 0 0 0 0 0 0 0 0 0 0 0 0 0 0 0 0 0 0 0 0 0 0 0 0 0 0 0
0 0 0
1 1 0 0 1 0 1 0 0 0 0 0 0 1 0 1 0 0 1 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0 0
0 0 0
1 0 0 0 0 1 0 0 0 1 1 1 1 0 0 0 0 1 0 0 0 0 0 1 0 0 0 0 0 0 0 0 0 1 0 0 0 0 0 0 0 0 0 0 0 0 0 0 0 0 0 0 0 0 0 0 0 0 0 0 0 0 0 0 0
0 0 0
1 0 0 0 1 0 1 0 0 0 0 0 0 1 0 0 0 0 1 0 0 0 1 0 0 0 0 0 0 0 0 0 0 0 1 0 0 0 0 0 0 0 0 0 0 0 0 0 0 0 0 0 0 0 0 0 0 0 0 0 0 0 0 0 0
0 0 0
1 1 0 1 0 0 0 0 0 0 0 0 1 0 0 0 0 1 0 0 0 1 0 0 0 0 0 0 0 0 0 0 0 0 0 1 0 0 0 0 0 0 0 0 0 0 0 0 0 0 0 0 0 0 0 0 0 0 0 0 0 0 0 0 0
0 0 0
0 1 0 0 0 0 1 1 0 1 0 0 0 0 0 0 0 0 0 0 1 0 0 0 0 0 0 0 0 0 0 0 0 0 0 0 1 0 0 0 0 0 0 0 0 0 0 0 0 0 0 0 0 0 0 0 0 0 0 0 0 0 0 0 0
0 0 0
1 0 0 0 0 0 0 0 0 0 1 0 0 1 0 0 0 1 0 0 0 1 0 0 1 0 0 0 0 0 0 0 0 0 0 0 0 1 0 0 0 0 0 0 0 0 0 0 0 0 0 0 0 0 0 0 0 0 0 0 0 0 0 0 0
0 0 0
1 1 1 0 0 0 1 0 0 0 0 0 0 0 0 0 0 0 0 0 1 0 0 0 0 0 0 0 0 0 0 0 0 0 0 0 0 0 1 0 0 0 0 0 0 0 0 0 0 0 0 0 0 0 0 0 0 0 0 0 0 0 0 0 0
0 0 0
1 0 0 0 1 0 0 0 0 0 1 0 1 0 1 0 0 0 0 0 0 0 0 0 0 0 0 0 0 0 0 0 0 0 0 0 0 0 0 1 0 0 0 0 0 0 0 0 0 0 0 0 0 0 0 0 0 0 0 0 0 0 0 0 0
0 0 0
0 1 0 0 0 0 1 0 0 1 0 0 0 1 0 0 0 1 0 0 0 0 0 0 0 1 0 0 0 0 0 0 0 0 0 0 0 0 0 0 1 0 0 0 0 0 0 0 0 0 0 0 0 0 0 0 0 0 0 0 0 0 0 0 0
0 0 0
1 0 0 0 1 0 0 0 0 0 1 1 1 0 0 0 0 0 0 0 0 0 0 0 0 0 0 0 0 0 0 0 0 0 0 0 0 0 0 0 0 1 0 0 0 0 0 0 0 0 0 0 0 0 0 0 0 0 0 0 0 0 0 0 0
0 0 0
0 1 0 0 0 0 1 0 0 1 0 0 0 0 0 0 0 0 1 0 0 0 0 1 0 0 0 0 0 0 0 0 0 0 0 0 0 0 0 0 0 0 1 0 0 0 0 0 0 0 0 0 0 0 0 0 0 0 0 0 0 0 0 0 0
0 0 0
1 0 0 1 1 0 0 0 0 0 1 0 0 1 0 0 0 0 0 0 0 0 0 0 0 0 0 0 0 0 0 0 0 0 0 0 0 0 0 0 0 0 0 1 0 0 0 0 0 0 0 0 0 0 0 0 0 0 0 0 0 0 0 0 0
0 0 0
1 1 0 0 0 0 0 0 0 1 0 0 0 0 0 0 1 0 0 0 0 0 0 0 1 0 0 0 0 0 0 0 0 0 0 0 0 0 0 0 0 0 0 0 1 0 0 0 0 0 0 0 0 0 0 0 0 0 0 0 0 0 0 0 0
0 0 0
0 1 0 0 0 0 0 0 0 0 0 0 0 1 0 1 0 1 0 0 0 0 0 0 0 0 0 0 0 0 0 0 0 0 0 0 0 0 0 0 0 0 0 0 0 1 0 0 0 0 0 0 0 0 0 0 0 0 0 0 0 0 0 0 0
0 0 0
0 1 0 0 0 0 0 0 1 1 0 0 1 0 0 0 0 0 0 0 0 0 0 0 0 0 0 0 0 0 0 0 0 0 0 0 0 0 0 0 0 0 0 0 0 0 1 0 0 0 0 0 0 0 0 0 0 0 0 0 0 0 0 0 0
0 0 0
1 0 0 0 0 1 1 0 0 0 0 1 0 0 0 0 0 0 0 0 0 0 0 0 0 0 0 0 0 0 0 0 0 0 0 0 0 0 0 0 0 0 0 0 0 0 0 1 0 0 0 0 0 0 0 0 0 0 0 0 0 0 0 0 0
0 0 0
1 1 0 0 0 0 0 0 0 1 0 0 0 0 0 0 0 0 0 0 0 0 0 1 1 0 0 0 0 0 0 0 0 0 0 0 0 0 0 0 0 0 0 0 0 0 0 0 1 0 0 0 0 0 0 0 0 0 0 0 0 0 0 0 0
0 0 0
1 0 0 0 0 0 0 0 0 0 0 1 1 0 0 0 0 0 0 0 0 0 0 0 0 1 0 0 0 0 0 0 0 0 0 0 0 0 0 0 0 0 0 0 0 0 0 0 0 1 0 0 0 0 0 0 0 0 0 0 0 0 0 0 0
0 0 0
1 1 1 0 0 0 1 0 0 0 1 0 0 0 0 0 0 0 0 0 0 0 0 0 0 0 0 0 0 0 0 0 0 0 0 0 0 0 0 0 0 0 0 0 0 0 0 0 0 0 1 0 0 0 0 0 0 0 0 0 0 0 0 0 0
0 0 0
0 1 0 0 0 0 0 1 0 0 0 0 1 0 0 0 0 1 0 0 0 0 0 0 0 0 0 0 0 0 0 0 0 0 0 0 0 0 0 0 0 0 0 0 0 0 0 0 0 0 0 1 0 0 0 0 0 0 0 0 0 0 0 0 0
0 0 0
1 0 0 0 0 0 0 0 0 0 0 0 0 1 1 0 0 0 0 0 0 0 0 0 0 1 0 0 0 0 0 0 0 0 0 0 0 0 0 0 0 0 0 0 0 0 0 0 0 0 0 0 1 0 0 0 0 0 0 0 0 0 0 0 0
0 0 0
1 0 0 0 0 0 0 0 0 1 1 0 0 0 0 0 0 0 0 1 0 0 0 0 0 0 0 0 0 0 0 0 0 0 0 0 0 0 0 0 0 0 0 0 0 0 0 0 0 0 0 0 0 1 0 0 0 0 0 0 0 0 0 0 0
0 0 0
0 1 0 0 0 0 1 0 0 0 0 0 1 0 0 0 0 0 0 0 0 0 1 0 0 0 0 0 0 0 0 0 0 0 0 0 0 0 0 0 0 0 0 0 0 0 0 0 0 0 0 0 0 0 1 0 0 0 0 0 0 0 0 0 0
0 0 0
1 0 0 1 0 0 0 0 0 0 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0 1 0 0 0 0 0 0 0 0 0
0 0 0
0 1 0 0 0 0 0 0 0 0 1 0 0 0 1 0 0 0 0 0 0 0 0 0 1 0 0 0 0 0 0 0 0 0 0 0 0 0 0 0 0 0 0 0 0 0 0 0 0 0 0 0 0 0 0 0 1 0 0 0 0 0 0 0 0
0 0 0
0 1 0 0 0 0 0 0 0 1 0 0 0 1 0 0 1 0 0 0 0 0 0 0 0 0 0 0 0 0 0 0 0 0 0 0 0 0 0 0 0 0 0 0 0 0 0 0 0 0 0 0 0 0 0 0 0 1 0 0 0 0 0 0 0
0 0 0
1 1 0 1 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 1 0 0 0 0 0 0
0 0 0
1 0 0 0 0 0 1 0 0 0 1 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0 1 0 0 0 0 0
0 0 0
0 1 0 0 0 0 0 0 1 0 0 0 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0 0 0 0 1 0 0 0 0
0 0 0
1 0 0 0 0 0 0 1 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0 1 0 0 0
0 0 0
1 1 0 0 0 0 0 0 0 0 0 0 0 0 1 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0 0 1 0 0
0 0 0
1 0 0 0 0 0 1 0 0 0 0 0 0 0 0 0 0 0 0 1 0 0 0 1 0 0 0 0 0 0 0 0 0 0 0 0 0 0 0 0 0 0 0 0 0 0 0 0 0 0 0 0 0 0 0 0 0 0 0 0 0 0 0 1 0
0 0 0
0 1 0 0 1 0 0 0 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 1
0 0 0
0 1 1 0 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0
1 0 0

-continued

| |
|---|
| 1 0 0 0 0 1 0 0 0 0 0 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 |
| 0 1 0 |
| 0 1 0 0 0 0 0 0 0 0 0 0 0 1 0 0 0 0 0 0 0 0 0 1 0 1 0 0 0 0 0 0 0 0 0 0 0 0 0 0 0 0 0 0 0 0 0 0 0 0 0 0 0 0 0 0 0 0 0 0 0 0 0 0 0 |
| 0 0 1 |

It can be seen that the second base graph is a matrix with 46 rows and 68 columns, and Kb is a difference between a number of columns and a number of rows, i.e., Kb=68−46=22. The second base graph includes t=3 sub-matrices $H^2_{BGsub1}$, $H^2_{BGsub2}$, $H^2_{BGsub3}$, where rows 1 to 17 constitute a first sub-matrix $H^2_{BGsub1}$, rows 18 to 20 constitute a second sub-matrix $H^2_{BGsub2}$, and rows 21 to 46 constitute a first sub-matrix $H^2_{BGsub3}$. An (i=2)th sub-matrix $H^2_{BGsubi}$ before adjustment is a sub-matrix with 3 rows and 68 columns constituted by 18th to 20th rows of the second base graph described above, as follows:

| |
|---|
| 10001000001010100000000000000000000000001000000000000000000000000000 |
| 01000010010001000100000001000000000000001000000000000000000000000000 |
| 10001000001110000000000000000000000000000100000000000000000000000000 |

A matrix portion of first (Kb+M) columns of an (i=2)th sub-matrix $H^{2'}_{BGsubi}$ of the second base graph after adjustment is a matrix obtained by rearranging L rows of a matrix portion of first (Kb+M) columns of an i-th sub-matrix $H^2_{BGsubi}$ before adjustment; where M=2, L=2, M=4, a preferred solution is that the (i=2)th sub-matrix $H^{2'}_{BGsubi}$ of the second base graph after adjustment is obtained by rearranging a matrix portion of first (Kb+M=26) columns of an (i=2)th sub-matrix $H^2_{BGsubi}$ (a sub-matrix of 3 rows and 68 columns) before adjustment and rearranging (L=2) rows, i.e., changing a first row and a third row (rearranging) of the matrix portion of first (Kb+M=26) columns can obtain the i-th sub-matrix $H^{2'}_{BGsubi}$ of the second base graph:

| |
|---|
| 10001000001110000000000000000000000000001000000000000000000000000000 |
| 01000010010001000100000001000000000000001000000000000000000000000000 |
| 10001000001010100000000000000000000000000100000000000000000000000000 |

where the first sub-matrix and the third sub-matrix are not adjusted, and the adjusted second base graph may be obtained as:

| |
|---|
| 11011011101111101110111100000000000000000000000000000000000000000000 |
| 11101111111001110111100110000000000000000000000000000000000000000000 |
| 10111101110110111101011011000000000000000000000000000000000000000000 |
| 11110110011111011011111001000000000000000000000000000000000000000000 |
| 11000000000000000000000000100000000000000000000000000000000000000000 |
| 11000000011010000110000000010000000000000000000000000000000000000000 |
| 10001010000101000001100000001000000000000000000000000000000000000000 |
| 11000000111010000100011000000100000000000000000000000000000000000000 |
| 11000010000101000011000010000010000000000000000000000000000000000000 |
| 01000000011010001100100000000001000000000000000000000000000000000000 |
| 11001010000001010010000000000000100000000000000000000000000000000000 |
| 10000100011110000100000100000000010000000000000000000000000000000000 |
| 10001010000001000010001000000000001000000000000000000000000000000000 |
| 11010000000010000100010000000000000100000000000000000000000000000000 |
| 01000011010000000000100000000000000010000000000000000000000000000000 |
| 10000000001001000100010010000000000001000000000000000000000000000000 |
| 11100010000000000000100000000000000000100000000000000000000000000000 |
| 10001000001110000000000000000000000000001000000000000000000000000000 |
| 01000010010001000100000001000000000000001000000000000000000000000000 |
| 10001000001010100000000000000000000000000100000000000000000000000000 |
| 01000010010000000010000100000000000000000010000000000000000000000000 |
| 10011000001001000000000000000000000000000001000000000000000000000000 |
| 11000000010000001000000010000000000000000000100000000000000000000000 |

-continued

```
0100000000000101010000000000000000000000000000100000000000000000000000
0100000011001000000000000000000000000000000000100000000000000000000000
1000011000010000000000000000000000000000000000100000000000000000000
1100000001000000000000011000000000000000000000100000000000000000000
1000000000011000000000001000000000000000000000010000000000000000000
1110001000100000000000000000000000000000000000000100000000000000000
0100000100001000010000000000000000000000000000000010000000000000000
1000000000000110000000000100000000000000000000000001000000000000000
1000000001100000000010000000000000000000000000000000100000000000000
0100001000001000000000100000000000000000000000000000010000000000000
1001000000000000000000010000000000000000000000000000001000000000000
0100000000100010000000001000000000000000000000000000000100000000000
0100000001000100100000000000000000000000000000000000000010000000000
1101010000000000000000000000000000000000000000000000000001000000000
1000001000100001000000000000000000000000000000000000000000100000000
0100000010000000000000000100000000000000000000000000000000010000000
1000000100000000010000000000000000000000000000000000000000001000000
1100000000000000100000001000000000000000000000000000000000000100000
1000001000000000000010001000000000000000000000000000000000000010000
0100100000000000000001000000000000000000000000000000000000000001000
0110000000000001000000000000000000000000000000000000000000000000100
1000010000000000000000001000000000000000000000000000000000000000010
0100000000000010000000001010000000000000000000000000000000000000001
```

The first base graph includes t=3 sub-matrices $H^1_{BGsub1}$, $H^1_{BGsub2}$, $H^1_{BGsub3}$, where rows 1 to 17 constitute a first sub-matrix $H^1_{BGsub1}$, and rows 18 to 20 constitute a second sub-matrix $H^1_{BGsub2}$, rows 21 to 46 constitute a first sub-matrix $H^1_{BGsub3}$. An (i=2)th sub-matrix $H^1_{BGsubi}$ of the first base graph is the same as an (i=2)th sub-matrix $H^T_{BGsubi}$ of the second base graph after adjustment, a first sub-matrix and a third sub-matrix of the first base graph are the same as a first sub-matrix and a third sub-matrix of the second base graph after adjustment. It can be known that the first base graph is equal to the second base graph after adjustment exemplified above. And the base graph $H_{BG}$ of the base matrix is the same as the first base graph $H^1_{BG}$, i.e., the base graph of the base matrix used for actual encoding is the same as the first base graph, and according to simulation, a requirement of a signal-to-noise ratio in a case where an error block rate is equal to 0.01 is shown in the following table (2nd to 4th elements in a first column of the table are 3 code rate values, 2nd to 15th elements in a first row are different information lengths, and the rest are corresponding to signal-to-noise ratio values indicated by a code rate Rate and a message length K, the lower a value of the signal-to-noise ratio is, the better the performance is).

Performance after adjusting the (i=2)th sub-matrix

| Rate\K | 4096 | 4160 | 4224 | 4288 | 4352 | 4416 | 4480 |
|---|---|---|---|---|---|---|---|
| 0.5789 | 1.9252 | 1.9215 | 1.9143 | 1.9263 | 1.9151 | 1.9106 | 1.9097 |
| 0.5641 | 1.7343 | 1.7341 | 1.7364 | 1.7257 | 1.7207 | 1.7208 | 1.7188 |
| 0.55 | 1.5618 | 1.5606 | 1.56 | 1.5419 | 1.5464 | 1.5459 | 1.5471 |

| | 4544 | 4608 | 4672 | 4736 | 4800 | 4864 | 4928 |
|---|---|---|---|---|---|---|---|
| | 1.9036 | 1.9138 | 1.9062 | 1.9012 | 1.8982 | 1.8949 | 1.8922 |
| | 1.7178 | 1.7162 | 1.7096 | 1.7071 | 1.7078 | 1.7081 | 1.7102 |
| | 1.5473 | 1.5375 | 1.5334 | 1.5341 | 1.5343 | 1.5327 | 1.5336 |

Performance without adjustment

| Rate\K | 4096 | 4160 | 4224 | 4288 | 4352 | 4416 | 4480 |
|---|---|---|---|---|---|---|---|
| 0.5789 | 1.9334 | 1.9342 | 1.9409 | 1.9263 | 1.9189 | 1.921 | 1.9202 |
| 0.5641 | 1.749 | 1.7498 | 1.7748 | 1.7369 | 1.7381 | 1.7369 | 1.7356 |
| 0.55 | 1.5705 | 1.567 | 1.5587 | 1.5654 | 1.5617 | 1.5566 | 1.552 |

| | 4544 | 4608 | 4672 | 4736 | 4800 | 4864 | 4928 |
|---|---|---|---|---|---|---|---|
| | 1.9209 | 1.9138 | 1.9099 | 1.9079 | 1.9076 | 1.9082 | 1.906 |
| | 1.7378 | 1.7252 | 1.7259 | 1.7256 | 1.7236 | 1.7244 | 1.738 |
| | 1.5471 | 1.5539 | 1.5545 | 1.5454 | 1.542 | 1.5376 | 1.5344 |

It may be found that the adjusted performances are almost better than the performance without adjustment.

Preferably, in an embodiment, the step in which the matrix portion of the first (Kb+M) columns of the i-th sub-matrix $H^{T}_{BGsubi}$ of the second base graph after adjustment is a matrix obtained by rearranging the L rows of the matrix portion of the first (Kb+M) columns of the i-th sub-matrix $H^{2}_{BGsubi}$ before adjustment further includes: the matrix obtained by rearranging the L rows of the matrix portion of the first (Kb+M) columns of the i-th sub-matrix $H^{2}_{BGsub1}$ before adjustment is $H^{2''}_{BGsubi}$, the matrix portion of the first (Kb+M) columns of the i-th sub-matrix $H^{2'}_{BGsubi}$ of the second base graph after adjustment is increased by x7 "1" elements and/or reduced by x7' "1" elements than the matrix $H^{2''}_{BGsubi}$, where x7 and x7' are integers, and 0≤x7≤15, 0≤x7'≤15.

In an embodiment, the step in which the i-th sub-matrix $H^{2''}_{BGsubi}$ of the second base graph after adjustment is the matrix obtained by rearranging rows of the i-th sub-matrix $H^{2}_{BGsubi}$ before adjustment further includes: the matrix obtained by rearranging the rows of the i-th sub-matrix $H^{2}_{BGsubi}$ before adjustment is $H^{2}$"BGsubi, the i-th submatrix $H^{T}_{BGsubi}$ of the second base graph after adjustment is increased by x8 "1" elements and/or reduced by x8' "1" elements than the matrix $H^{2'''}_{BGsubi}$, where x8 and x8' are integers, 0≤x8≤15, and 0≤x8'≤15.

A third base graph is provided, where the third base graph has a same number of rows and a same number of columns as the first base graph; and a third base graph $H^{3}_{BG}$ includes t sub-matrices, i.e., $$H^3_{BG} = \begin{bmatrix} H^3_{BGsub1} \\ H^3_{BGsub2} \\ \vdots \\ H^3_{BGsubt} \end{bmatrix},$$

where $H^{3}_{BGsub1}$, $H^{3}_{BGsub2}$, . . . , $H^{3}_{BGsubt}$ are respectively a first, a second, . . . , a $t^{th}$ sub-matrix of the third base graph; each sub-matrix $H^{3}_{BGsubi}$ includes a plurality of consecutive rows of the third base graph, and rows corresponding to a sub-matrix with a small index value are above rows corresponding to a sub-matrix with a large index value, where a number of rows of an i-th sub-matrix is $R^{3}_{subi}$, and $0<R^{3}_{subi}\leq R^{3}_{BG}$, i=1, 2, . . . , t, where $R^{3}_{BG}$ is a number of rows of the third base graph $H^{3}_{BG}$; where an index value t of each sub-matrix is a positive integer, and 1≤t≤11.

In an embodiment, at least one sub-matrix $H^{1}_{BGsubi}$ in the first base graph is the same as a sub-matrix $H^{3}_{BGsubi}$ of the third base graph, where i is an integer and 1≤i≤11.

In an embodiment, at least one sub-matrix $H^{1}_{BGsubi}$ in the first base graph is the same as the sub-matrix $H^{2'}_{BGsubi}$ of the second base graph after adjustment;

where a proportion of a number of "1" elements in the sub-matrix $H^{T}_{BGsubi}$ of the second base graph after adjustment increases a1% and/or decreases a1'% compared with the number of "1" elements in the sub-matrix $H^{2}_{BGsubi}$ before adjustment, where a1 and a1' are positive numbers not exceeding 30.

In an embodiment, in the sub-matrix $H^{2'}_{BGsubi}$ after adjustment, a proportion of the number of "1" elements in first g1 rows increases a2% and/or decreases a2'%, and a proportion of the number of "1" elements in $R^{2}_{subi-g1}$ rows increases a3% and/or decreases a3'%; where a2, a3, a2' and a3' are all positive numbers not exceeding 30, and a2≥a3.

In an embodiment, at least one sub-matrix $H^{1}_{BGsubi}$ in the first base graph is the same as the sub-matrix $H^{3'}_{BGsubi}$ of the third base graph after adjustment;

where a proportion of a number of "1" elements in the sub-matrix $H^{3'}_{BGsubi}$ of the third base graph after adjustment increases b1% and/or decreases b1'% compared with the number of "1" elements in the sub-matrix $H^{3}_{BGsubi}$ before adjustment, where b1 and b1' are positive numbers not exceeding 30.

In an embodiment, in the sub-matrix $H^{3'}_{BGsubi}$ after adjustment, a proportion of the number of "1" elements in first g2 rows increases b2% and/or decreases b2'%, and a proportion of the number of "1" elements in $R^{3}_{subi-g2}$ rows increases b3% and/or decreases b3'%; where b2, b3, b2' and b3' are all positive numbers not exceeding 30, and b2≥b3.

In an embodiment, the second base graph and the third base graph are the base graphs in the following base graphs Hb1 to Hb10.

Where the base graph Hb1 is 1011111101001001000110110000000000000000000000000000000000000000
1100101000110100111111011000000000000000000000000000000000000000
1100100110111111100101101100000000000000000000000000000000000000
0111011011101111011011000110000000000000000000000000000000000000
1111010111010010111000100010000000000000000000000000000000000000
1100000000000000000000100001000000000000000000000000000000000000
1100100000010000000001100000100000000000000000000000000000000000
0100000100000110101100000000001000000000000000000000000000000000
1111010001100000000000000000000100000000000000000000000000000000
1100100000011001000000100000000010000000000000000000000000000000
1100000110000000100011000000000001000000000000000000000000000000
1110010000000000010100000000000000100000000000000000000000000000
1000101001010000000000100000000000010000000000000000000000000000
0100000100000001010000100000000000001000000000000000000000000000
1111000000000000000100001000000000000100000000000000000000000000
1000110001010000000000000000000000000010000000000000000000000000
1100000100000010100000110000000000000001000000000000000000000000
0110000000000000011000000000000000000000100000000000000000000000
1000110000010000000000000010000000000000010000000000000000000000
1100000011000000000001000000000000000000001000000000000000000000
1100000100000010000000000010000000000000000100000000000000000000
0101000000000000100100000000000000000000000010000000000000000000
1110010000000001000000000000000000000000000001000000000000000000
1000100001010100000000000000000000000000000000100000000000000000
0100000100100010000000000000000000000000000000010000000000000000
1000000000001000000100100000000000000000000000001000000000000000
1100000000000000100010000000000000000000000000000100000000000000

-continued

| |
|---|
| 10000010000100000010000000000000000000000000000001000000000000000000 |
| 10100001010000000000000000000000000000000000000000100000000000000000 |
| 11000000000000100001000010000000000000000000000000010000000000000000 |
| 11000000001001000000000000000000000000000000000000001000000000000000 |
| 01001000000000000000000001000000000000000000000000000100000000000000 |
| 10000100000000001100000000000000000000000000000000000010000000000000 |
| 11000001000000000000001000000000000000000000000000000001000000000000 |
| 11000000100000000100000000000000000000000000000000000000100000000000 |
| 11000000000100000001000000100000000000000000000000000000010000000000 |
| 11000000010000010000000000000000000000000000000000000000001000000000 |
| 10000100000000001000000100000000000000000000000000000000000100000000 |
| 01000001000010000000000000000000000000000000000000000000000010000000 |
| 11000010000000000000000001000000000000000000000000000000000001000000 |
| 10010000000000100001000000000000000000000000000000000000000000100000 |
| 10000000001000000000000010000000000000000000000000000000000000010000 |
| 11000000000000000000110000000000000000000000000000000000000000001000 |
| 10000000010000001000000000100000000000000000000000000000000000000100 |
| 01000000001001000000000000000000000000000000000000000000000000000010 |
| 10000100100000000000000000000000000000000000000000000000000000000001 |

the base graph Hb2 is

| |
|---|
| 11011011101111101110111100000000000000000000000000000000000000000000 |
| 11101111111001110111100110000000000000000000000000000000000000000000 |
| 10111101110110111101011011000000000000000000000000000000000000000000 |
| 11110110011111011011111001000000000000000000000000000000000000000000 |
| 11000000000000000000000000100000000000000000000000000000000000000000 |
| 11000000011010000110000000010000000000000000000000000000000000000000 |
| 10001010000101000001100000001000000000000000000000000000000000000000 |
| 11000000111010000100011000000100000000000000000000000000000000000000 |
| 11000010000101000011000010000010000000000000000000000000000000000000 |
| 01000000011010001100100000000001000000000000000000000000000000000000 |
| 11001010000001010010000000000000100000000000000000000000000000000000 |
| 10000100011110000100000100000000010000000000000000000000000000000000 |
| 10001010000001000010001000000000001000000000000000000000000000000000 |
| 11010000000001000010001000000000000100000000000000000000000000000000 |
| 01000011010000000000100000000000000010000000000000000000000000000000 |
| 10000000001001000100010010000000000001000000000000000000000000000000 |
| 11100010000000000000100000000000000000100000000000000000000000000000 |
| 10001000001010100000000000000000000000010000000000000000000000000000 |
| 01000010010001000100000001000000000000001000000000000000000000000000 |
| 10001000001110000000000000000000000000000100000000000000000000000000 |
| 01000010010000000010000100000000000000000010000000000000000000000000 |
| 10011000001001000000000000000000000000000001000000000000000000000000 |
| 11000000010000001000000010000000000000000000100000000000000000000000 |
| 01000000000001010100000000000000000000000000010000000000000000000000 |
| 01000000110010000000000000000000000000000000001000000000000000000000 |
| 10000110000100000000000000000000000000000000000100000000000000000000 |
| 11000000010000000000000110000000000000000000000010000000000000000000 |
| 10000000001100000000000001000000000000000000000001000000000000000000 |
| 11100010001000000000000000000000000000000000000000100000000000000000 |
| 01000001000010000100000000000000000000000000000000010000000000000000 |
| 10000000000001100000000001000000000000000000000000001000000000000000 |
| 10000000110000000001000000000000000000000000000000000100000000000000 |
| 01000010000010000000001000000000000000000000000000000010000000000000 |
| 10010000000000000000000100000000000000000000000000000001000000000000 |
| 01000000001000100000000010000000000000000000000000000000100000000000 |
| 01000000010001001000000000000000000000000000000000000000010000000000 |
| 11010100000000000000000000000000000000000000000000000000001000000000 |
| 10000010001000010000000000000000000000000000000000000000000100000000 |
| 01000000100000000000000001000000000000000000000000000000000010000000 |
| 10000001000000000100000000000000000000000000000000000000000001000000 |
| 11000000000000100000001000000000000000000000000000000000000000100000 |
| 10000010000000000001000100000000000000000000000000000000000000010000 |
| 01001000000000000000010000000000000000000000000000000000000000001000 |
| 01100000000001000000000000000000000000000000000000000000000000000100 |
| 10000100000000000000000010000000000000000000000000000000000000000010 |
| 01000000000001000000000101000000000000000000000000000000000000000001 |

the base graph Hb3 is

| |
|---|
| 11111111110111000001011100000000000000000000000000000000000000000000 |
| 11000100001101111101100110000000000000000000000000000000000000000000 |

-continued

| |
|---|
| 11011111111010011110011011000000000000000000000000000000000000000000 |
| 10111001111111111111111001000000000000000000000000000000000000000000 |
| 11000000000000000010100010100000000000000000000000000000000000000000 |
| 11100001000011000000000010010000000000000000000000000000000000000000 |
| 01100100101000001010100010001000000000000000000000000000000000000000 |
| 11110000100000101000000000000100000000000000000000000000000000000000 |
| 10100000001010001000010011000010000000000000000000000000000000000000 |
| 11001000001010100000000010000001000000000000000000000000000000000000 |
| 10100010001000100100000010000000100000000000000000000000000000000000 |
| 01100010100010000001000000000000010000000000000000000000000000000000 |
| 11000000000010010000001000000000001000000000000000000000000000000000 |
| 10100100100010000000010010000000000100000000000000000000000000000000 |
| 11010000000100001000000000000000000010000000000000000000000000000000 |
| 01100000001000000100000001000000000001000000000000000000000000000000 |
| 11001010000000000000010000000000000000100000000000000000000000000000 |
| 10100000000000010100000100000000000000010000000000000000000000000000 |
| 11000001000001000000000001000000000000001000000000000000000000000000 |
| 01000000100000001000000001000000000000000100000000000000000000000000 |
| 10100000001000000000100001000000000000000010000000000000000000000000 |
| 01010010000001010000001000000000000000000001000000000000000000000000 |
| 01000011000000000010000000000000000000000000100000000000000000000000 |
| 10000100000000010000000001000000000000000000010000000000000000000000 |
| 11000000000000001000000010000000000000000000001000000000000000000000 |
| 10000000100001000000101000000000000000000000000100000000000000000000 |
| 11000000000000000000001100000000000000000000000010000000000000000000 |
| 01000000001000100000000000100000000000000000000001000000000000000000 |
| 11001000000000000000100000000000000000000000000000100000000000000000 |
| 01000010100000000000101000000000000000000000000000010000000000000000 |
| 01000000001000100000000010000000000000000000000000001000000000000000 |
| 10010001000000000000000000000000000000000000000000000100000000000000 |
| 10000000000000000010001001000000000000000000000000000010000000000000 |
| 11000000010010000000000000000000000000000000000000000001000000000000 |
| 01010100000000000100000000000000000000000000000000000000100000000000 |
| 10000001000010000000010000000000000000000000000000000000010000000000 |
| 01000000000001000000001001000000000000000000000000000000001000000000 |
| 10100100000000000000000000000000000000000000000000000000000100000000 |
| 01000010000000000000000100000000000000000000000000000000000010000000 |
| 11001000000001000000000000000000000000000000000000000000000001000000 |
| 01000010000100000000010000000000000000000000000000000000000000100000 |
| 10010000000000000000100000010000000000000000000000000000000000010000 |
| 01000010010000000000000000000000000000000000000000000000000000001000 |
| 10001001000000100100000000000000000000000000000000000000000000000100 |
| 10000100010000000000000000000000000000000000000000000000000000000010 |
| 01000010000000010000000100000000000000000000000000000000000000000001 |

the base graph Hb4 is

| |
|---|
| 11111111111111111111111100000000000000000000000000000000000000000000 |
| 10011111111111101111111110000000000000000000000000000000000000000000 |
| 11000000000000000000001100000000000000000000000000000000000000000000 |
| 01111111101111111111111001000000000000000000000000000000000000000000 |
| 11000010001000011100010100100000000000000000000000000000000000000000 |
| 11100010001000001100010110010000000000000000000000000000000000000000 |
| 10000010001010001001010101001000000000000000000000000000000000000000 |
| 01010011011000100000010110000100000000000000000000000000000000000000 |
| 01010110011000100001000100000010000000000000000000000000000000000000 |
| 11001010000000000100110000000001000000000000000000000000000000000000 |
| 01010010101000100001000000000000100000000000000000000000000000000000 |
| 01000011000000100000100100000000010000000000000000000000000000000000 |
| 11000000000101000110000000000000001000000000000000000000000000000000 |
| 01000010100000100001000000000000000100000000000000000000000000000000 |
| 11000000001100000001000100000000000010000000000000000000000000000000 |
| 11100010100000001000100000000000000001000000000000000000000000000000 |
| 11000010000000000000110000000000000000100000000000000000000000000000 |
| 11000100000000100000100100000000000000010000000000000000000000000000 |
| 01100000000000000100100100000000000000001000000000000000000000000000 |
| 01110000000000100000000000000000000000000100000000000000000000000000 |
| 11000001000000000100000000000000000000000010000000000000000000000000 |
| 11100000001010000000000000000000000000000001000000000000000000000000 |
| 11101000000000000001000000000000000000000000100000000000000000000000 |
| 11100100000000000000100000000000000000000000010000000000000000000000 |
| 11000100000010000010000000000000000000000000001000000000000000000000 |
| 11010000010000000000000100000000000000000000000100000000000000000000 |
| 11000001000000000010010000000000000000000000000010000000000000000000 |
| 11100000001000010000000000000000000000000000000001000000000000000000 |
| 01100000000000000000000010000000000000000000000000100000000000000000 |

-continued

| |
|---|
| 11010000000000001000000100000000000000000000000000010000000000000000 |
| 10101000000000000010000000000000000000000000000000001000000000000000 |
| 01000000000000100000000100000000000000000000000000000100000000000000 |
| 10000000111000000000000000000000000000000000000000000010000000000000 |
| 11000000000010000000001100000000000000000000000000000001000000000000 |
| 01010000001000000000000010000000000000000000000000000000100000000000 |
| 10001100011000000000000000000000000000000000000000000000010000000000 |
| 10000100100000000000000000000000000000000000000000000000001000000000 |
| 11000010000000000010000000000000000000000000000000000000000100000000 |
| 10000001010100000000000000000000000000000000000000000000000010000000 |
| 11000100000000001000000000000000000000000000000000000000000001000000 |
| 10000000010100000010000000000000000000000000000000000000000000100000 |
| 10000001010000000000000000000000000000000000000000000000000000010000 |
| 10100000000000000000000010000000000000000000000000000000000000001000 |
| 10000001010000001000000000000000000000000000000000000000000000000100 |
| 10001100000000000000010000000000000000000000000000000000000000000010 |
| 11100000000000100000010000000000000000000000000000000000000000000001 |

the base graph Hb5 is

| |
|---|
| 011111111111101100000001100000000000000000000000000000000000000000000000 |
| 110111110000000010111100110000000000000000000000000000000000000000000000 |
| 110100001111110001011001011000000000000000000000000000000000000000000000 |
| 100011000001111111101100001100000000000000000000000000000000000000000000 |
| 111000111110011111110101000100000000000000000000000000000000000000000000 |
| 110000000000000000000100000000000000000000000000000000000000000000000000 |
| 111000000010000001000001000010000000000000000000000000000000000000000000 |
| 010001010100010010000001000001000000000000000000000000000000000000000000 |
| 110000101000000010000100000000100000000000000000000000000000000000000000 |
| 100000000010101010001010000000010000000000000000000000000000000000000000 |
| 110100000101000001000000000000001000000000000000000000000000000000000000 |
| 110010000010001000010000100000000100000000000000000000000000000000000000 |
| 010000010100000001000001000010000010000000000000000000000000000000000000 |
| 111000000000001000101000000000000001000000000000000000000000000000000000 |
| 100001010000000100010000000000000000100000000000000000000000000000000000 |
| 010010000000000000000001001000000000010000000000000000000000000000000000 |
| 100000000100000110010000000000000000001000000000000000000000000000000000 |
| 010000100011000000000000000000000000000100000000000000000000000000000000 |
| 100100000000010011000000000000000000000010000000000000000000000000000000 |
| 010000011000000000000001000000000000000001000000000000000000000000000000 |
| 100000000000101001000000000000000000000000100000000000000000000000000000 |
| 010101000100000000000100000000000000000000010000000000000000000000000000 |
| 100000000010000010000100010000000000000000001000000000000000000000000000 |
| 010000000000010000100000100000000000000000000100000000000000000000000000 |
| 100010110000000000000000000000000000000000000010000000000000000000000000 |
| 010100000000000001000000010000000000000000000001000000000000000000000000 |
| 100010000001000000000100000000000000000000000000100000000000000000000000 |
| 010001000000000010000000001000000000000000000000010000000000000000000000 |
| 100000000110100000000000000000000000000000000000001000000000000000000000 |
| 010100011000000000000000000000000000000000000000000100000000000000000000 |
| 101000000000000000001001000000000000000000000000000010000000000000000000 |
| 010000000110000000000000010000000000000000000000000001000000000000000000 |
| 100000100000001000010000000000000000000000000000000000100000000000000000 |
| 010100000000000100010000000000000000000000000000000000010000000000000000 |
| 100000000010000011000000001000000000000000000000000000001000000000000000 |
| 010001001000000000000000000000000000000000000000000000000100000000000000 |
| 100000000000000011000000001000000000000000000000000000000010000000000000 |
| 010000010010100000000000000000000000000000000000000000000001000000000000 |
| 100010000000000000000000001000000000000000000000000000000000100000000000 |
| 010000000000010000000001000000000000000000000000000000000000010000000000 |
| 100000000010000001000000000100000000000000000000000000000000001000000000 |
| 010000010100000000000100010000000000000000000000000000000000000100000000 |
| 100000100000100000000000000000000000000000000000000000000000000010000000 |
| 010000000000000001010000000100000000000000000000000000000000000001000000 |
| 100000000001000000100000010000000000000000000000000000000000000000100000 |
| 010000010000000010000000100000000000000000000000000000000000000000010000 |
| 100000000100000100000000000000000000000000000000000000000000000000001000 |
| 010000001000001000000000000000000000000000000000000000000000000000000100 |
| 101100000000000010000000000000000000000000000000000000000000000000000010 |
| 010001000000000000000001000000000000000000000000000000000000000000000001 |

the base graph Hb6 is

| |
|---|
| 10111011101101111011111100000000000000000000000000000000000000000000 |
| 01001110111111011101110110000000000000000000000000000000000000000000 |
| 11111101110110110111001011000000000000000000000000000000000000000000 |
| 11110111011011101110111001000000000000000000000000000000000000000000 |
| 11000000000000000000000000100000000000000000000000000000000000000000 |
| 11000000011000100000110001110000000000000000000000000000000000000000 |
| 11000010000000000010011000101010000000000000000000000000000000000000 |
| 11001000000100011000000000101001000000000000000000000000000000000000 |
| 10001010000000100000001000100010000000000000000000000000000000000000 |
| 01010000011100000010010000000000010000000000000000000000000000000000 |
| 11001000010100000000010000000000001000000000000000000000000000000000 |
| 00100110101000000000000010100000000100000000000000000000000000000000 |
| 10000010100000000010000010100000000010000000000000000000000000000000 |
| 01110000010000100001000000000000000001000000000000000000000000000000 |
| 01010100010000100010000000000000000000100000000000000000000000000000 |
| 10000010000000010001001000100000000000010000000000000000000000000000 |
| 11000001110000000000000000000000000000001000000000000000000000000000 |
| 00010000001100101000000000000000000000000100000000000000000000000000 |
| 01000010001000000000000011000000000000000010000000000000000000000000 |
| 10000001000000001000010000100000000000000001000000000000000000000000 |
| 01000000000000100001000010100000000000000000100000000000000000000000 |
| 10000000100010000000001001000000000000000000010000000000000000000000 |
| 01000010000000001000100000100000000000000000001000000000000000000000 |
| 10001100000100100000000000000000000000000000000100000000000000000000 |
| 01010000010000000000100100000000000000000000000010000000000000000000 |
| 10000010000001100000000000100000000000000000000001000000000000000000 |
| 10011000000000000100000000000000000000000000000000100000000000000000 |
| 01000010010000010000000000100000000000000000000000010000000000000000 |
| 01000000000000000001000010100000000000000000000000001000000000000000 |
| 10000000000010010000100000000000000000000000000000000100000000000000 |
| 01010000000000000001000000000000000000000000000000000010000000000000 |
| 10000000001000000010010010000000000000000000000000000001000000000000 |
| 00000000000000100000000011100000000000000000000000000000100000000000 |
| 11000000000000000000001100000000000000000000000000000000010000000000 |
| 10000000101000001000000000000000000000000000000000000000001000000000 |
| 01000000000000100000000001100000000000000000000000000000000100000000 |
| 10100100000000000000000000100000000000000000000000000000000010000000 |
| 01000000100000000000001010000000000000000000000000000000000001000000 |
| 10000000000000000000000100100000000000000000000000000000000000100000 |
| 01100000001000000010000000000000000000000000000000000000000000010000 |
| 01000001000000010000000000000000000000000000000000000000000000001000 |
| 10001000000000000000001010000000000000000000000000000000000000000100 |
| 01001000000000000000001000000000000000000000000000000000000000000010 |
| 10000000000100000100100000000000000000000000000000000000000000000001 |
| 01000100000000000000010000000000000000000000000000000000000000000000 |
| 10000010000000000000001001000000000000000000000000000000000000000000 |

the base graph Hb7 is

| |
|---|
| 01111111101110111010111100000000000000000000000000000000000000000000 |
| 11100111011101110101110110000000000000000000000000000000000000000000 |
| 11111000111111011111001011000000000000000000000000000000000000000000 |
| 10011111110011101111111001000000000000000000000000000000000000000000 |
| 11000000000000000000000000100000000000000000000000000000000000000000 |
| 11100100000001010000101010010000000000000000000000000000000000000000 |
| 10101001001100010000010000001000000000000000000000000000000000000000 |
| 11000100001000101100001000000100000000000000000000000000000000000000 |
| 01000001000100011000000010000010000000000000000000000000000000000000 |
| 11100000100000000001011000000001000000000000000000000000000000000000 |
| 01000100011000110000001000000000100000000000000000000000000000000000 |
| 01100000000100101010000100000000010000000000000000000000000000000000 |
| 11000000001001011000001000000000001000000000000000000000000000000000 |
| 10100000000010100000010000000000000100000000000000000000000000000000 |
| 01000000101100000000000010000000000010000000000000000000000000000000 |
| 11100000000000011000001011000000000001000000000000000000000000000000 |
| 10001100000000100000000010000000000000100000000000000000000000000000 |
| 01000000100000011010011000000000000000010000000000000000000000000000 |
| 01010000000000100000001000000000000000001000000000000000000000000000 |
| 01100000001000110010000000000000000000000100000000000000000000000000 |
| 10000010001000000000001000000000000000000010000000000000000000000000 |
| 01100000000000001000000001000000000000000001000000000000000000000000 |
| 01000000010000101010010000000000000000000000100000000000000000000000 |
| 01100000000000011000010100000000000000000000010000000000000000000000 |
| 01110000000000110000000100000000000000000000001000000000000000000000 |
| 01000000000010101000001000000000000000000000000100000000000000000000 |
| 01000000001000001001000000000000000000000000000010000000000000000000 |

-continued 01000001001000000000000000100000000000000000000001000000000000000000
10000000000000100000100000000000000000000000000000100000000000000000
01010010000000111000000000000000000000000000000000010000000000000000
01101000000000000000010000000000000000000000000000001000000000000000
01000000010000001000000010000000000000000000000000000100000000000000
10100000000001000000000000000000000000000000000000000010000000000000
01000000000000000000001100000000000000000000000000000001000000000000
01000000100000100001000010000000000000000000000000000000100000000000
01100000000001010001000010000000000000000000000000000000010000000000
01000010000100000000001000000000000000000000000000000000001000000000
01101000000001000000000000000000000000000000000000000000000100000000
01000000100000000010000000000000000000000000000000000000000010000000
01000001000010101000000000000000000000000000000000000000000001000000
10000100000000000000000000000000000000000000000000000000000000100000
01010000000000001000000000000000000000000000000000000000000000010000
00110000000100000100000010000000000000000000000000000000000000001000
01000010000000000000001001000000000000000000000000000000000000000100
01000000000000001000010000000000000000000000000000000000000000000010
01000000000101100000000000000000000000000000000000000000000000000001 the base graph Hb8 is 1010010101110000000000000000000000000000000000000000
1100000100011000000000000000000000000000000000000000
1100001001001100000000000000000000000000000000000000
0111111010100110000000000000000000000000000000000000
1010111110000011000000000000000000000000000000000000
1101000011000001100000000000000000000000000000000000
1101100000100000100000000000000000000000000000000000
0100001010000000010000000000000000000000000000000000
1000010001100000001000000000000000000000000000000000
1110100000000000000100000000000000000000000000000000
1001000100000000000010000000000000000000000000000000
1100001010000000000001000000000000000000000000000000
1100100001000000000000100000000000000000000000000000
0101000000100000000000010000000000000000000000000000
1100000000000010000000001000000000000000000000000000
1000100001010000000000000100000000000000000000000000
1000001000100000000000000010000000000000000000000000
0100000001000010000000000001000000000000000000000000
1010000100000000000000000000100000000000000000000000
1001000010010000000000000000010000000000000000000000
1100010000000000000000000000001000000000000000000000
1000100000000010000000000000000100000000000000000000
0100000000000001000000000000000010000000000000000000
1000001100000000000000000000000001000000000000000000
1000000000010001000000000000000000100000000000000000
1000000100100000000000000000000000010000000000000000
1000000000010010000000000000000000001000000000000000
0100000100000001000000000000000000000100000000000000
1000100001000000000000000000000000000010000000000000
1000000000000000100000000000000000000001000000000000
0000000100010010000000000000000000000000100000000000
0100000010000000000000000000000000000000010000000000
0000000100010001000000000000000000000000001000000000
1010000000000000000000000000000000000000000100000000
0001001000000001000000000000000000000000000010000000
0100010000000000000000000000000000000000000001000000
0000000100010010000000000000000000000000000000100000
1000100000000000000000000000000000000000000000010000
0000001000000011000000000000000000000000000000001000
0000000101010000000000000000000000000000000000000100
0100000000100000000000000000000000000000000000000010
0001000010010000000000000000000000000000000000000001 the base graph Hb9 is 1011011100110000000000000000000000000000000000000000
0100101110011000000000000000000000000000000000000000
1011010001001100000000000000000000000000000000000000
0100101010100110000000000000000000000000000000000000
1111000101000011000000000000000000000000000000000000
1100110011100001000000000000000000000000000000000000

-continued 1100000000000000100000000000000000000000000000000000
1100110000100000010000000000000000000000000000000000
0100111000000000001000000000000000000000000000000000
1000110001000000000100000000000000000000000000000000
1001010000000100000010000000000000000000000000000000
1100100000000100000001000000000000000000000000000000
0101001000000010000000100000000000000000000000000000
1000000011000000100000010000000000000000000000000000
1100000100000000000000001000000000000000000000000000
0110010000000000000000000100000000000000000000000000
1001100000000000000000000010000000000000000000000000
1001010000000001000000000001000000000000000000000000
1000001000000000000000000000100000000000000000000000
1011000000000000000000000000010000000000000000000000
1000000010000100000000000000001000000000000000000000
1000010001100000000000000000000100000000000000000000
1001000001000100000000000000000010000000000000000000
0100000100000000000000000000000001000000000000000000
1010000001000000000000000000000000100000000000000000
1000000000000110000000000000000000010000000000000000
1010010000000000000000000000000000001000000000000000
1000000000001100000000000000000000000100000000000000
1000000000100100000000000000000000000010000000000000
0100100000000000000000000000000000000001000000000000
1000000001010000000000000000000000000000100000000000
1000000001000010000000000000000000000000010000000000
1001010000000000000000000000000000000000001000000000
1000000000000101000000000000000000000000000100000000
1000000100000100000000000000000000000000000010000000
1000001000000100000000000000000000000000000001000000
1000000001010000000000000000000000000000000000100000
1000000010000100000000000000000000000000000000010000
1010100000000000000000000000000000000000000000001000
1010000000000100000000000000000000000000000000000100 the base graph Hb10 is 1101001001110000000000000000000000000000000000000000
1010111111011000000000000000000000000000000000000000
1110100010101100000000000000000000000000000000000000
0101111111100100000000000000000000000000000000000000
1110000000110100000000000000000000000000000000000000
1000010100010001000000000000000000000000000000000000
1100000100010000100000000000000000000000000000000000
1100110000000000010000000000000000000000000000000000
0100000001011000001000000000000000000000000000000000
1110000100000000000100000000000000000000000000000000
0100010100100000000010000000000000000000000000000000
1000000000101000000001000000000000000000000000000000
0110000101000000000000100000000000000000000000000000
0100000010011000000000010000000000000000000000000000
1000001000000100000000001000000000000000000000000000

-continued

| |
|---|
| 0110010100000000000000000100000000000000000000000000 |
| 0110010000010000000000000010000000000000000000000000 |
| 0101000000010000000000000001000000000000000000000000 |
| 1100001000000000000000000000100000000000000000000000 |
| 1100000000000100000000000000010000000000000000000000 |
| 0100001000010000000000000000001000000000000000000000 |
| 0100000000101000000000000000000100000000000000000000 |
| 1000100000000000000000000000000010000000000000000000 |
| 0100000000001100000000000000000001000000000000000000 |
| 0100000010001000000000000000000000100000000000000000 |
| 0100000001010100000000000000000000010000000000000000 |
| 0101000000010000000000000000000000001000000000000000 |
| 0001000000011000000000000000000000000100000000000000 |
| 0110010000000000000000000000000000000010000000000000 |
| 0100000000010100000000000000000000000001000000000000 |

-continued

| |
|---|
| 0110100000000000000000000000000000000000100000000000 |
| 0101000010000000000000000000000000000000010000000000 |
| 0111000000000000000000000000000000000000001000000000 |
| 0100010000001000000000000000000000000000000100000000 |
| 0000000100110000000000000000000000000000000010000000 |
| 0100000000100000000000000000000000000000000001000000 |
| 0000010000110000000000000000000000000000000000100000 |
| 0000000010011000000000000000000000000000000000010000 |
| 0010000100001000000000000000000000000000000000001000 |
| 0100010000000100000000000000000000000000000000000100 |
| 0000001000011000000000000000000000000000000000000010 |
| 0100000000000100000000000000000000000000000000000001 |

the base graph Hb11 is 1 0 1 1 1 1 1 1 0 1 0 0 1 0 0 1 0 0 0 1 1 0 0 1 1 0 0 0 0 0 0 0 0 0 0 0 0 0 0 0 0 0 0 0 0 0 0 0 0 0 0 0 0 0 0 0 0 0 0 0 0 0 0 0 0
0 0 0
1 1 0 0 1 0 1 0 0 0 1 1 0 1 0 0 1 1 1 1 1 1 0 0 1 1 0 0 0 0 0 0 0 0 0 0 0 0 0 0 0 0 0 0 0 0 0 0 0 0 0 0 0 0 0 0 0 0 0 0 0 0 0 0 0
0 0 0
1 1 0 0 1 0 0 1 1 0 1 1 1 1 1 1 1 0 0 1 0 1 0 1 0 1 1 0 0 0 0 0 0 0 0 0 0 0 0 0 0 0 0 0 0 0 0 0 0 0 0 0 0 0 0 0 0 0 0 0 0 0 0 0 0
0 0 0
0 1 1 1 0 1 1 0 1 1 1 0 1 1 1 1 0 1 1 0 1 1 0 0 0 0 1 1 0 0 0 0 0 0 0 0 0 0 0 0 0 0 0 0 0 0 0 0 0 0 0 0 0 0 0 0 0 0 0 0 0 0 0 0 0
0 0 0
1 1 1 1 0 1 0 1 1 1 0 1 0 0 1 0 1 1 1 0 0 0 0 1 0 0 0 1 0 0 0 0 0 0 0 0 0 0 0 0 0 0 0 0 0 0 0 0 0 0 0 0 0 0 0 0 0 0 0 0 0 0 0 0 0
0 0 0
1 1 0 0 0 0 0 0 0 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0
0 0 0
1 1 0 0 1 0 0 0 0 0 0 1 0 0 0 0 0 0 0 0 0 1 1 0 0 0 0 0 1 0 0 0 0 0 0 0 0 0 0 0 0 0 0 0 0 0 0 0 0 0 0 0 0 0 0 0 0 0 0 0 0 0 0 0 0
0 0 0
0 1 0 0 0 0 0 1 0 0 0 0 0 1 1 0 1 0 1 1 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0
0 0 0
1 1 1 1 0 1 0 0 0 1 1 0 0 0 0 0 0 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0 0 0 0
0 0 0
1 1 0 0 1 0 0 0 0 0 0 1 1 0 0 1 0 0 0 0 0 0 1 0 0 0 0 0 0 0 0 1 0 0 0 0 0 0 0 0 0 0 0 0 0 0 0 0 0 0 0 0 0 0 0 0 0 0 0 0 0 0 0 0 0
0 0 0
1 1 0 0 0 0 1 1 0 0 0 0 0 0 0 0 1 0 0 0 1 1 0 0 0 0 0 0 0 0 0 0 1 0 0 0 0 0 0 0 0 0 0 0 0 0 0 0 0 0 0 0 0 0 0 0 0 0 0 0 0 0 0 0 0
0 0 0
1 1 1 0 0 1 0 0 0 0 0 0 0 0 0 0 0 1 0 1 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0
0 0 0
1 0 0 0 1 0 1 0 0 1 0 1 0 0 0 0 0 0 0 0 0 0 1 0 0 0 0 0 0 0 0 0 0 0 1 0 0 0 0 0 0 0 0 0 0 0 0 0 0 0 0 0 0 0 0 0 0 0 0 0 0 0 0 0 0
0 0 0
0 1 0 0 0 0 1 0 0 0 0 0 0 0 1 0 1 0 0 0 0 1 0 0 0 0 0 0 0 0 0 0 0 0 0 1 0 0 0 0 0 0 0 0 0 0 0 0 0 0 0 0 0 0 0 0 0 0 0 0 0 0 0 0 0
0 0 0
1 1 1 1 0 0 0 0 0 0 0 0 0 0 0 0 0 0 0 1 0 0 0 0 1 0 0 0 0 0 0 0 0 0 0 0 1 0 0 0 0 0 0 0 0 0 0 0 0 0 0 0 0 0 0 0 0 0 0 0 0 0 0 0 0
0 0 0
1 0 0 0 1 1 0 0 0 1 0 1 0 0 0 0 0 0 0 0 0 0 0 0 0 0 0 0 0 0 0 0 0 0 0 0 0 1 0 0 0 0 0 0 0 0 0 0 0 0 0 0 0 0 0 0 0 0 0 0 0 0 0 0 0
0 0 0
1 1 0 0 0 0 0 1 0 0 0 0 0 0 1 0 1 0 0 0 0 0 1 1 0 0 0 0 0 0 0 0 0 0 0 0 0 0 1 0 0 0 0 0 0 0 0 0 0 0 0 0 0 0 0 0 0 0 0 0 0 0 0 0 0
0 0 0
0 1 1 0 0 0 0 0 0 0 0 0 0 0 0 0 0 0 1 1 0 0 0 0 0 0 0 0 0 0 0 0 0 0 0 0 0 0 0 1 0 0 0 0 0 0 0 0 0 0 0 0 0 0 0 0 0 0 0 0 0 0 0 0 0
0 0 0
1 0 0 0 1 1 0 0 0 0 0 1 0 0 0 0 0 0 0 0 0 0 0 0 0 1 0 0 0 0 0 0 0 0 0 0 0 0 0 0 1 0 0 0 0 0 0 0 0 0 0 0 0 0 0 0 0 0 0 0 0 0 0 0 0
0 0 0
1 1 0 0 0 0 0 0 1 1 0 0 0 0 0 0 0 0 0 0 0 1 0 0 0 0 0 0 0 0 0 0 0 0 0 0 0 0 0 0 0 1 0 0 0 0 0 0 0 0 0 0 0 0 0 0 0 0 0 0 0 0 0 0 0
0 0 0
1 1 0 0 0 0 0 1 0 0 0 0 0 0 1 0 0 0 0 0 0 0 0 0 0 0 1 0 0 0 0 0 0 0 0 0 0 0 0 0 0 0 1 0 0 0 0 0 0 0 0 0 0 0 0 0 0 0 0 0 0 0 0 0 0
0 0 0
0 1 0 1 0 0 0 0 0 0 0 0 0 0 0 0 1 0 0 1 0 0 0 0 0 0 0 0 0 0 0 0 0 0 0 0 0 0 0 0 0 0 0 1 0 0 0 0 0 0 0 0 0 0 0 0 0 0 0 0 0 0 0 0 0
0 0 0
1 1 1 0 0 1 0 0 0 0 0 0 0 0 0 1 0 0 0 0 0 0 0 0 0 0 0 0 0 0 0 0 0 0 0 0 0 0 0 0 0 0 0 0 1 0 0 0 0 0 0 0 0 0 0 0 0 0 0 0 0 0 0 0 0
0 0 0
1 0 0 0 1 0 0 0 0 1 0 1 0 1 0 0 0 0 0 0 0 0 0 0 0 0 0 0 0 0 0 0 0 0 0 0 0 0 0 0 0 0 0 0 0 1 0 0 0 0 0 0 0 0 0 0 0 0 0 0 0 0 0 0 0
0 0 0
0 1 0 0 0 0 0 1 0 0 1 0 0 0 1 0 0 0 0 0 0 0 0 0 0 0 0 0 0 0 0 0 0 0 0 0 0 0 0 0 0 0 0 0 0 0 1 0 0 0 0 0 0 0 0 0 0 0 0 0 0 0 0 0 0
0 0 0
1 0 0 0 0 0 0 0 0 0 0 0 1 0 0 0 0 0 0 1 0 0 1 0 0 0 0 0 0 0 0 0 0 0 0 0 0 0 0 0 0 0 0 0 0 0 0 1 0 0 0 0 0 0 0 0 0 0 0 0 0 0 0 0 0
0 0 0
1 1 0 0 0 0 0 0 0 0 0 0 0 0 0 0 1 0 0 0 1 0 0 0 0 0 0 0 0 0 0 0 0 0 0 0 0 0 0 0 0 0 0 0 0 0 0 0 1 0 0 0 0 0 0 0 0 0 0 0 0 0 0 0 0
0 0 0
1 0 0 0 0 0 1 0 0 0 0 1 0 0 0 0 0 1 0 0 0 0 0 0 0 0 0 0 0 0 0 0 0 0 0 0 0 0 0 0 0 0 0 0 0 0 0 0 0 1 0 0 0 0 0 0 0 0 0 0 0 0 0 0 0
0 0 0
1 0 1 0 0 0 0 1 0 1 0 0 0 0 0 0 0 0 0 0 0 0 0 0 0 0 0 0 0 0 0 0 0 0 0 0 0 0 0 0 0 0 0 0 0 0 0 0 0 0 1 0 0 0 0 0 0 0 0 0 0 0 0 0 0
0 0 0
1 1 0 0 0 0 0 0 0 0 0 0 0 0 1 0 0 0 0 1 0 0 0 0 1 0 0 0 0 0 0 0 0 0 0 0 0 0 0 0 0 0 0 0 0 0 0 0 0 0 0 1 0 0 0 0 0 0 0 0 0 0 0 0 0
0 0 0
1 1 0 0 0 0 0 0 0 0 1 0 0 1 0 0 0 0 0 0 0 0 0 0 0 0 0 0 0 0 0 0 0 0 0 0 0 0 0 0 0 0 0 0 0 0 0 0 0 0 0 0 1 0 0 0 0 0 0 0 0 0 0 0 0
0 0 0
0 1 0 0 1 0 0 0 0 0 0 0 0 0 0 0 0 0 0 0 0 0 0 0 0 1 0 0 0 0 0 0 0 0 0 0 0 0 0 0 0 0 0 0 0 0 0 0 0 0 0 0 0 1 0 0 0 0 0 0 0 0 0 0 0
0 0 0
1 0 0 0 0 1 0 0 0 0 0 0 0 0 0 0 1 1 0 0 0 0 0 0 0 0 0 0 0 0 0 0 0 0 0 0 0 0 0 0 0 0 0 0 0 0 0 0 0 0 0 0 0 0 1 0 0 0 0 0 0 0 0 0 0
0 0 0

-continued 1 1 0 0 0 0 0 1 0 0 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0 1 0 0 0 0 0 0 0 0 0
0 0 0
1 1 0 0 0 0 0 0 1 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 1 0 0 0 0 0 0 0 0
0 0 0
1 1 0 0 0 0 0 0 0 0 0 1 0 0 0 0 0 0 0 1 0 0 0 0 0 0 1 0 0 0 0 0 0 0 0 0 0 0 0 0 0 0 0 0 0 0 0 0 0 0 0 0 0 0 0 0 0 1 0 0 0 0 0 0 0
0 0 0
1 1 0 0 0 0 0 0 0 1 0 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 1 0 0 0 0 0 0
0 0 0
1 0 0 0 0 1 0 0 0 0 0 0 0 0 0 0 1 0 0 0 0 0 0 1 0 0 0 0 0 0 0 0 0 0 0 0 0 0 0 0 0 0 0 0 0 0 0 0 0 0 0 0 0 0 0 0 0 0 0 1 0 0 0 0 0
0 0 0
0 1 0 0 0 0 0 1 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 1 0 0 0 0
0 0 0
1 1 0 0 0 0 1 0 0 0 0 0 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 1 0 0 0
0 0 0
1 0 0 1 0 0 0 0 0 0 0 0 0 0 1 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 1 0 0
0 0 0
1 0 0 0 0 0 0 0 0 0 0 1 0 0 0 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0 1 0
0 0 0
1 1 0 0 0 0 0 0 0 0 0 0 0 0 0 0 0 0 0 0 1 1 0 0 0 0 0 0 0 0 0 0 0 0 0 0 0 0 0 0 0 0 0 0 0 0 0 0 0 0 0 0 0 0 0 0 0 0 0 0 0 0 0 0 1
0 0 0
1 0 0 0 0 0 0 0 0 1 0 0 0 0 0 0 1 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0
1 0 0
0 1 0 0 0 0 0 0 0 0 1 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0
0 1 0
1 0 0 0 0 1 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0
0 0 1.

In an embodiment, the second base graph and the third base graph are obtained by adjusting the base graphs of the following base graphs Hb1 to Hb11.

A proportion of the number of "1" elements in the base graph after adjustment increases c % and/or decreases c' % compared with the base graph before adjustment, where c and c' are non-negative real numbers, and c≤5, c'≤5.

Embodiment Four

Figure 13:
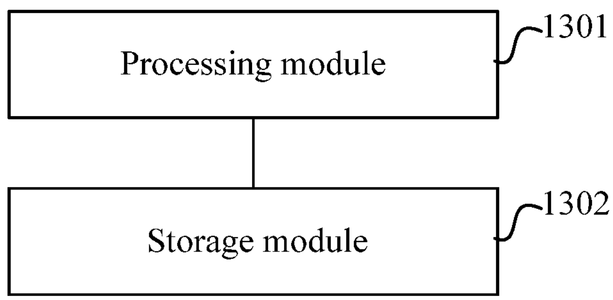
FIG. 13 is a schematic diagram of a processing device for quasi-cyclic LDPC coding according to embodiment three of the present disclosure.

As shown in FIG. 13, embodiment four of the present disclosure further provides a processing device for quasi-cyclic LDPC coding. The device includes:

- a processing module 1301, which is configured to determine, according to a data feature of an information bit sequence to be encoded, a processing strategy for the quasi-cyclic LDPC coding and perform, according to the processing strategy and based on a base matrix and a lifting size, the quasi-cyclic LDPC coding and rate matching output on the information bit sequence; and
- a storage module 1302, which is configured to store the base matrix and the lifting size.

In an embodiment, a data feature includes at least one of:

an operation mode corresponding to the information bit sequence, an application scenario corresponding to the information bit sequence, a link direction corresponding to the information bit sequence, a UE category, length information of the information bit sequence, a modulation and coding scheme (MCS) index of the information bit sequence, an aggregation level of a control channel unit (CCE) of the information bit sequence, a search space corresponding to the information bit sequence, a scrambling mode of the information bit sequence, a cyclic redundancy check (CRC) format of the information bit sequence, a channel type of the information bit sequence, a control information format corresponding to the information bit sequence, a channel state information (CSI) process corresponding to the information bit sequence, a subframe index of the information bit sequence, a carrier frequency corresponding to the information bit sequence, a release version of the information bit sequence, a coverage range of the information bit sequence, a length of a rate matching output sequence obtained by performing the quasi-cyclic LDPC coding and a bit selection on the information bit sequence, a code rate of a rate matching output sequence, a combination of a code rate of a rate matching output sequence and a length of the rate matching output sequence, a combination of a code rate of a rate matching output sequence and a length of the information bit sequence, or a hybrid automatic retransmission request (HARQ) data transmission version number of the information bit sequence.

In an embodiment, a processing module is configured to determine the processing strategy for the quasi-cyclic LDPC coding by adopting the following manner:

determining at least one of:

a structure of a core matrix check block of a base matrix; orthogonality of the base matrix;

characteristics of the base matrix; a maximum number of systematic columns of the base matrix; a maximum number of systematic columns of the quasi-cyclic LDPC coding; a number of base matrices; an element modifying method of the base matrix; a number of edges of the base matrix; a minimum code rate of the base matrix at a maximum length of the information bit sequence; a minimum code rate of the base matrix at a shortened coding; a pattern of selecting a lifting size; a pattern of selecting a granularity of the lifting size; a maximum value of the lifting size; a number of systematic columns not to be transmitted of a rate matching output sequence obtained by performing the quasi-cyclic LDPC coding and a bit selection on the information bit sequence; a check column puncturing method of a rate matching output sequence; an interleaving method of a rate matching output sequence; a starting bit position of a bit selection of a rate matching output sequence; a maximum information length supported by the quasi-cyclic LDPC coding; a pattern of selecting an information bit length supported by the quasi-cyclic LDPC coding; a pattern of selecting a granularity of an information bit length supported by the quasi-cyclic LDPC coding; a maximum number of columns of a shortened coding of the quasi-cyclic LDPC coding; a HARQ combination mode of the quasi-cyclic LDPC coding; a bit selection starting position of a rate matching output sequence; a maximum number of HARQ transmissions of the quasi-cyclic LDPC coding; or a number of HARQ transmission versions of the quasi-cyclic LDPC coding.

In an embodiment, the operation mode includes an in-band operation mode, an out-band operation mode, or a standalone operation mode;

an application scenario includes: an enhanced mobile broadband (eMBB) scenario, a ultra-reliable low-latency communication (URLLC) scenario, or a massive machine type communication (mMTC) scenario; or a link direction includes: an uplink data direction or a downlink data direction.

In an embodiment, the length information of the information bit sequence includes: length information greater than a positive integer value K0 or length information less than or equal to a positive integer value K0, where K0 is an integer greater than 128.

In an embodiment, the base matrix Hb is $$Hb = \begin{bmatrix} A & B & C \\ & D & E \end{bmatrix};$$

where a matrix A formed by a sub-matrix B and a sub-matrix [A B] is a core matrix of the base matrix, and the sub-matrix B is the core matrix check block;

the structure of the core matrix check block is selected from at least two structure types of the following: a lower-triangular structure, a double diagonal structure or a quasi-double-diagonal structure;

a matrix of the lower-triangular structure includes the following three features a)-c): a) elements with a row index i and a column index j in the matrix are equal to −1, and j>i; b) all elements on diagonal lines in the matrix are non-−1 elements; and c) all elements under the diagonal lines in the matrix at least have one non-−1 element;

a matrix of the double diagonal structure includes the following two features a)-b): a) a first column in the matrix includes three non-−1 elements, where a first element and an end element of the first column are non-−1 elements; and b) elements with a column index number i and a row index number (i−1) and elements with a column index number i and a row index number I in the matrix are non-−1 elements, i=1, 2, . . . , (I0−1), where I0 is a number of rows of the matrix;

a matrix of the quasi-double-diagonal structure includes any one of the following features: a) elements indicated by a row index number (mb0−1) and a column index number 0 in the matrix are non-−1 elements, and a sub-matrix formed by (mb0−1) rows and (mb0−1) columns in an upper right corner in the matrix is the double-diagonal structure; b) elements indicated by a row index number (mb0−1) and a column index number (mb0−1) in the matrix are non-−1 elements, and a sub-matrix formed by (mb0−1) rows and (mb0−1) columns in an upper left corner in the matrix is the double-diagonal structure; c) elements indicated by a row index number 0 and a column index number 0 in the matrix are non-−1 elements, and a sub-matrix formed by (mb0−1) rows and (mb0−1) columns in a lower right corner in the matrix is the double-diagonal structure; where mb0 is a number of rows of the matrix.

In an embodiment, the base matrix Hb is $$Hb = \begin{bmatrix} A & B & C \\ & D & E \end{bmatrix};$$

where a number of columns of a sub-matrix D is less than or equal to a number of columns of a core matrix A formed of a sub-matrix B and a sub-matrix [A B], the orthogonality of the base matrix is orthogonality of the sub-matrix D, the orthogonality of the base matrix is selected from at least two types of the following: orthogonal property, quasi-orthogonal property and non-orthogonal property; and where the orthogonal property includes that: there is no intersection set among row index number sets RowSETi (i=0, 1, . . . , (I−1)), a union set of all row index number sets RowSETi (i=0, 1, . . . , (I−1)) forms all row index numbers of the sub-matrix D, and in the sub-matrix D, a sub-matrix Di formed by all rows indicated by a row index number set RowSETi has at most one non-−1 element in all elements indicated by any one column index number; where I is a positive integer less than a number of rows of the sub-matrix D, RowSETi (i=0, 1, . . . , (I−1)) includes at least two elements;

the quasi-orthogonal-property includes: two column index number set ColSET0 and ColSET1, where ColSET0 and ColSET1 have no intersection set and a union set of ColSET0 and ColSET1 forms all column index numbers of the sub-matrix D, a sub-matrix formed by all columns indicated by the column index number set ColSET0 in the sub-matrix D is D0, a sub-matrix formed by all columns indicated by the column index number set ColSET1 in the sub-matrix D is D1, and D1 has the orthogonal property while D0 does not have the orthogonal property;

the non-orthogonal-property includes that: the sub-matrix D does not have the orthogonal property and the non-orthogonal property.

In an embodiment, the maximum number of systematic columns of the base matrix is selected from at least two integer values of 2 to 32.

In an embodiment, the maximum number of systematic columns of the base matrix is selected from at least two integer values of: 4, 6, 8, 10, 16, 24, 30 or 32.

In an embodiment, the number of base matrices is selected from at least two integer values of: 1, 2, 3 or 4.

In an embodiment, the element modifying method of the base matrix is selected from at least two method of the following:

method one: calculating elements $P_{i,j}$ of the base matrix according to the following formula:

$$P_{i,j} = \begin{cases} -1 & V_{i,j} = -1 \\ \lfloor V_{i,j} \times Z / Z_{max} \rfloor & V_{i,j} \neq -1 \end{cases};$$

method two: calculating elements $P_{i,j}$ of the base matrix according to the following formula:

$$P_{i,j} = \begin{cases} V_{i,j} & V_{i,j} < Z \\ \lfloor V_{i,j} / 2^t \rfloor & V_{i,j} \geq Z \end{cases};$$

method three: calculating elements $P_{i,j}$ of the base matrix according to the following formula:

$$P_{i,j}=\begin{cases} V_{i,j} & V_{i,j}<1 \\ \lfloor((V_{i,j}+w) \bmod Z_{max})\times Z/Z_{max}\rfloor & V_{i,j}\geq 1\end{cases};$$

method four: obtaining elements of the base matrix according to the following processing manner in which:

each non-−1 element position of the base matrix have L-bit bit sequence, all lifting sizes form H groups of lifting size sets; in response to determining that Z belongs to a k-th group of the lifting size sets, for the base matrix of the k-th group of the lifting size sets, an element value corresponding to the non-−1 position is: selecting k bits, a 2k-th bit and a (2k−1)-th bit from the left of the L-bit bit sequence corresponding to the non-−1 element position to form a (k+2)-bit bit sequence, a value corresponding to the (k+2)-bit bit sequence is the element value of the corresponding non-−1 element position in the base matrix corresponding to the lifting size Z;

method five: calculating elements $P_{i,j}$ of the base matrix according to the following formula:

$$P_{i,j}=\begin{cases} -1 & V_{i,j}=-1 \\ V_{i,j} \bmod 2^s & V_{i,j}\neq -1\end{cases};$$

method six: calculating elements $P_{i,j}$ of the base matrix according to the following formula:

$$P_{i,j}=\begin{cases} -1 & V_{i,j}=-1 \\ (V_{i,j}+w) \bmod 2^s & V_{i,j}\neq -1\end{cases};$$

method seven: calculating elements $P_{i,j}$ of the base matrix according to the following formula:

$$P_{i,j}=\begin{cases} -1 & V_{i,j}=-1 \\ V_{i,j} \bmod Z & V_{i,j}\neq -1\end{cases};$$

method eight: calculating elements $P_{i,j}$ of the base matrix according to the following formula:

$$P_{i,j}=\begin{cases} -1 & V_{i,j}=-1 \\ V_{i,j} \bmod w & V_{i,j}\neq -1\end{cases};$$

method nine: calculating elements $P_{i,j}$ of the base matrix according to the following formula:

$$P_{i,j}=\begin{cases} (V_{i,j}+\lfloor 256\times w/V_{i,j}\rfloor) \bmod Z & V_{i,j}>0 \\ V_{i,j} & V_{i,j}\leq 0\end{cases};$$

method ten: calculating elements $P_{i,j}$ of the base matrix according to the following formula:

$$P_{i,j}=V_{i,j} \bmod z_{prime};$$

method eleven: calculating elements $P_{i,j}$ of the base matrix according to the following formula:

$$P_{i,j}=\begin{cases} V_{i,j} & V_{i,j}<1 \\ \lfloor(V_{i,j}+w \bmod Z_{max})\times Z/Z_{max}\rfloor & V_{i,j}\geq 1\end{cases};$$

or method twelve: calculating elements $P_{i,j}$ of the base matrix according to the following formula:

$$P_{i,j}=\begin{cases} (i\times j) \bmod Z_{prime} & 1\leq i\leq 38 \\ ((Z-i+38)\times j) \bmod Z_{prime} & 39\leq i\leq 49\end{cases};$$

where $V_{i,j}$ is a value of an element in an i-th row and a j-th column of the base matrix corresponding to $Z_{max}$, $P_{i,j}$ is a value of an element in an i-th row and a j-th column of the base matrix corresponding to Z, Z is a lifting size of the quasi-cyclic LDPC coding, $Z_{max}$ is an integer greater than 0, and Z is a positive integer less than or equal to $Z_{max}$;

t is $t=\lceil Z_{max}/Z\rceil$;

s is a maximum integer so as to satisfy 2'≤Z;

w is a determined integer value corresponding to the rise value Z; $z_{prime}$ is a maximum prime less than or equal to Z.

In an embodiment, the minimum code rate of the base matrix at the maximum length of the information bit sequence is selected from at least two real number values greater than 0 and less than 1.

In an embodiment, the minimum code rate of the base matrix at the maximum length of the information bit sequence is selected from at least two code rate types of: 1/12, 1/8, 1/6, 1/5, 1/4, 1/3, 1/2 or 2/3.

In an embodiment, the minimum code rate of the base matrix at the shortened coding is selected from at least two real number values greater than 0 and less than 1.

In an embodiment, where the minimum code rate of the base matrix at the shortened coding is selected from at least two code rate types of: 1/12, 1/8, 1/6, 1/5, 1/4 or 1/3.

In an embodiment, a pattern of selecting a lifting size is selected from at least two method of the following:

Method One:

the lifting size is a product of d powers of 2 multiplied by a positive integer c; where c is an element in a positive integer set C, and d is a positive integer and an element in an non-negative integer set D;

Method Two:

lifting sizes are continuous integers taken from Zmin to Zmax;

where Zmin and Zmax are integers greater than 0, and Zmax is greater than Zmin;

Method Three:

a difference between magnitude-adjacent lifting sizes is equal to an integer power of 2;

where all lifting sizes constitute a set Zset, and the set Zset includes multiple subsets, and a difference between any two magnitude-adjacent lifting sizes in the subsets is equal to a non-negative integer power of 2;

Method Four:

determining the lifting size by a length of the information bit sequence and a number of systematic columns of the base matrix;

Method Five:

determining the lifting size by a length of the information bit sequence, a number of systematic columns of the base matrix and an integer set W; or Method Six:

the lifting size is equal to a positive integer power of 2.

In an embodiment, in the method one, the set C and the set D includes one of the following set pairs: C={4,5,6,7} and D={1, 2, 3, 4, 5, 6, 7}; C={4, 5, 6, 7} and D={0, 1, 2, 3, 4, 5, 6, 7}; C={3, 4, 5, 6, 7, 8} and D={0, 1, 2, 3, 4, 5, 6}; C={4, 5, 6, 7} and D={0, 1, 2, 3, 4, 5, 6, 7}; C={16, 20, 24, 28} and D={0, 1, 2, 3, 4, 5}; C={16, 20, 24, 28} and D={0, 1, 2, 3, 4}; C={1, 2, 3, 4, 5, 6, 7} and D={1, 2, 3, 4, 5, 6, 7}; C={1, 2, 3, 4, 5, 6, 7} and D={0, 1, 2, 3, 4, 5, 6, 7};

in the method three, the set Zset includes one of the following sets: {1:1:8}, {9:1:16}, {18:2:32}, {36:4:64}, {72:8:128}, {144:16:256}}, {{1:1:8}, {9:1:16}, {18:2:32}, {36:4:64}, {72:8:128}, {144:16:256}, {288:32:320}}, {{1:1:8}, {9:1:16}, {18:2:32}, {36:4:64}, {72:8:128}, {144:16:256}, {288:32:512}}, {{1:1:8}, {10:2:16}, {20:4:32}, {40:8:64}, {80:16:128}, {160:32:256}}, {{1:1:8}, {10:2:16}, {20:4:32}, {40:8:64}, {80:16:128}, {160:32:256}, {320:64:512}}, {{2:2:16}, {20:4:32}, {40:8:64}, {80:16:128}, {160:32:256}}, {{2:2:16}, {20:4:32}, {40:8:64}, {80:16:128}, {160:32:256}, {320:64:512}}. 1:8}, {9:1:16}, {18:2:32}, {36:4:64}, {72:8:128}, {144:16:256}}, {{1:1:8}, {9:1:16}, {18:2:32}, {36:4:64}, {72:8:128}, {144:16:256}, {288:32:320}}, {{1:1:8}, {9:1:16}, {18:2:32}, {36:4:64}, {72:8:128}, {144:16:256}, {288:32:512}}, {{1:1:8}, {10:2:16}, {20:4:32}, {40:8:64}, {80:16:128}, {160:32:256} }, {{1:1:8}, {10:2:16}, {20:4:32}, 140:8:641, {80:16:128}, {160:32:256}, {320:64:512}}, {{2:2:16}, {20:4:32}, {40:8:64}, {80:16:128}, {160:32:256}}, {{2:2:16}, {20:4:32}, {40:8:64}, {80:16:128}, {160:32:256}, {320:64:512}};

where in the set {a:b:c}, a is a first element in the set, c is a last element in the set, and b is a value of interval between two adjacent elements in the set;

in the method four, the lifting size Z is: $Z=\lceil K/kb \rceil$;

where K is the length of the information bit sequence and kb is the number of systematic columns of the base matrix;

in the method five, the lifting size Z is: $Z=Z_{orig}+W(Z_{orig})$;

where $Z_{orig}=\lceil K/kb \rceil$, K is the length of the information bit sequence, kb is the number of systematic columns of the base matrix, and $W(Z_{orig})$ is a value of one element corresponding to the $Z_{orig}$ in the integer set W;

in the method six, the lifting size is one of the following sets: {2, 4, 8, 16, 32, 64, 128, 256, 512}, {2, 4, 8, 16, 32, 64, 128, 256}, {2, 4, 8, 16, 32, 64, 128}, {2, 4, 8, 16, 32, 64}, or {2, 4, 8, 16, 32}.

In an embodiment, the granularity of the lifting size is a difference between any two magnitude-adjacent lifting size among all lifting sizes, the method of selecting the granularity of the lifting size is to select from at least two types of: a method of a non-negative integer power of 2; a method of a fixed positive integer; or a method of multiplying a first positive integer set by a second positive integer.

In an embodiment, in response to determining that the method of selecting the granularity of the lifting size adopts the method of the non-negative integer power of 2, a set of granularities of the lifting size includes one of the following: {1, 2, 4, 8, 16}, {1, 2, 4, 8, 16, 32}, {1, 2, 4, 8, 16, 32, 64}, {1, 2, 4, 8, 16, 32, 64, 128}; or in response to determining that the method of selecting the granularity of the lifting size adopts the method of the fixed positive integer, the fixed positive integer is a positive integer less than or equal to 128.

In an embodiment, the maximum value of the lifting size is selected from at least two integer values of 4 to 1024.

In an embodiment, the maximum value of the lifting size is selected from at least two integer values of the following: 16, 32, 64, 128, 256, 320, 384, 512, 768, or 1024.

In an embodiment, the maximum information length supported by the quasi-cyclic LDPC coding is selected from at least two integer values of 128 to 8192.

In an embodiment, the maximum information length supported by the quasi-cyclic LDPC coding is selected from at least two integer values of the following: 256, 512, 768, 1024, 2048, 4096, 6144, 7680, or 8192.

In an embodiment, the granularity of the information bit length supported by the quasi-cyclic LDPC coding is a difference between any two magnitude-adjacent lengths of all supported information bit lengths, the method of selecting the granularity of the information bit length is selected from at least two integer values of 2 to 256.

In an embodiment, the pattern for selecting the granularity of the information bit length supported by the quasi-cyclic LDPC coding is to select from at least two integer values of the following: 2, 4, 8, 16, 32, 64, 128, or 256.

a maximum number of columns of a shortened coding of the quasi-cyclic LDPC coding is $\lceil \Delta K/Z \rceil$, where is a maximum number of bits padded in the quasi-cyclic LDPC coding, Z is a lifting size, and the maximum number of columns of the shortened coding is selected from at least two integer values of 1 to 24.

In an embodiment, the maximum number of columns of the shortened coding of the quasi-cyclic LDPC coding is selected from at least two integer values: 0, 1, 2, 3, 4, 5, 6, 8, 12, 16, 24.

In an embodiment, the number of systematic columns not to be transmitted of the rate matching output sequence is selected from at least two integer values of the following: 0, 1, 2, or 3.

In an embodiment, the HARQ combination mode of the quasi-cyclic LDPC coding is selected from at least two types: a soft combination mode, an incremental redundant combination mode, a mixed mode of a soft combination and an incremental redundant combination.

In an embodiment, a maximum number of HARQ transmissions of the quasi-cyclic LDPC coding is selected from at least two integer values: 1, 2, 3, 4, 5, 6.

In an embodiment, the number of HARQ transmission versions is selected from at least two integer values of 1 to 64.

In an embodiment, the number of HARQ transmission versions is selected from at least two integer values of 2, 4, 6, 8, 12, 16, 24, 32.

In an embodiment, the base matrix selects one from Y base matrices, and Y is an integer greater than 1;

where Y base matrices at least includes one of the following characteristics:

at least two base matrices with a same base graph existing in the Y base matrices;

at least two base matrices with a quasi-identical base graph existing in the Y base matrices;

at least two base matrices with a quasi-identical matrix element existing in the Y base matrices;

at least two base matrices with base graph nesting existing in the Y base matrices;

at least two base matrices with a same base graph subset existing in the Y base matrices;

at least two base matrices with a same base matrix subset existing in the Y base matrices;

where the base graph is a matrix obtained by assigning "1" to positions of non−−1 elements in the base matrix and "0" to positions of −1 elements;

the base graph quasi-identical means that two base graphs have different elements, with number a and a is an integer greater than 0 and less than or equal to 10;

the matrix element quasi-identical means that: two base matrices have different elements with number b, where b is an integer greater than 0 and less than or equal to 10;

in the two base matrices with the base graph nesting, a base graph of a small base matrix is a sub-matrix of a base graph of a large base matrix;

the same base graph subset means that: a sub-matrix in the base graph of a base matrix 1 is equal to a sub-matrix in the base graph of a base matrix 2;

the same base matrix subset means that: a sub-matrix existing in the base matrix 1 is equal to a sub-matrix in the base matrix 2.

In an embodiment, the base matrix at least includes a preset ratio of non−−1 elements positions of which are same as positions of "1" in a reference base graph, and the reference base graph is a sub-matrix of the following base graph:

1 1 1 1 1 1 1 1 1 1 1 1 1 1 1 1 1 1 0 0 0 0 0 0 0 0 0 0 0 0 0 0 0 0 0 0 0 0 0 0 0 0 0 0 0 0 0 0
0 0;
1 1 0 1 1 1 1 1 1 1 1 1 1 1 1 0 1 1 1 0 0 0 0 0 0 0 0 0 0 0 0 0 0 0 0 0 0 0 0 0 0 0 0 0 0 0 0 0
0 0;
1 1 0 0 0 0 0 0 0 0 0 0 0 0 0 0 0 0 1 1 0 0 0 0 0 0 0 0 0 0 0 0 0 0 0 0 0 0 0 0 0 0 0 0 0 0 0 0
0 0;
0 1 1 1 1 1 1 1 1 0 1 1 1 1 1 1 1 0 0 1 0 0 0 0 0 0 0 0 0 0 0 0 0 0 0 0 0 0 0 0 0 0 0 0 0 0 0 0
0 0;
1 1 0 0 0 1 0 0 0 1 0 0 0 0 0 0 1 0 0 0 1 0 0 0 0 0 0 0 0 0 0 0 0 0 0 0 0 0 0 0 0 0 0 0 0 0 0 0
0 0;
1 1 0 1 0 0 0 1 0 0 0 0 0 1 0 0 0 0 0 0 0 1 0 0 0 0 0 0 0 0 0 0 0 0 0 0 0 0 0 0 0 0 0 0 0 0 0 0
0 0;
1 1 1 0 1 0 1 0 0 0 1 0 0 0 0 1 0 0 0 0 0 0 1 0 0 0 0 0 0 0 0 0 0 0 0 0 0 0 0 0 0 0 0 0 0 0 0 0
0 0;
1 0 0 0 0 0 0 0 1 0 0 1 1 0 0 0 1 0 0 0 0 0 0 1 0 0 0 0 0 0 0 0 0 0 0 0 0 0 0 0 0 0 0 0 0 0 0 0
0 0;
1 1 0 0 0 1 0 1 0 0 0 1 0 0 0 0 0 0 0 0 0 0 0 0 1 0 0 0 0 0 0 0 0 0 0 0 0 0 0 0 0 0 0 0 0 0 0 0
0 0;
1 1 1 0 1 0 0 0 0 1 0 0 0 1 0 1 0 0 0 0 0 0 0 0 0 1 0 0 0 0 0 0 0 0 0 0 0 0 0 0 0 0 0 0 0 0 0 0
0 0;
1 1 0 0 0 0 1 0 0 0 1 0 0 0 0 0 1 0 0 0 0 0 0 0 0 0 1 0 0 0 0 0 0 0 0 0 0 0 0 0 0 0 0 0 0 0 0 0
0 0;
1 1 0 1 0 0 0 1 0 0 0 0 0 0 1 0 0 1 0 0 0 0 0 0 0 0 0 1 0 0 0 0 0 0 0 0 0 0 0 0 0 0 0 0 0 0 0 0
0 0;
1 1 1 0 1 0 0 0 0 0 0 1 0 0 0 0 0 0 0 0 0 0 0 0 0 0 0 0 1 0 0 0 0 0 0 0 0 0 0 0 0 0 0 0 0 0 0 0
0 0;
1 1 0 0 0 0 1 0 0 0 0 0 1 0 0 0 1 0 0 0 0 0 0 0 0 0 0 0 0 1 0 0 0 0 0 0 0 0 0 0 0 0 0 0 0 0 0 0
0 0;
1 1 0 0 0 0 0 0 1 0 0 0 0 0 0 1 0 1 0 0 0 0 0 0 0 0 0 0 0 0 1 0 0 0 0 0 0 0 0 0 0 0 0 0 0 0 0 0
0 0;
1 1 0 1 0 0 0 0 0 1 0 0 0 0 1 0 0 0 0 0 0 0 0 0 0 0 0 0 0 0 0 1 0 0 0 0 0 0 0 0 0 0 0 0 0 0 0 0
0 0;
0 1 0 0 1 0 0 0 0 0 0 1 0 0 0 0 0 0 1 0 0 0 0 0 0 0 0 0 0 0 0 0 1 0 0 0 0 0 0 0 0 0 0 0 0 0 0 0
0 0;
1 1 0 0 0 1 0 0 0 0 0 0 0 0 0 0 1 0 0 0 0 0 0 0 0 0 0 0 0 0 0 0 0 1 0 0 0 0 0 0 0 0 0 0 0 0 0 0
0 0;
1 0 1 0 0 0 1 0 0 0 0 0 0 1 0 0 0 0 0 0 0 0 0 0 0 0 0 0 0 0 0 0 0 0 1 0 0 0 0 0 0 0 0 0 0 0 0 0
0 0;
0 1 0 0 0 0 0 1 0 0 0 0 0 0 1 0 0 1 0 0 0 0 0 0 0 0 0 0 0 0 0 0 0 0 0 1 0 0 0 0 0 0 0 0 0 0 0 0
0 0;
1 0 0 0 0 0 0 0 1 0 0 0 0 0 0 0 0 0 1 0 0 0 0 0 0 0 0 0 0 0 0 0 0 0 0 0 1 0 0 0 0 0 0 0 0 0 0 0
0 0;
0 1 0 0 1 0 0 0 0 0 1 0 0 0 0 0 1 0 0 0 0 0 0 0 0 0 0 0 0 0 0 0 0 0 0 0 0 1 0 0 0 0 0 0 0 0 0 0
0 0;
1 0 1 0 0 1 0 0 0 0 0 0 0 1 0 0 0 0 0 0 0 0 0 0 0 0 0 0 0 0 0 0 0 0 0 0 0 0 1 0 0 0 0 0 0 0 0 0
0 0;
1 1 0 0 0 0 0 0 0 0 0 0 1 0 0 0 0 1 0 0 0 0 0 0 0 0 0 0 0 0 0 0 0 0 0 0 0 0 0 1 0 0 0 0 0 0 0 0
0 0;
1 1 0 1 0 0 1 0 1 0 0 0 0 0 0 0 0 0 0 0 0 0 0 0 0 0 0 0 0 0 0 0 0 0 0 0 0 0 0 0 1 0 0 0 0 0 0 0
0 0;
1 1 0 0 0 0 0 0 0 0 1 0 0 0 0 0 1 0 0 0 0 0 0 0 0 0 0 0 0 0 0 0 0 0 0 0 0 0 0 0 0 1 0 0 0 0 0 0
0 0;
1 1 1 0 0 0 0 1 0 0 0 0 0 0 0 0 0 0 0 0 0 0 0 0 0 0 0 0 0 0 0 0 0 0 0 0 0 0 0 0 0 0 1 0 0 0 0 0
0 0;
0 1 0 0 0 1 0 0 0 0 0 0 0 0 0 0 0 0 1 0 0 0 0 0 0 0 0 0 0 0 0 0 0 0 0 0 0 0 0 0 0 0 0 1 0 0 0 0
0 0;
0 1 0 0 1 0 0 0 0 0 0 0 0 0 1 0 0 1 0 0 0 0 0 0 0 0 0 0 0 0 0 0 0 0 0 0 0 0 0 0 0 0 0 0 1 0 0 0
0 0;
0 1 0 0 0 0 1 0 0 1 0 0 0 0 0 0 1 0 0 0 0 0 0 0 0 0 0 0 0 0 0 0 0 0 0 0 0 0 0 0 0 0 0 0 0 1 0 0
0 0;
0 1 1 1 0 0 0 0 0 0 0 0 0 0 0 0 0 0 0 0 0 0 0 0 0 0 0 0 0 0 0 0 0 0 0 0 0 0 0 0 0 0 0 0 0 0 1 0
0 0;

where in the base graph, the element which is equal to "1" indicates that an element corresponding to the position in the base matrix has an element value of non-−1, and the element which is equal to "0" indicates that an element corresponding to the position in the base matrix has an element value of −1. Preferably, the preset ratio is a real number greater than 60% and less than or equal to 100%.

A base graph $H_{BG}$ of the base matrix is the same as a first base graph $H^1_{BG}$;

The first base graph includes t sub-matrices, i.e., $$H^1_{BG} = \begin{bmatrix} H^1_{BGsub1} \\ H^1_{BGsub2} \\ \vdots \\ H^1_{BGsubt} \end{bmatrix},$$

where $H^1_{BGsub1}$, $H^1_{BGsub2}$, . . . , $H^1_{BGsubt}$ are respectively a first, second, . . . , $t^{th}$ sub-matrix of the first base graph. Each sub-matrix $H^1_{BGsubi}$ includes a plurality of consecutive rows of the first base graph, and rows corresponding to a sub-matrix with a small index value are above rows corresponding to a sub-matrix with a large index value, where a number of rows of an i-th sub-matrix is $R^1_{subi}$, and $0<R^1_{subi}\leq R^1_{BG}$, i=1, 2, . . . , t, where $R^1_{BG}$ is a number of rows of the first base graph $H^1_{BG}$; where an index value t of each sub-matrix is a positive integer, and 1≤t≤11;

where elements in the base graph of the base matrix only have two values of "0" or "1", and the base graph has a same number of rows and a same number of columns as the base matrix, elements of "1" and elements of "0" respectively correspond to non-−1 elements and −1 elements in the base matrix.

a second base graph is provided, where the second base graph has a same number of rows and a same number of columns as the first base graph; and a second base graph $H^2_{BG}$ includes t sub-matrices, i.e., $$H^2_{BG} = \begin{bmatrix} H^2_{BGsub1} \\ H^2_{BGsub2} \\ \vdots \\ H^2_{BGsubt} \end{bmatrix},$$

where $H^2_{BGsub1}$, $H^2_{BGsub2}$, . . . , $H^2_{BGsubt}$ are respectively a first, a second, . . . , a $t^{th}$ sub-matrix of the second base graph; each sub-matrix $H^2_{BGsub1}$ includes a plurality of consecutive rows of the second base graph, and rows corresponding to a sub-matrix with a small index value are above rows corresponding to a sub-matrix with a large index value, where a number of rows of an i-th sub-matrix is $R^2_{subi}$, and $0<R^2_{subi}\leq R^2_{BG}$, i=1, 2, . . . , t, where $R^2_{BG}$ is a number of rows of the second base graph $H^2_{BGi}$; where an index value t of each sub-matrix is a positive integer, and 1≤t≤11.

In an embodiment, the first base graph and the second base graph have the following relationship:

an i-th sub-matrix $H^1_{BGsubi}$ of the first base graph is the same as an i-th sub-matrix $H^2_{BGsubi}$ of the second base graph, where i is a positive integer and i=0, or 1, or 2, . . . , or t.

In an embodiment, an i-th sub-matrix $H^1_{BGsubi}$ of the first base graph is the same as an i-th sub-matrix $H^{T}_{BGsubi}$ of the second base graph after adjustment; where i is a positive integer and i=0, or 1, or 2, . . . , or t.

In an embodiment, a first row of a first sub-matrix $H^{2'}_{BGsub1}$ of the second base graph after adjustment is increased by x1 "1" elements and/or reduced by x1' "1" elements than a first row of the sub-matrix $H^2_{BGsub1}$ before adjustment, where x1 and x' are integers, and 0≤x1≤15, 0≤x1'≤15.

In an embodiment, a second row of a first sub-matrix $H^{2'}_{BGsub1}$ of the second base graph after adjustment is increased by x2 "1" elements and/or reduced by x2' "1" elements than a second row of the sub-matrix $H^2_{BGsub1}$ before adjustment, where x2 and x2' are integers, and 0≤x2≤15, 0≤x2'≤15.

In an embodiment, a third row of a first sub-matrix $H^{2'}_{BGsubi}$ of the second base graph after adjustment is increased by x3 "1" elements and/or reduced by x3' "1" elements than a third row of the sub-matrix $H^2_{BGsub1}$ before adjustment, where x3 and x3' are integers, and 0≤x3≤15, 0≤x3'≤15.

In an embodiment, a fourth row of a first sub-matrix $H^{2'}_{BGsubi}$ of the second base graph after adjustment is increased by x4 "1" elements and/or reduced by x4' "1" elements than a fourth row of the sub-matrix $H^2_{BGsub1}$ before adjustment, where x4 and x4' are integers, and 0≤x4≤15, 0≤x4'≤15.

In an embodiment, a fifth row of a first sub-matrix $H^{2'}_{BGsubi}$ of the second base graph after adjustment is increased by x5 "1" elements and/or reduced by x5' "1" elements than a fifth row of the sub-matrix $H^2_{BGsub1}$ before adjustment, where x5 and x5' are integers, and 0≤x5≤15, 0≤x5'≤15.

In an embodiment, a six row of a first sub-matrix $H^{2'}_{BGsub1}$ of the second base graph after adjustment is increased by x6 "1" elements and/or reduced by x6' "1" elements than a first row of the sub-matrix $H^2_{BGsub1}$ before adjustment, where x6 and x6' are integers, and 0≤x6≤15, 0≤x6'≤15.

In an embodiment, the i-th sub-matrix $H^{2'}_{BGsubi}$ of the second base graph after adjustment is a matrix obtained by rearranging rows, of the i-th sub-matrix $H^2_{BGsub1}$ before adjustment; where rearranging the rows of the i-th sub-matrix $H^2_{BGsubi}$ refers to changing an arrangement order of the rows of the sub-matrix $H^2_{BGsub1}$.

In an embodiment, a matrix portion of first (Kb+M) columns of an i-th sub-matrix $H^{2'}_{BGsubi}$ of the second base graph after adjustment is a matrix obtained by rearranging L rows of a matrix portion of first (Kb+M) columns of an i-th sub-matrix $H^2_{BGsubi}$ before adjustment; where Kb is a difference between a number of columns and a number of rows of the second base graph, Kb is an integer greater than 0, and L and M are single digits.

In an embodiment, the step in which the matrix portion of the first (Kb+M) columns of the i-th sub-matrix $H^{2'}_{BGsubi}$ of the second base graph after adjustment is a matrix obtained by rearranging the L rows of the matrix portion of the first (Kb+M) columns of the i-th sub-matrix $H^2_{BGsubi}$ before adjustment further includes: the matrix obtained by rearranging the L rows of the matrix portion of the first (Kb+M) columns of the i-th sub-matrix $H^2_{BGsubi}$ before adjustment is $H^{2''}_{BGsubi}$, the matrix portion of the first (Kb+M) columns of the i-th sub-matrix $H^{T}_{BGsubi}$ of the second base graph after adjustment is increased by x7 "1" elements and/or reduced by x7' "1" elements than the matrix $H^{2''}_{BGsubi}$, where x7 and x7' are integers, and 0≤x7≤15, 0≤x7'≤15.

In an embodiment, the step in which the i-th sub-matrix $H^{T}_{BGsubi}$ of the second base graph after adjustment is the matrix obtained by rearranging rows of the i-th sub-matrix $H^{2}_{BGsubi}$ before adjustment further includes: the matrix obtained by rearranging the rows of the i-th sub-matrix $H^{2}_{BGsubi}$ before adjustment is $H^{2'''}_{BGsubi}$, the i-th submatrix $H^{2'}_{BGsubi}$ of the second base graph after adjustment is increased by x8 "1" elements and/or reduced by x8' "1" elements than the matrix $H^{2'''}_{BGsubi}$, where x8 and x8' are integers, 0≤x8≤15, and 0≤x8'≤15.

A third base graph is provided, where the third base graph has a same number of rows and a same number of columns as the first base graph; and a third base graph $H^{3}_{BG}$ includes t sub-matrices, i.e., $$H_{BG}^{3} = \begin{bmatrix} H_{BGsub1}^{3} \\ H_{BGsub2}^{3} \\ \vdots \\ H_{BGsubt}^{3} \end{bmatrix},$$

where $H^{3}_{BGsub1}$, $H^{3}_{BGsub2}$, . . . , $H^{3}_{BGsubt}$ are respectively a first, a second, . . . , a $t^{th}$ sub-matrix of the third base graph; each sub-matrix $H^{3}_{BGsubi}$ includes a plurality of consecutive rows of the third base graph, and rows corresponding to a sub-matrix with a small index value are above rows corresponding to a sub-matrix with a large index value, where a number of rows of an i-th sub-matrix is $R^{3}_{subi}$, and $0<R^{3}_{subi}\le R^{3}_{BG}$, i=1, 2, . . . , t, where $R^{3}_{BG}$ is a number of rows of the third base graph $H^{3}_{BG}$; where an index value t of each sub-matrix is a positive integer, and 1≤t≤11.

In an embodiment, at least one sub-matrix $H^{1}_{BGsubi}$ in the first base graph is the same as a sub-matrix $H^{3}_{BGsubi}$ of the third base graph, where i is an integer and 1≤i≤11.

In an embodiment, at least one sub-matrix $H^{1}_{BGsubi}$ in the first base graph is the same as the sub-matrix $H^{2'}_{BGsubi}$ of the second base graph after adjustment;

where a proportion of a number of "1" elements in the sub-matrix $H^{T}_{BGsubi}$ of the second base graph after adjustment increases a1% and/or decreases a1'% compared with the number of "1" elements in the sub-matrix $H^{2}_{BGsubi}$ before adjustment, where a1 and a1' are positive numbers not exceeding 30.

In an embodiment, in the sub-matrix $H^{2'}_{BGsubi}$ after adjustment, a proportion of the number of "1" elements in first g1 rows increases a2% and/or decreases a2'%, and a proportion of the number of "1" elements in $R^{2}_{subi-g1}$ rows increases a3% and/or decreases a3'%; where a2, a3, a2' and a3' are all positive numbers not exceeding 30, and a2≥a3.

In an embodiment, at least one sub-matrix $H^{1}_{BGsubi}$ in the first base graph is the same as the sub-matrix $H^{3'}_{BGsubi}$ of the third base graph after adjustment;

where a proportion of a number of "1" elements in the sub-matrix $H^{3'}_{BGsubi}$ of the third base graph after adjustment increases b1% and/or decreases b1'% compared with the number of "1" elements in the sub-matrix $H^{3}_{BGsubi}$ before adjustment, where b1 and b1' are positive numbers not exceeding 30.

In an embodiment, in the sub-matrix $H^{3'}_{BGsubi}$ after adjustment, a proportion of the number of "1" elements in first g2 rows increases b2% and/or decreases b2'%, and a proportion of the number of "1" elements in $R^{3}_{subi-g2}$ rows increases b3% and/or decreases b3'%; where b2, b3, b2' and b3' are all positive numbers not exceeding 30, and b2≥3.

In an embodiment, the second base graph and the third base graph are the base graphs in the following base graphs Hb1 to Hb10.

where the base graph Hb1 is 1 0 1 1 1 1 1 1 0 1 0 0 1 0 0 1 0 0 0 1 1 0 1 1 0 0 0 0 0 0 0 0 0 0 0 0 0 0 0 0 0 0 0 0 0 0 0 0 0 0 0 0 0 0 0 0 0 0 0 0 0 0 0 0 0
0 0 0
1 1 0 0 1 0 1 0 0 0 1 1 0 1 0 0 1 1 1 1 1 1 0 1 1 0 0 0 0 0 0 0 0 0 0 0 0 0 0 0 0 0 0 0 0 0 0 0 0 0 0 0 0 0 0 0 0 0 0 0 0 0 0 0 0
0 0 0
1 1 0 0 1 0 0 1 1 0 1 1 1 1 1 1 1 0 0 1 0 1 1 0 1 1 0 0 0 0 0 0 0 0 0 0 0 0 0 0 0 0 0 0 0 0 0 0 0 0 0 0 0 0 0 0 0 0 0 0 0 0 0 0 0
0 0 0
0 1 1 1 0 1 1 0 1 1 1 0 1 1 1 1 0 1 1 0 1 1 0 0 0 1 1 0 0 0 0 0 0 0 0 0 0 0 0 0 0 0 0 0 0 0 0 0 0 0 0 0 0 0 0 0 0 0 0 0 0 0 0 0 0
0 0 0
1 1 1 1 0 1 0 1 1 1 0 1 0 0 1 0 1 1 1 0 0 0 1 0 0 0 1 0 0 0 0 0 0 0 0 0 0 0 0 0 0 0 0 0 0 0 0 0 0 0 0 0 0 0 0 0 0 0 0 0 0 0 0 0 0
0 0 0
1 1 0 0 0 0 0 0 0 0 0 0 0 0 0 0 0 0 0 0 0 0 1 0 0 0 0 1 0 0 0 0 0 0 0 0 0 0 0 0 0 0 0 0 0 0 0 0 0 0 0 0 0 0 0 0 0 0 0 0 0 0 0 0 0
0 0 0
1 1 0 0 1 0 0 0 0 0 0 1 0 0 0 0 0 0 0 0 0 1 1 0 0 0 0 0 1 0 0 0 0 0 0 0 0 0 0 0 0 0 0 0 0 0 0 0 0 0 0 0 0 0 0 0 0 0 0 0 0 0 0 0 0
0 0 0
0 1 0 0 0 0 0 1 0 0 0 0 0 1 1 0 1 0 1 1 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0
0 0 0
1 1 1 1 0 1 0 0 0 1 1 0 0 0 0 0 0 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0 0 0 0
0 0 0
1 1 0 0 1 0 0 0 0 0 0 1 1 0 0 1 0 0 0 0 0 0 1 0 0 0 0 0 0 0 0 1 0 0 0 0 0 0 0 0 0 0 0 0 0 0 0 0 0 0 0 0 0 0 0 0 0 0 0 0 0 0 0 0 0
0 0 0
1 1 0 0 0 0 0 1 1 0 0 0 0 0 0 0 1 0 0 0 1 1 0 0 0 0 0 0 0 0 0 0 1 0 0 0 0 0 0 0 0 0 0 0 0 0 0 0 0 0 0 0 0 0 0 0 0 0 0 0 0 0 0 0 0
0 0 0
1 1 1 0 0 1 0 0 0 0 0 0 0 0 0 0 0 1 0 1 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0
0 0 0
1 0 0 0 1 0 1 0 0 1 0 1 0 0 0 0 0 0 0 0 0 0 1 0 0 0 0 0 0 0 0 0 0 0 1 0 0 0 0 0 0 0 0 0 0 0 0 0 0 0 0 0 0 0 0 0 0 0 0 0 0 0 0 0 0
0 0 0
0 1 0 0 0 0 0 1 0 0 0 0 0 0 1 0 1 0 0 0 0 1 0 0 0 0 0 0 0 0 0 0 0 0 0 1 0 0 0 0 0 0 0 0 0 0 0 0 0 0 0 0 0 0 0 0 0 0 0 0 0 0 0 0 0
0 0 0
1 1 1 1 0 0 0 0 0 0 0 0 0 0 0 0 0 0 0 1 0 0 0 0 1 0 0 0 0 0 0 0 0 0 0 0 1 0 0 0 0 0 0 0 0 0 0 0 0 0 0 0 0 0 0 0 0 0 0 0 0 0 0 0 0
0 0 0
1 0 0 0 1 1 0 0 0 1 0 1 0 0 0 0 0 0 0 0 0 0 0 0 0 0 0 0 0 0 0 0 0 0 0 0 0 1 0 0 0 0 0 0 0 0 0 0 0 0 0 0 0 0 0 0 0 0 0 0 0 0 0 0 0
0 0 0
1 1 0 0 0 0 0 1 0 0 0 0 0 0 1 0 1 0 0 0 0 0 1 1 0 0 0 0 0 0 0 0 0 0 0 0 0 0 1 0 0 0 0 0 0 0 0 0 0 0 0 0 0 0 0 0 0 0 0 0 0 0 0 0 0
0 0 0
0 1 1 0 0 0 0 0 0 0 0 0 0 0 0 0 0 0 1 1 0 0 0 0 0 0 0 0 0 0 0 0 0 0 0 0 0 0 0 1 0 0 0 0 0 0 0 0 0 0 0 0 0 0 0 0 0 0 0 0 0 0 0 0 0
0 0 0
1 0 0 0 1 1 0 0 0 0 0 1 0 0 0 0 0 0 0 0 0 0 0 0 0 1 0 0 0 0 0 0 0 0 0 0 0 0 0 0 1 0 0 0 0 0 0 0 0 0 0 0 0 0 0 0 0 0 0 0 0 0 0 0 0
0 0 0
1 1 0 0 0 0 0 0 1 1 0 0 0 0 0 0 0 0 0 0 0 1 0 0 0 0 0 0 0 0 0 0 0 0 0 0 0 0 0 0 0 1 0 0 0 0 0 0 0 0 0 0 0 0 0 0 0 0 0 0 0 0 0 0 0
0 0 0

-continued 1 1 0 0 0 0 0 1 0 0 0 0 0 0 1 0 0 0 0 0 0 0 0 0 0 0 1 0 0 0 0 0 0 0 0 0 0 0 0 0 0 0 1 0 0 0 0 0 0 0 0 0 0 0 0 0 0 0 0 0 0 0 0 0 0
0 0 0
0 1 0 1 0 0 0 0 0 0 0 0 0 0 0 0 1 0 0 1 0 0 0 0 0 0 0 0 0 0 0 0 0 0 0 0 0 0 0 0 0 0 0 1 0 0 0 0 0 0 0 0 0 0 0 0 0 0 0 0 0 0 0 0 0
0 0 0
1 1 1 0 0 1 0 0 0 0 0 0 0 0 0 1 0 0 0 0 0 0 0 0 0 0 0 0 0 0 0 0 0 0 0 0 0 0 0 0 0 0 0 0 1 0 0 0 0 0 0 0 0 0 0 0 0 0 0 0 0 0 0 0 0
0 0 0
1 0 0 0 1 0 0 0 0 1 0 1 0 1 0 0 0 0 0 0 0 0 0 0 0 0 0 0 0 0 0 0 0 0 0 0 0 0 0 0 0 0 0 0 0 1 0 0 0 0 0 0 0 0 0 0 0 0 0 0 0 0 0 0 0
0 0 0
0 1 0 0 0 0 0 1 0 0 1 0 0 0 1 0 0 0 0 0 0 0 0 0 0 0 0 0 0 0 0 0 0 0 0 0 0 0 0 0 0 0 0 0 0 0 1 0 0 0 0 0 0 0 0 0 0 0 0 0 0 0 0 0 0
0 0 0
1 0 0 0 0 0 0 0 0 0 0 0 1 0 0 0 0 0 0 1 0 0 1 0 0 0 0 0 0 0 0 0 0 0 0 0 0 0 0 0 0 0 0 0 0 0 0 1 0 0 0 0 0 0 0 0 0 0 0 0 0 0 0 0 0
0 0 0
1 1 0 0 0 0 0 0 0 0 0 0 0 0 0 0 1 0 0 0 1 0 0 0 0 0 0 0 0 0 0 0 0 0 0 0 0 0 0 0 0 0 0 0 0 0 0 0 1 0 0 0 0 0 0 0 0 0 0 0 0 0 0 0 0
0 0 0
1 0 0 0 0 0 1 0 0 0 0 1 0 0 0 0 0 1 0 0 0 0 0 0 0 0 0 0 0 0 0 0 0 0 0 0 0 0 0 0 0 0 0 0 0 0 0 0 0 1 0 0 0 0 0 0 0 0 0 0 0 0 0 0 0
0 0 0
1 0 1 0 0 0 0 1 0 1 0 0 0 0 0 0 0 0 0 0 0 0 0 0 0 0 0 0 0 0 0 0 0 0 0 0 0 0 0 0 0 0 0 0 0 0 0 0 0 0 1 0 0 0 0 0 0 0 0 0 0 0 0 0 0
0 0 0
1 1 0 0 0 0 0 0 0 0 0 0 0 0 1 0 0 0 0 1 0 0 0 0 1 0 0 0 0 0 0 0 0 0 0 0 0 0 0 0 0 0 0 0 0 0 0 0 0 0 0 1 0 0 0 0 0 0 0 0 0 0 0 0 0
0 0 0
1 1 0 0 0 0 0 0 0 0 1 0 0 1 0 0 0 0 0 0 0 0 0 0 0 0 0 0 0 0 0 0 0 0 0 0 0 0 0 0 0 0 0 0 0 0 0 0 0 0 0 0 1 0 0 0 0 0 0 0 0 0 0 0 0
0 0 0
0 1 0 0 1 0 0 0 0 0 0 0 0 0 0 0 0 0 0 0 0 0 0 0 0 1 0 0 0 0 0 0 0 0 0 0 0 0 0 0 0 0 0 0 0 0 0 0 0 0 0 0 0 1 0 0 0 0 0 0 0 0 0 0 0
0 0 0
1 0 0 0 0 1 0 0 0 0 0 0 0 0 0 0 1 1 0 0 0 0 0 0 0 0 0 0 0 0 0 0 0 0 0 0 0 0 0 0 0 0 0 0 0 0 0 0 0 0 0 0 0 0 1 0 0 0 0 0 0 0 0 0 0
0 0 0
1 1 0 0 0 0 0 1 0 0 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0 1 0 0 0 0 0 0 0 0 0
0 0 0
1 1 0 0 0 0 0 0 1 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 1 0 0 0 0 0 0 0 0
0 0 0
1 1 0 0 0 0 0 0 0 0 0 1 0 0 0 0 0 0 0 1 0 0 0 0 0 0 1 0 0 0 0 0 0 0 0 0 0 0 0 0 0 0 0 0 0 0 0 0 0 0 0 0 0 0 0 0 0 1 0 0 0 0 0 0 0
0 0 0
1 1 0 0 0 0 0 0 0 1 0 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 1 0 0 0 0 0 0
0 0 0
1 0 0 0 0 1 0 0 0 0 0 0 0 0 0 0 1 0 0 0 0 0 0 1 0 0 0 0 0 0 0 0 0 0 0 0 0 0 0 0 0 0 0 0 0 0 0 0 0 0 0 0 0 0 0 0 0 0 0 1 0 0 0 0 0
0 0 0
0 1 0 0 0 0 0 1 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 1 0 0 0 0
0 0 0
1 1 0 0 0 0 1 0 0 0 0 0 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 1 0 0 0
0 0 0
1 0 0 1 0 0 0 0 0 0 0 0 0 0 1 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 1 0 0
0 0 0
1 0 0 0 0 0 0 0 0 0 0 1 0 0 0 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0 1 0
0 0 0
1 1 0 0 0 0 0 0 0 0 0 0 0 0 0 0 0 0 0 0 1 1 0 0 0 0 0 0 0 0 0 0 0 0 0 0 0 0 0 0 0 0 0 0 0 0 0 0 0 0 0 0 0 0 0 0 0 0 0 0 0 0 0 0 1
0 0 0
1 0 0 0 0 0 0 0 0 1 0 0 0 0 0 0 1 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0
1 0 0
0 1 0 0 0 0 0 0 0 0 1 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0
0 1 0
1 0 0 0 0 1 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0
0 0 1 the base graph Hb2 is 1 1 0 1 1 0 1 1 1 0 1 1 1 1 1 0 1 1 1 0 1 1 1 1 0 0 0 0 0 0 0 0 0 0 0 0 0 0 0 0 0 0 0 0 0 0 0 0 0 0 0 0 0 0 0 0 0 0 0 0 0 0 0 0 0
0 0 0
1 1 1 0 1 1 1 1 1 1 1 0 0 1 1 1 0 1 1 1 1 0 0 1 1 0 0 0 0 0 0 0 0 0 0 0 0 0 0 0 0 0 0 0 0 0 0 0 0 0 0 0 0 0 0 0 0 0 0 0 0 0 0 0 0
0 0 0
1 0 1 1 1 1 0 1 1 1 0 1 1 0 1 1 1 1 0 1 0 1 1 0 1 1 0 0 0 0 0 0 0 0 0 0 0 0 0 0 0 0 0 0 0 0 0 0 0 0 0 0 0 0 0 0 0 0 0 0 0 0 0 0 0
0 0 0
1 1 1 1 0 1 1 0 0 1 1 1 1 1 0 1 1 0 1 1 1 1 1 0 0 1 0 0 0 0 0 0 0 0 0 0 0 0 0 0 0 0 0 0 0 0 0 0 0 0 0 0 0 0 0 0 0 0 0 0 0 0 0 0 0
0 0 0
1 1 0 0 0 0 0 0 0 0 0 0 0 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0
0 0 0
1 1 0 0 0 0 0 0 0 1 1 0 1 0 0 0 0 1 1 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0
0 0 0
1 0 0 0 1 0 1 0 0 0 0 1 0 1 0 0 0 0 0 1 1 0 0 0 0 0 0 0 1 0 0 0 0 0 0 0 0 0 0 0 0 0 0 0 0 0 0 0 0 0 0 0 0 0 0 0 0 0 0 0 0 0 0 0 0
0 0 0
1 1 0 0 0 0 0 0 1 1 1 0 1 0 0 0 0 1 0 0 0 1 1 0 0 0 0 0 0 1 0 0 0 0 0 0 0 0 0 0 0 0 0 0 0 0 0 0 0 0 0 0 0 0 0 0 0 0 0 0 0 0 0 0 0
0 0 0
1 1 0 0 0 0 1 0 0 0 0 1 0 1 0 0 0 0 1 1 0 0 0 0 1 0 0 0 0 0 1 0 0 0 0 0 0 0 0 0 0 0 0 0 0 0 0 0 0 0 0 0 0 0 0 0 0 0 0 0 0 0 0 0 0
0 0 0
0 1 0 0 0 0 0 0 0 1 1 0 1 0 0 0 1 1 0 0 1 0 0 0 0 0 0 0 0 0 0 1 0 0 0 0 0 0 0 0 0 0 0 0 0 0 0 0 0 0 0 0 0 0 0 0 0 0 0 0 0 0 0 0 0
0 0 0
1 1 0 0 1 0 1 0 0 0 0 0 0 1 0 1 0 0 1 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0 0
0 0 0
1 0 0 0 0 1 0 0 0 1 1 1 1 0 0 0 0 1 0 0 0 0 0 1 0 0 0 0 0 0 0 0 0 1 0 0 0 0 0 0 0 0 0 0 0 0 0 0 0 0 0 0 0 0 0 0 0 0 0 0 0 0 0 0 0
0 0 0
1 0 0 0 1 0 1 0 0 0 0 0 0 1 0 0 0 0 1 0 0 0 1 0 0 0 0 0 0 0 0 0 0 0 1 0 0 0 0 0 0 0 0 0 0 0 0 0 0 0 0 0 0 0 0 0 0 0 0 0 0 0 0 0 0
0 0 0
1 1 0 1 0 0 0 0 0 0 0 0 1 0 0 0 0 1 0 0 0 1 0 0 0 0 0 0 0 0 0 0 0 0 0 1 0 0 0 0 0 0 0 0 0 0 0 0 0 0 0 0 0 0 0 0 0 0 0 0 0 0 0 0 0
0 0 0

-continued 0 1 0 0 0 0 1 1 0 1 0 0 0 0 0 0 0 0 0 0 1 0 0 0 0 0 0 0 0 0 0 0 0 0 0 0 1 0 0 0 0 0 0 0 0 0 0 0 0 0 0 0 0 0 0 0 0 0 0 0 0 0 0 0 0
0 0 0
1 0 0 0 0 0 0 0 0 0 1 0 0 1 0 0 0 1 0 0 0 1 0 0 1 0 0 0 0 0 0 0 0 0 0 0 0 1 0 0 0 0 0 0 0 0 0 0 0 0 0 0 0 0 0 0 0 0 0 0 0 0 0 0 0
0 0 0
1 1 1 0 0 0 1 0 0 0 0 0 0 0 0 0 0 0 0 0 1 0 0 0 0 0 0 0 0 0 0 0 0 0 0 0 0 0 1 0 0 0 0 0 0 0 0 0 0 0 0 0 0 0 0 0 0 0 0 0 0 0 0 0 0
0 0 0
1 0 0 0 1 0 0 0 0 0 1 0 1 0 1 0 0 0 0 0 0 0 0 0 0 0 0 0 0 0 0 0 0 0 0 0 0 0 0 1 0 0 0 0 0 0 0 0 0 0 0 0 0 0 0 0 0 0 0 0 0 0 0 0 0
0 0 0
0 1 0 0 0 0 1 0 0 1 0 0 0 1 0 0 0 1 0 0 0 0 0 0 0 1 0 0 0 0 0 0 0 0 0 0 0 0 0 0 1 0 0 0 0 0 0 0 0 0 0 0 0 0 0 0 0 0 0 0 0 0 0 0 0
0 0 0
1 0 0 0 1 0 0 0 0 0 1 1 1 0 0 0 0 0 0 0 0 0 0 0 0 0 0 0 0 0 0 0 0 0 0 0 0 0 0 0 0 1 0 0 0 0 0 0 0 0 0 0 0 0 0 0 0 0 0 0 0 0 0 0 0
0 0 0
0 1 0 0 0 0 1 0 0 1 0 0 0 0 0 0 0 0 1 0 0 0 0 1 0 0 0 0 0 0 0 0 0 0 0 0 0 0 0 0 0 0 1 0 0 0 0 0 0 0 0 0 0 0 0 0 0 0 0 0 0 0 0 0 0
0 0 0
1 0 0 1 1 0 0 0 0 0 1 0 0 1 0 0 0 0 0 0 0 0 0 0 0 0 0 0 0 0 0 0 0 0 0 0 0 0 0 0 0 0 0 1 0 0 0 0 0 0 0 0 0 0 0 0 0 0 0 0 0 0 0 0 0
0 0 0
1 1 0 0 0 0 0 0 0 1 0 0 0 0 0 0 1 0 0 0 0 0 0 0 1 0 0 0 0 0 0 0 0 0 0 0 0 0 0 0 0 0 0 0 1 0 0 0 0 0 0 0 0 0 0 0 0 0 0 0 0 0 0 0 0
0 0 0
0 1 0 0 0 0 0 0 0 0 0 0 0 1 0 1 0 1 0 0 0 0 0 0 0 0 0 0 0 0 0 0 0 0 0 0 0 0 0 0 0 0 0 0 0 1 0 0 0 0 0 0 0 0 0 0 0 0 0 0 0 0 0 0 0
0 0 0
0 1 0 0 0 0 0 0 1 1 0 0 1 0 0 0 0 0 0 0 0 0 0 0 0 0 0 0 0 0 0 0 0 0 0 0 0 0 0 0 0 0 0 0 0 0 1 0 0 0 0 0 0 0 0 0 0 0 0 0 0 0 0 0 0
0 0 0
1 0 0 0 0 1 1 0 0 0 0 1 0 0 0 0 0 0 0 0 0 0 0 0 0 0 0 0 0 0 0 0 0 0 0 0 0 0 0 0 0 0 0 0 0 0 0 1 0 0 0 0 0 0 0 0 0 0 0 0 0 0 0 0 0
0 0 0
1 1 0 0 0 0 0 0 0 1 0 0 0 0 0 0 0 0 0 0 0 0 0 1 1 0 0 0 0 0 0 0 0 0 0 0 0 0 0 0 0 0 0 0 0 0 0 0 1 0 0 0 0 0 0 0 0 0 0 0 0 0 0 0 0
0 0 0
1 0 0 0 0 0 0 0 0 0 0 1 1 0 0 0 0 0 0 0 0 0 0 0 0 1 0 0 0 0 0 0 0 0 0 0 0 0 0 0 0 0 0 0 0 0 0 0 0 1 0 0 0 0 0 0 0 0 0 0 0 0 0 0 0
0 0 0
1 1 1 0 0 0 1 0 0 0 1 0 0 0 0 0 0 0 0 0 0 0 0 0 0 0 0 0 0 0 0 0 0 0 0 0 0 0 0 0 0 0 0 0 0 0 0 0 0 0 1 0 0 0 0 0 0 0 0 0 0 0 0 0 0
0 0 0
0 1 0 0 0 0 0 1 0 0 0 0 1 0 0 0 0 1 0 0 0 0 0 0 0 0 0 0 0 0 0 0 0 0 0 0 0 0 0 0 0 0 0 0 0 0 0 0 0 0 0 1 0 0 0 0 0 0 0 0 0 0 0 0 0
0 0 0
1 0 0 0 0 0 0 0 0 0 0 0 0 1 1 0 0 0 0 0 0 0 0 0 0 1 0 0 0 0 0 0 0 0 0 0 0 0 0 0 0 0 0 0 0 0 0 0 0 0 0 0 1 0 0 0 0 0 0 0 0 0 0 0 0
0 0 0
1 0 0 0 0 0 0 0 0 1 1 0 0 0 0 0 0 0 0 1 0 0 0 0 0 0 0 0 0 0 0 0 0 0 0 0 0 0 0 0 0 0 0 0 0 0 0 0 0 0 0 0 0 1 0 0 0 0 0 0 0 0 0 0 0
0 0 0
0 1 0 0 0 0 1 0 0 0 0 0 1 0 0 0 0 0 0 0 0 0 1 0 0 0 0 0 0 0 0 0 0 0 0 0 0 0 0 0 0 0 0 0 0 0 0 0 0 0 0 0 0 0 1 0 0 0 0 0 0 0 0 0 0
0 0 0
1 0 0 1 0 0 0 0 0 0 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0 1 0 0 0 0 0 0 0 0 0
0 0 0
0 1 0 0 0 0 0 0 0 0 1 0 0 0 1 0 0 0 0 0 0 0 0 0 1 0 0 0 0 0 0 0 0 0 0 0 0 0 0 0 0 0 0 0 0 0 0 0 0 0 0 0 0 0 0 0 1 0 0 0 0 0 0 0 0
0 0 0
0 1 0 0 0 0 0 0 0 1 0 0 0 1 0 0 1 0 0 0 0 0 0 0 0 0 0 0 0 0 0 0 0 0 0 0 0 0 0 0 0 0 0 0 0 0 0 0 0 0 0 0 0 0 0 0 0 1 0 0 0 0 0 0 0
0 0 0
1 1 0 1 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 1 0 0 0 0 0 0
0 0 0
1 0 0 0 0 0 1 0 0 0 1 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0 1 0 0 0 0 0
0 0 0
0 1 0 0 0 0 0 0 1 0 0 0 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0 0 0 0 1 0 0 0 0
0 0 0
1 0 0 0 0 0 0 1 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0 1 0 0 0
0 0 0
1 1 0 0 0 0 0 0 0 0 0 0 0 0 1 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0 0 1 0 0
0 0 0
1 0 0 0 0 0 1 0 0 0 0 0 0 0 0 0 0 0 0 1 0 0 0 1 0 0 0 0 0 0 0 0 0 0 0 0 0 0 0 0 0 0 0 0 0 0 0 0 0 0 0 0 0 0 0 0 0 0 0 0 0 0 0 1 0
0 0 0
0 1 0 0 1 0 0 0 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 1
0 0 0
0 1 1 0 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0
1 0 0
1 0 0 0 0 1 0 0 0 0 0 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0
0 1 0
0 1 0 0 0 0 0 0 0 0 0 0 0 1 0 0 0 0 0 0 0 0 0 1 0 1 0 0 0 0 0 0 0 0 0 0 0 0 0 0 0 0 0 0 0 0 0 0 0 0 0 0 0 0 0 0 0 0 0 0 0 0 0 0 0
0 0 1 the base graph Hb3 is 1 1 1 1 1 1 1 1 1 1 0 1 1 1 0 0 0 0 0 1 0 1 1 1 0 0 0 0 0 0 0 0 0 0 0 0 0 0 0 0 0 0 0 0 0 0 0 0 0 0 0 0 0 0 0 0 0 0 0 0 0 0 0 0 0
0 0 0
1 1 0 0 0 1 0 0 0 0 1 1 0 1 1 1 1 1 0 1 1 0 0 1 1 0 0 0 0 0 0 0 0 0 0 0 0 0 0 0 0 0 0 0 0 0 0 0 0 0 0 0 0 0 0 0 0 0 0 0 0 0 0 0 0
0 0 0
1 1 0 1 1 1 1 1 1 1 1 0 1 0 0 1 1 1 1 0 0 1 1 0 1 1 0 0 0 0 0 0 0 0 0 0 0 0 0 0 0 0 0 0 0 0 0 0 0 0 0 0 0 0 0 0 0 0 0 0 0 0 0 0 0
0 0 0
1 0 1 1 1 0 0 1 1 1 1 1 1 1 1 1 1 1 1 1 1 1 1 0 0 1 0 0 0 0 0 0 0 0 0 0 0 0 0 0 0 0 0 0 0 0 0 0 0 0 0 0 0 0 0 0 0 0 0 0 0 0 0 0 0
0 0 0
1 1 0 0 0 0 0 0 0 0 0 0 0 0 0 0 0 0 1 0 1 0 0 0 1 0 1 0 0 0 0 0 0 0 0 0 0 0 0 0 0 0 0 0 0 0 0 0 0 0 0 0 0 0 0 0 0 0 0 0 0 0 0 0 0
0 0 0
1 1 1 0 0 0 0 1 0 0 0 0 1 1 0 0 0 0 0 0 0 0 0 0 1 0 0 1 0 0 0 0 0 0 0 0 0 0 0 0 0 0 0 0 0 0 0 0 0 0 0 0 0 0 0 0 0 0 0 0 0 0 0 0 0
0 0 0
0 1 1 0 0 1 0 0 1 0 1 0 0 0 0 0 1 0 1 0 1 0 0 0 1 0 0 0 1 0 0 0 0 0 0 0 0 0 0 0 0 0 0 0 0 0 0 0 0 0 0 0 0 0 0 0 0 0 0 0 0 0 0 0 0
0 0 0
1 1 1 1 0 0 0 0 1 0 0 0 0 0 1 0 1 0 0 0 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0
0 0 0

-continued 1 0 1 0 0 0 0 0 0 0 1 0 1 0 0 0 1 0 0 0 0 1 0 0 1 1 0 0 0 0 1 0 0 0 0 0 0 0 0 0 0 0 0 0 0 0 0 0 0 0 0 0 0 0 0 0 0 0 0 0 0 0 0 0 0
0 0 0
1 1 0 0 1 0 0 0 0 0 1 0 1 0 1 0 0 0 0 0 0 0 0 0 1 0 0 0 0 0 0 1 0 0 0 0 0 0 0 0 0 0 0 0 0 0 0 0 0 0 0 0 0 0 0 0 0 0 0 0 0 0 0 0 0
0 0 0
1 0 1 0 0 0 1 0 0 0 1 0 0 0 1 0 0 1 0 0 0 0 0 0 1 0 0 0 0 0 0 0 1 0 0 0 0 0 0 0 0 0 0 0 0 0 0 0 0 0 0 0 0 0 0 0 0 0 0 0 0 0 0 0 0
0 0 0
0 1 1 0 0 0 1 0 1 0 0 0 1 0 0 0 0 0 0 1 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0
0 0 0
1 1 0 0 0 0 0 0 0 0 0 0 1 0 0 1 0 0 0 0 0 0 1 0 0 0 0 0 0 0 0 0 0 0 1 0 0 0 0 0 0 0 0 0 0 0 0 0 0 0 0 0 0 0 0 0 0 0 0 0 0 0 0 0 0
0 0 0
1 0 1 0 0 1 0 0 1 0 0 0 1 0 0 0 0 0 0 0 0 1 0 0 1 0 0 0 0 0 0 0 0 0 0 1 0 0 0 0 0 0 0 0 0 0 0 0 0 0 0 0 0 0 0 0 0 0 0 0 0 0 0 0 0
0 0 0
1 1 0 1 0 0 0 0 0 0 0 1 0 0 0 0 1 0 0 0 0 0 0 0 0 0 0 0 0 0 0 0 0 0 0 0 1 0 0 0 0 0 0 0 0 0 0 0 0 0 0 0 0 0 0 0 0 0 0 0 0 0 0 0 0
0 0 0
0 1 1 0 0 0 0 0 0 1 0 0 0 0 0 0 1 0 0 0 0 0 0 0 1 0 0 0 0 0 0 0 0 0 0 0 0 1 0 0 0 0 0 0 0 0 0 0 0 0 0 0 0 0 0 0 0 0 0 0 0 0 0 0 0
0 0 0
1 1 0 0 1 0 1 0 0 0 0 0 0 0 0 0 0 0 0 0 1 0 0 0 0 0 0 0 0 0 0 0 0 0 0 0 0 0 1 0 0 0 0 0 0 0 0 0 0 0 0 0 0 0 0 0 0 0 0 0 0 0 0 0 0
0 0 0
1 0 1 0 0 0 0 0 0 0 0 0 0 0 1 0 1 0 0 0 0 0 1 0 0 0 0 0 0 0 0 0 0 0 0 0 0 0 0 1 0 0 0 0 0 0 0 0 0 0 0 0 0 0 0 0 0 0 0 0 0 0 0 0 0
0 0 0
1 1 0 0 0 0 0 1 0 0 0 0 0 1 0 0 0 0 0 0 0 0 0 0 1 0 0 0 0 0 0 0 0 0 0 0 0 0 0 0 1 0 0 0 0 0 0 0 0 0 0 0 0 0 0 0 0 0 0 0 0 0 0 0 0
0 0 0
0 1 0 0 0 0 0 0 1 0 0 0 0 0 0 0 1 0 0 0 0 0 0 0 0 1 0 0 0 0 0 0 0 0 0 0 0 0 0 0 0 1 0 0 0 0 0 0 0 0 0 0 0 0 0 0 0 0 0 0 0 0 0 0 0
0 0 0
1 0 1 0 0 0 0 0 0 1 0 0 0 0 0 0 0 0 0 1 0 0 0 0 1 0 0 0 0 0 0 0 0 0 0 0 0 0 0 0 0 0 1 0 0 0 0 0 0 0 0 0 0 0 0 0 0 0 0 0 0 0 0 0 0
0 0 0
0 1 0 1 0 0 1 0 0 0 0 0 1 0 1 0 0 0 0 0 1 0 0 0 0 0 0 0 0 0 0 0 0 0 0 0 0 0 0 0 0 0 0 1 0 0 0 0 0 0 0 0 0 0 0 0 0 0 0 0 0 0 0 0 0
0 0 0
0 1 0 0 0 0 1 1 0 0 0 0 0 0 0 0 0 0 1 0 0 0 0 0 0 0 0 0 0 0 0 0 0 0 0 0 0 0 0 0 0 0 0 0 1 0 0 0 0 0 0 0 0 0 0 0 0 0 0 0 0 0 0 0 0
0 0 0
1 0 0 0 0 1 0 0 0 0 0 0 0 0 1 0 0 0 0 0 0 0 0 0 1 0 0 0 0 0 0 0 0 0 0 0 0 0 0 0 0 0 0 0 0 1 0 0 0 0 0 0 0 0 0 0 0 0 0 0 0 0 0 0 0
0 0 0
1 1 0 0 0 0 0 0 0 0 0 0 0 0 0 0 0 1 0 0 0 0 0 0 0 1 0 0 0 0 0 0 0 0 0 0 0 0 0 0 0 0 0 0 0 0 1 0 0 0 0 0 0 0 0 0 0 0 0 0 0 0 0 0 0
0 0 0
1 0 0 0 0 0 0 0 1 0 0 0 0 1 0 0 0 0 0 0 1 0 1 0 0 0 0 0 0 0 0 0 0 0 0 0 0 0 0 0 0 0 0 0 0 0 0 1 0 0 0 0 0 0 0 0 0 0 0 0 0 0 0 0 0
0 0 0
1 1 0 0 0 0 0 0 0 0 0 0 0 0 0 0 0 0 0 0 0 0 0 1 1 0 0 0 0 0 0 0 0 0 0 0 0 0 0 0 0 0 0 0 0 0 0 0 1 0 0 0 0 0 0 0 0 0 0 0 0 0 0 0 0
0 0 0
0 1 0 0 0 0 0 0 0 0 1 0 0 0 1 0 0 0 0 0 0 0 0 0 0 1 0 0 0 0 0 0 0 0 0 0 0 0 0 0 0 0 0 0 0 0 0 0 0 1 0 0 0 0 0 0 0 0 0 0 0 0 0 0 0
0 0 0
1 1 0 0 1 0 0 0 0 0 0 0 0 0 0 0 0 0 0 0 0 1 0 0 0 0 0 0 0 0 0 0 0 0 0 0 0 0 0 0 0 0 0 0 0 0 0 0 0 0 1 0 0 0 0 0 0 0 0 0 0 0 0 0 0
0 0 0
0 1 0 0 0 0 1 0 1 0 0 0 0 0 0 0 0 0 0 0 1 0 1 0 0 0 0 0 0 0 0 0 0 0 0 0 0 0 0 0 0 0 0 0 0 0 0 0 0 0 0 1 0 0 0 0 0 0 0 0 0 0 0 0 0
0 0 0
0 1 0 0 0 0 0 0 0 0 1 0 0 0 1 0 0 0 0 0 0 0 0 1 0 0 0 0 0 0 0 0 0 0 0 0 0 0 0 0 0 0 0 0 0 0 0 0 0 0 0 0 1 0 0 0 0 0 0 0 0 0 0 0 0
0 0 0
1 0 0 1 0 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 1 0 0 0 0 0 0 0 0 0 0 0
0 0 0
1 0 0 0 0 0 0 0 0 0 0 0 0 0 0 0 0 0 1 0 0 0 1 0 0 1 0 0 0 0 0 0 0 0 0 0 0 0 0 0 0 0 0 0 0 0 0 0 0 0 0 0 0 0 1 0 0 0 0 0 0 0 0 0 0
0 0 0
1 1 0 0 0 0 0 0 0 1 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 1 0 0 0 0 0 0 0 0 0
0 0 0
0 1 0 1 0 1 0 0 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0 1 0 0 0 0 0 0 0 0
0 0 0
1 0 0 0 0 0 0 1 0 0 0 0 1 0 0 0 0 0 0 0 0 1 0 0 0 0 0 0 0 0 0 0 0 0 0 0 0 0 0 0 0 0 0 0 0 0 0 0 0 0 0 0 0 0 0 0 0 1 0 0 0 0 0 0 0
0 0 0
0 1 0 0 0 0 0 0 0 0 0 0 0 1 0 0 0 0 0 0 0 0 1 0 0 1 0 0 0 0 0 0 0 0 0 0 0 0 0 0 0 0 0 0 0 0 0 0 0 0 0 0 0 0 0 0 0 0 1 0 0 0 0 0 0
0 0 0
1 0 1 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 1 0 0 0 0 0
0 0 0
0 1 0 0 0 0 1 0 0 0 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 1 0 0 0 0
0 0 0
1 1 0 0 1 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 1 0 0 0
0 0 0
0 1 0 0 0 0 1 0 0 0 0 1 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 0 1 0 0
0 0 0
1 0 0 1 0 0 0 0 0 0 0 0 0 0 0 0 0 0 1 0 0 0 0 0 0 1 0 0 0 0 0 0 0 0 0 0 0 0 0 0 0 0 0 0 0 0 0 0 0 0 0 0 0 0 0 0 0 0 0 0 0 0 0 1 0
0 0 0
0 1 0 0 0 0 1 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 1
0 0 0
1 0 0 0 1 0 0 1 0 0 0 0 0 0 1 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0
1 0 0
1 0 0 0 0 1 0 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0
0 1 0
0 1 0 0 0 0 1 0 0 0 0 0 0 0 1 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0
0 0 1 the base graph Hb4 is 1 1 1 1 1 1 1 1 1 1 1 1 1 1 1 1 1 1 1 1 1 1 1 1 0 0 0 0 0 0 0 0 0 0 0 0 0 0 0 0 0 0 0 0 0 0 0 0 0 0 0 0 0 0 0 0 0 0 0 0 0 0 0 0 0
0 0 0
1 0 0 1 1 1 1 1 1 1 1 1 1 1 1 0 1 1 1 1 1 1 1 1 1 0 0 0 0 0 0 0 0 0 0 0 0 0 0 0 0 0 0 0 0 0 0 0 0 0 0 0 0 0 0 0 0 0 0 0 0 0 0 0 0
0 0 0

-continued 1 1 0 0 0 0 0 0 0 0 0 0 0 0 0 0 0 0 0 0 0 0 0 0 1 1 0 0 0 0 0 0 0 0 0 0 0 0 0 0 0 0 0 0 0 0 0 0 0 0 0 0 0 0 0 0 0 0 0 0 0 0 0 0 0
0 0 0
0 1 1 1 1 1 1 1 1 0 1 1 1 1 1 1 1 1 1 1 1 1 1 0 0 1 0 0 0 0 0 0 0 0 0 0 0 0 0 0 0 0 0 0 0 0 0 0 0 0 0 0 0 0 0 0 0 0 0 0 0 0 0 0 0
0 0 0
1 1 0 0 0 0 1 0 0 0 1 0 0 0 0 1 1 1 0 0 0 1 0 1 0 0 1 0 0 0 0 0 0 0 0 0 0 0 0 0 0 0 0 0 0 0 0 0 0 0 0 0 0 0 0 0 0 0 0 0 0 0 0 0 0
0 0 0
1 1 1 0 0 0 1 0 0 0 1 0 0 0 0 0 1 1 0 0 0 1 0 1 1 0 0 1 0 0 0 0 0 0 0 0 0 0 0 0 0 0 0 0 0 0 0 0 0 0 0 0 0 0 0 0 0 0 0 0 0 0 0 0 0
0 0 0
1 0 0 0 0 0 1 0 0 0 1 0 1 0 0 0 1 0 0 1 0 1 0 1 0 1 0 0 1 0 0 0 0 0 0 0 0 0 0 0 0 0 0 0 0 0 0 0 0 0 0 0 0 0 0 0 0 0 0 0 0 0 0 0 0
0 0 0
0 1 0 1 0 0 1 1 0 1 1 0 0 0 1 0 0 0 0 0 0 1 0 1 1 0 0 0 0 1 0 0 0 0 0 0 0 0 0 0 0 0 0 0 0 0 0 0 0 0 0 0 0 0 0 0 0 0 0 0 0 0 0 0 0
0 0 0
0 1 0 1 0 1 1 0 0 1 1 0 0 0 1 0 0 0 0 1 0 0 0 1 0 0 0 0 0 0 1 0 0 0 0 0 0 0 0 0 0 0 0 0 0 0 0 0 0 0 0 0 0 0 0 0 0 0 0 0 0 0 0 0 0
0 0 0
1 1 0 0 1 0 1 0 0 0 0 0 0 0 0 0 0 0 0 1 0 0 1 1 0 0 0 0 0 0 0 1 0 0 0 0 0 0 0 0 0 0 0 0 0 0 0 0 0 0 0 0 0 0 0 0 0 0 0 0 0 0 0 0 0
0 0 0
0 1 0 1 0 0 1 0 1 0 1 0 0 0 1 0 0 0 0 1 0 0 0 0 0 0 0 0 0 0 0 0 1 0 0 0 0 0 0 0 0 0 0 0 0 0 0 0 0 0 0 0 0 0 0 0 0 0 0 0 0 0 0 0 0
0 0 0
0 1 0 0 0 0 1 1 0 0 0 0 0 0 1 0 0 0 0 0 1 0 0 1 0 0 0 0 0 0 0 0 0 1 0 0 0 0 0 0 0 0 0 0 0 0 0 0 0 0 0 0 0 0 0 0 0 0 0 0 0 0 0 0 0
0 0 0
1 1 0 0 0 0 0 0 0 0 0 0 1 0 1 0 0 0 1 1 0 0 0 0 0 0 0 0 0 0 0 0 0 0 1 0 0 0 0 0 0 0 0 0 0 0 0 0 0 0 0 0 0 0 0 0 0 0 0 0 0 0 0 0 0
0 0 0
0 1 0 0 0 0 1 0 1 0 0 0 0 0 1 0 0 0 0 1 0 0 0 0 0 0 0 0 0 0 0 0 0 0 0 1 0 0 0 0 0 0 0 0 0 0 0 0 0 0 0 0 0 0 0 0 0 0 0 0 0 0 0 0 0
0 0 0
1 1 0 0 0 0 0 0 0 0 1 1 0 0 0 0 0 0 0 1 0 0 0 1 0 0 0 0 0 0 0 0 0 0 0 0 1 0 0 0 0 0 0 0 0 0 0 0 0 0 0 0 0 0 0 0 0 0 0 0 0 0 0 0 0
0 0 0
1 1 1 0 0 0 1 0 1 0 0 0 0 0 0 1 0 0 0 1 0 0 0 0 0 0 0 0 0 0 0 0 0 0 0 0 0 1 0 0 0 0 0 0 0 0 0 0 0 0 0 0 0 0 0 0 0 0 0 0 0 0 0 0 0
0 0 0
1 1 0 0 0 0 1 0 0 0 0 0 0 0 0 0 0 0 0 0 0 1 1 0 0 0 0 0 0 0 0 0 0 0 0 0 0 0 1 0 0 0 0 0 0 0 0 0 0 0 0 0 0 0 0 0 0 0 0 0 0 0 0 0 0
0 0 0
1 1 0 0 0 1 0 0 0 0 0 0 0 0 1 0 0 0 0 0 1 0 0 1 0 0 0 0 0 0 0 0 0 0 0 0 0 0 0 1 0 0 0 0 0 0 0 0 0 0 0 0 0 0 0 0 0 0 0 0 0 0 0 0 0
0 0 0
0 1 1 0 0 0 0 0 0 0 0 0 0 0 0 0 1 0 0 1 0 0 1 0 0 0 0 0 0 0 0 0 0 0 0 0 0 0 0 0 1 0 0 0 0 0 0 0 0 0 0 0 0 0 0 0 0 0 0 0 0 0 0 0 0
0 0 0
0 1 1 1 0 0 0 0 0 0 0 0 0 0 1 0 0 0 0 0 0 0 0 0 0 0 0 0 0 0 0 0 0 0 0 0 0 0 0 0 0 1 0 0 0 0 0 0 0 0 0 0 0 0 0 0 0 0 0 0 0 0 0 0 0
0 0 0
1 1 0 0 0 0 0 1 0 0 0 0 0 0 0 0 0 1 0 0 0 0 0 0 0 0 0 0 0 0 0 0 0 0 0 0 0 0 0 0 0 0 1 0 0 0 0 0 0 0 0 0 0 0 0 0 0 0 0 0 0 0 0 0 0
0 0 0
1 1 1 0 0 0 0 0 0 0 0 1 0 1 0 0 0 0 0 0 0 0 0 0 0 0 0 0 0 0 0 0 0 0 0 0 0 0 0 0 0 0 0 1 0 0 0 0 0 0 0 0 0 0 0 0 0 0 0 0 0 0 0 0 0
0 0 0
1 1 1 0 1 0 0 0 0 0 0 0 0 0 0 0 0 0 0 1 0 0 0 0 0 0 0 0 0 0 0 0 0 0 0 0 0 0 0 0 0 0 0 0 1 0 0 0 0 0 0 0 0 0 0 0 0 0 0 0 0 0 0 0 0
0 0 0
1 1 1 0 0 1 0 0 0 0 0 0 0 0 0 0 0 0 0 0 0 1 0 0 0 0 0 0 0 0 0 0 0 0 0 0 0 0 0 0 0 0 0 0 0 1 0 0 0 0 0 0 0 0 0 0 0 0 0 0 0 0 0 0 0
0 0 0
1 1 0 0 0 1 0 0 0 0 0 0 1 0 0 0 0 0 1 0 0 0 0 0 0 0 0 0 0 0 0 0 0 0 0 0 0 0 0 0 0 0 0 0 0 0 1 0 0 0 0 0 0 0 0 0 0 0 0 0 0 0 0 0 0
0 0 0
1 1 0 1 0 0 0 0 0 1 0 0 0 0 0 0 0 0 0 0 0 0 1 0 0 0 0 0 0 0 0 0 0 0 0 0 0 0 0 0 0 0 0 0 0 0 0 1 0 0 0 0 0 0 0 0 0 0 0 0 0 0 0 0 0
0 0 0
1 1 0 0 0 0 0 1 0 0 0 0 0 0 0 0 0 0 0 1 0 0 1 0 0 0 0 0 0 0 0 0 0 0 0 0 0 0 0 0 0 0 0 0 0 0 0 0 1 0 0 0 0 0 0 0 0 0 0 0 0 0 0 0 0
0 0 0
1 1 1 0 0 0 0 0 0 0 0 1 0 0 0 0 1 0 0 0 0 0 0 0 0 0 0 0 0 0 0 0 0 0 0 0 0 0 0 0 0 0 0 0 0 0 0 0 0 1 0 0 0 0 0 0 0 0 0 0 0 0 0 0 0
0 0 0
0 1 1 0 0 0 0 0 0 0 0 0 0 0 0 0 0 0 0 0 0 0 0 0 1 0 0 0 0 0 0 0 0 0 0 0 0 0 0 0 0 0 0 0 0 0 0 0 0 0 1 0 0 0 0 0 0 0 0 0 0 0 0 0 0
0 0 0
1 1 0 1 0 0 0 0 0 0 0 0 0 0 0 1 0 0 0 0 0 0 1 0 0 0 0 0 0 0 0 0 0 0 0 0 0 0 0 0 0 0 0 0 0 0 0 0 0 0 0 1 0 0 0 0 0 0 0 0 0 0 0 0 0
0 0 0
1 0 1 0 1 0 0 0 0 0 0 0 0 0 0 0 0 1 0 0 0 0 0 0 0 0 0 0 0 0 0 0 0 0 0 0 0 0 0 0 0 0 0 0 0 0 0 0 0 0 0 0 1 0 0 0 0 0 0 0 0 0 0 0 0
0 0 0
0 1 0 0 0 0 0 0 0 0 0 0 0 1 0 0 0 0 0 0 0 0 1 0 0 0 0 0 0 0 0 0 0 0 0 0 0 0 0 0 0 0 0 0 0 0 0 0 0 0 0 0 0 1 0 0 0 0 0 0 0 0 0 0 0
0 0 0
1 0 0 0 0 0 0 0 1 1 1 0 0 0 0 0 0 0 0 0 0 0 0 0 0 0 0 0 0 0 0 0 0 0 0 0 0 0 0 0 0 0 0 0 0 0 0 0 0 0 0 0 0 0 1 0 0 0 0 0 0 0 0 0 0
0 0 0
1 1 0 0 0 0 0 0 0 0 0 0 1 0 0 0 0 0 0 0 0 1 1 0 0 0 0 0 0 0 0 0 0 0 0 0 0 0 0 0 0 0 0 0 0 0 0 0 0 0 0 0 0 0 0 1 0 0 0 0 0 0 0 0 0
0 0 0
0 1 0 1 0 0 0 0 0 0 1 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0 1 0 0 0 0 0 0 0 0
0 0 0
1 0 0 0 1 1 0 0 0 1 1 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 1 0 0 0 0 0 0 0
0 0 0
1 0 0 0 0 1 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 1 0 0 0 0 0 0
0 0 0
1 1 0 0 0 0 1 0 0 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 1 0 0 0 0 0
0 0 0
1 0 0 0 0 0 0 1 0 1 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 1 0 0 0 0
0 0 0
1 1 0 0 0 1 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 1 0 0 0
0 0 0
1 0 0 0 0 0 0 0 0 1 0 1 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0 1 0 0
0 0 0
1 0 0 0 0 0 0 1 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 1 0
0 0 0
1 0 1 0 0 0 0 0 0 0 0 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0 0 1
0 0 0
1 0 0 0 0 0 0 1 0 1 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0
1 0 0

-continued

| |
|---|
| 1 0 0 0 1 1 0 0 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0 0 1 0 |
| 1 1 1 0 0 0 0 0 0 0 0 0 0 1 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 1 |

the base graph Hb5 is

| |
|---|
| 0 1 1 1 1 1 1 1 1 1 1 1 1 0 1 1 0 0 0 0 0 0 0 1 1 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 |
| 1 1 0 1 1 1 1 1 0 0 0 0 0 0 0 0 1 0 1 1 1 1 0 0 1 1 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 |
| 1 1 0 1 0 0 0 0 1 1 1 1 1 1 0 0 0 1 0 1 1 0 0 1 0 1 1 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 |
| 1 0 0 0 1 1 0 0 0 0 0 1 1 1 1 1 1 1 1 0 1 1 0 0 0 0 1 1 0 0 0 0 0 0 0 0 0 0 0 0 0 0 0 0 0 0 0 0 0 0 0 0 0 0 0 0 0 0 0 0 0 0 0 0 0 0 0 0 0 0 0 0 |
| 1 1 1 0 0 0 1 1 1 1 1 0 0 1 1 1 1 1 1 1 0 1 0 1 0 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0 0 |
| 1 1 0 0 0 0 0 0 0 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 |
| 1 1 1 0 0 0 0 0 0 0 1 0 0 0 0 0 0 1 0 0 0 0 0 1 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0 |
| 0 1 0 0 0 1 0 1 0 1 0 0 0 1 0 0 1 0 0 0 0 0 1 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 |
| 1 1 0 0 0 0 1 0 1 0 0 0 0 0 0 1 0 0 0 0 1 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 0 |
| 1 0 0 0 0 0 0 0 0 0 1 0 1 0 1 0 1 0 0 0 1 0 1 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 |
| 1 1 0 1 0 0 0 0 0 1 0 1 0 0 0 0 0 1 0 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0 0 |
| 1 1 0 0 1 0 0 0 0 0 1 0 0 0 1 0 0 0 0 1 0 0 0 0 1 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0 |
| 0 1 0 0 0 0 0 1 0 1 0 0 0 0 0 0 1 0 0 0 0 0 1 0 0 0 0 1 0 0 0 0 0 0 1 0 0 0 0 0 0 0 0 0 0 0 0 0 0 0 0 0 0 0 0 0 0 0 0 0 0 0 0 0 0 0 0 0 0 0 0 0 |
| 1 1 1 0 0 0 0 0 0 0 0 0 0 1 0 0 0 1 0 1 0 0 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 |
| 1 0 0 0 0 1 0 1 0 0 0 0 0 0 1 0 0 0 1 0 0 0 0 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 |
| 0 1 0 0 1 0 0 0 0 0 0 0 0 0 0 0 0 0 0 0 0 0 0 1 0 0 1 0 0 0 0 0 0 0 0 0 0 1 0 0 0 0 0 0 0 0 0 0 0 0 0 0 0 0 0 0 0 0 0 0 0 0 0 0 0 0 0 0 0 0 0 0 |
| 1 0 0 0 0 0 0 0 0 1 0 0 0 0 0 1 1 0 0 1 0 0 0 0 0 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0 0 0 |
| 0 1 0 0 0 0 1 0 0 0 1 1 0 0 0 0 0 0 0 0 0 0 0 0 0 0 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0 0 |
| 1 0 0 1 0 0 0 0 0 0 0 0 0 1 0 0 1 1 0 0 0 0 0 0 0 0 0 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0 |
| 0 1 0 0 0 0 0 1 1 0 0 0 0 0 0 0 0 0 0 0 0 0 0 1 0 0 0 0 0 0 0 0 0 0 0 0 0 0 0 0 0 1 0 0 0 0 0 0 0 0 0 0 0 0 0 0 0 0 0 0 0 0 0 0 0 0 0 0 0 0 0 0 |
| 1 0 0 0 0 0 0 0 0 0 0 0 1 0 1 0 0 1 0 0 0 0 0 0 0 0 0 0 0 0 0 0 0 0 0 0 0 0 0 0 0 0 1 0 0 0 0 0 0 0 0 0 0 0 0 0 0 0 0 0 0 0 0 0 0 0 0 0 0 0 0 0 |
| 0 1 0 1 0 1 0 0 0 1 0 0 0 0 0 0 0 0 0 0 0 1 0 0 0 0 0 0 0 0 0 0 0 0 0 0 0 0 0 0 0 0 0 1 0 0 0 0 0 0 0 0 0 0 0 0 0 0 0 0 0 0 0 0 0 0 0 0 0 0 0 0 |
| 1 0 0 0 0 0 0 0 0 0 1 0 0 0 0 0 1 0 0 0 0 1 0 0 0 1 0 0 0 0 0 0 0 0 0 0 0 0 0 0 0 0 0 0 1 0 0 0 0 0 0 0 0 0 0 0 0 0 0 0 0 0 0 0 0 0 0 0 0 0 0 0 |
| 0 1 0 0 0 0 0 0 0 0 0 0 0 1 0 0 0 0 1 0 0 0 0 0 1 0 0 0 0 0 0 0 0 0 0 0 0 0 0 0 0 0 0 0 0 1 0 0 0 0 0 0 0 0 0 0 0 0 0 0 0 0 0 0 0 0 0 0 0 0 0 0 |
| 1 0 0 0 1 0 1 1 0 0 0 0 0 0 0 0 0 0 0 0 0 0 0 0 0 0 0 0 0 0 0 0 0 0 0 0 0 0 0 0 0 0 0 0 0 0 1 0 0 0 0 0 0 0 0 0 0 0 0 0 0 0 0 0 0 0 0 0 0 0 0 0 |
| 0 1 0 1 0 0 0 0 0 0 0 0 0 0 0 0 0 1 0 0 0 0 0 0 0 1 0 0 0 0 0 0 0 0 0 0 0 0 0 0 0 0 0 0 0 0 0 1 0 0 0 0 0 0 0 0 0 0 0 0 0 0 0 0 0 0 0 0 0 0 0 0 |
| 1 0 0 0 1 0 0 0 0 0 0 1 0 0 0 0 0 0 0 0 1 0 0 0 0 0 0 0 0 0 0 0 0 0 0 0 0 0 0 0 0 0 0 0 0 0 0 0 1 0 0 0 0 0 0 0 0 0 0 0 0 0 0 0 0 0 0 0 0 0 0 0 |
| 0 1 0 0 0 1 0 0 0 0 0 0 0 0 0 0 1 0 0 0 0 0 0 0 0 0 1 0 0 0 0 0 0 0 0 0 0 0 0 0 0 0 0 0 0 0 0 0 0 1 0 0 0 0 0 0 0 0 0 0 0 0 0 0 0 0 0 0 0 0 0 0 |
| 1 0 0 0 0 0 0 0 0 1 1 0 1 0 0 0 0 0 0 0 0 0 0 0 0 0 0 0 0 0 0 0 0 0 0 0 0 0 0 0 0 0 0 0 0 0 0 0 0 0 1 0 0 0 0 0 0 0 0 0 0 0 0 0 0 0 0 0 0 0 0 0 |
| 0 1 0 1 0 0 0 1 1 0 0 0 0 0 0 0 0 0 0 0 0 0 0 0 0 0 0 0 0 0 0 0 0 0 0 0 0 0 0 0 0 0 0 0 0 0 0 0 0 0 0 1 0 0 0 0 0 0 0 0 0 0 0 0 0 0 0 0 0 0 0 0 |
| 1 0 1 0 0 0 0 0 0 0 0 0 0 0 0 0 0 0 0 0 1 0 0 1 0 0 0 0 0 0 0 0 0 0 0 0 0 0 0 0 0 0 0 0 0 0 0 0 0 0 0 0 1 0 0 0 0 0 0 0 0 0 0 0 0 0 0 0 0 0 0 0 |
| 0 1 0 0 0 0 0 0 0 1 1 0 0 0 0 0 0 0 0 0 0 0 0 0 0 1 0 0 0 0 0 0 0 0 0 0 0 0 0 0 0 0 0 0 0 0 0 0 0 0 0 0 0 1 0 0 0 0 0 0 0 0 0 0 0 0 0 0 0 0 0 0 |
| 1 0 0 0 0 0 1 0 0 0 0 0 0 0 1 0 0 0 0 1 0 0 0 0 0 0 0 0 0 0 0 0 0 0 0 0 0 0 0 0 0 0 0 0 0 0 0 0 0 0 0 0 0 0 1 0 0 0 0 0 0 0 0 0 0 0 0 0 0 0 0 0 |
| 0 1 0 1 0 0 0 0 0 0 0 0 0 0 0 1 0 0 0 1 0 0 0 0 0 0 0 0 0 0 0 0 0 0 0 0 0 0 0 0 0 0 0 0 0 0 0 0 0 0 0 0 0 0 0 1 0 0 0 0 0 0 0 0 0 0 0 0 0 0 0 0 |
| 1 0 0 0 0 0 0 0 0 0 1 0 0 0 0 0 1 1 0 0 0 0 0 0 0 0 1 0 0 0 0 0 0 0 0 0 0 0 0 0 0 0 0 0 0 0 0 0 0 0 0 0 0 0 0 0 1 0 0 0 0 0 0 0 0 0 0 0 0 0 0 0 |
| 0 1 0 0 0 1 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 1 0 0 0 0 0 0 0 0 0 0 0 0 0 0 |
| 1 0 0 0 0 0 0 0 0 0 0 0 0 0 0 0 1 1 0 0 0 0 0 0 0 0 1 0 0 0 0 0 0 0 0 0 0 0 0 0 0 0 0 0 0 0 0 0 0 0 0 0 0 0 0 0 0 0 1 0 0 0 0 0 0 0 0 0 0 0 0 0 |
| 0 1 0 0 0 0 0 1 0 0 1 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 1 0 0 0 0 0 0 0 0 0 0 0 0 |

-continued

| |
|---|
| 1 0 0 0 1 0 0 0 0 0 0 0 0 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0 0 0 1 0 0 0 0 0 0 0 0 0 0 0 |
| 0 1 0 0 0 0 0 0 0 0 0 0 0 1 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 1 0 0 0 0 0 0 0 0 0 0 |
| 1 0 0 0 0 0 0 0 0 0 1 0 0 0 0 0 0 1 0 0 0 0 0 0 0 0 0 1 0 0 0 0 0 0 0 0 0 0 0 0 0 0 0 0 0 0 0 0 0 0 0 0 0 0 0 0 0 0 0 0 0 0 1 0 0 0 0 0 0 0 0 0 |
| 0 1 0 0 0 0 0 1 0 1 0 0 0 0 0 0 0 0 0 0 0 1 0 0 0 1 0 0 0 0 0 0 0 0 0 0 0 0 0 0 0 0 0 0 0 0 0 0 0 0 0 0 0 0 0 0 0 0 0 0 0 0 0 1 0 0 0 0 0 0 0 0 |
| 1 0 0 0 0 0 1 0 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 1 0 0 0 0 0 0 0 |
| 0 1 0 0 0 0 0 0 0 0 0 0 0 0 0 0 0 1 0 1 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 1 0 0 0 0 0 0 |
| 1 0 0 0 0 0 0 0 0 0 0 1 0 0 0 0 0 0 1 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 1 0 0 0 0 0 |
| 0 1 0 0 0 0 0 1 0 0 0 0 0 0 0 0 1 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 1 0 0 0 0 |
| 1 0 0 0 0 0 0 0 0 1 0 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 1 0 0 0 |
| 0 1 0 0 0 0 0 0 1 0 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 1 0 0 |
| 1 0 1 1 0 0 0 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 1 0 |
| 0 1 0 0 0 1 0 0 0 0 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 1 |

the base graph Hb6 is

| |
|---|
| 1 0 1 1 1 0 1 1 1 0 1 1 0 1 1 1 1 0 1 1 1 1 1 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 |
| 0 1 0 0 1 1 1 0 1 1 1 1 1 1 0 1 1 1 0 1 1 1 0 1 1 0 0 0 0 0 0 0 0 0 0 0 0 0 0 0 0 0 0 0 0 0 0 0 0 0 0 0 0 0 0 0 0 0 0 0 0 0 0 0 0 0 0 0 |
| 1 1 1 1 1 1 0 1 1 1 0 1 1 0 1 1 0 1 1 1 0 0 1 0 1 1 0 0 0 0 0 0 0 0 0 0 0 0 0 0 0 0 0 0 0 0 0 0 0 0 0 0 0 0 0 0 0 0 0 0 0 0 0 0 0 0 0 0 |
| 1 1 1 1 0 1 1 1 0 1 1 0 1 1 1 0 1 1 1 0 1 1 1 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 |
| 1 1 0 0 0 0 0 0 0 0 0 0 0 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 0 |
| 1 1 0 0 0 0 0 0 0 1 1 0 0 0 1 0 0 0 0 0 1 1 0 0 0 1 1 1 0 0 0 0 0 0 0 0 0 0 0 0 0 0 0 0 0 0 0 0 0 0 0 0 0 0 0 0 0 0 0 0 0 0 0 0 0 0 0 0 |
| 1 1 0 0 0 0 1 0 0 0 0 0 0 0 0 0 1 0 0 1 1 0 0 0 1 0 1 0 1 0 0 0 0 0 0 0 0 0 0 0 0 0 0 0 0 0 0 0 0 0 0 0 0 0 0 0 0 0 0 0 0 0 0 0 0 0 0 0 |
| 1 1 0 0 1 0 0 0 0 0 0 1 0 0 0 1 1 0 0 0 0 0 0 0 1 0 1 0 0 1 0 0 0 0 0 0 0 0 0 0 0 0 0 0 0 0 0 0 0 0 0 0 0 0 0 0 0 0 0 0 0 0 0 0 0 0 0 0 |
| 1 0 0 0 1 0 1 0 0 0 0 0 0 0 1 0 0 0 0 0 0 0 1 0 0 0 1 0 0 0 1 0 0 0 0 0 0 0 0 0 0 0 0 0 0 0 0 0 0 0 0 0 0 0 0 0 0 0 0 0 0 0 0 0 0 0 0 0 |
| 0 1 0 1 0 0 0 0 0 1 1 1 0 0 0 0 0 0 1 0 0 1 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 |
| 1 1 0 0 1 0 0 0 0 1 0 1 0 0 0 0 0 0 0 0 0 1 0 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 |
| 0 0 1 0 0 1 1 0 1 0 1 0 0 0 0 0 0 0 0 0 0 0 0 0 1 0 1 0 0 0 0 0 0 1 0 0 0 0 0 0 0 0 0 0 0 0 0 0 0 0 0 0 0 0 0 0 0 0 0 0 0 0 0 0 0 0 0 0 |
| 1 0 0 0 0 0 1 0 1 0 0 0 0 0 0 0 0 0 1 0 0 0 0 0 1 0 1 0 0 0 0 0 0 0 1 0 0 0 0 0 0 0 0 0 0 0 0 0 0 0 0 0 0 0 0 0 0 0 0 0 0 0 0 0 0 0 0 0 |
| 0 1 1 1 0 0 0 0 0 1 0 0 0 0 1 0 0 0 0 1 0 0 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0 0 |
| 0 1 0 1 0 1 0 0 0 1 0 0 0 0 1 0 0 0 1 0 0 0 0 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0 |
| 1 0 0 0 0 0 1 0 0 0 0 0 0 0 0 1 0 0 0 1 0 0 1 0 0 0 1 0 0 0 0 0 0 0 0 0 0 1 0 0 0 0 0 0 0 0 0 0 0 0 0 0 0 0 0 0 0 0 0 0 0 0 0 0 0 0 0 0 |
| 1 1 0 0 0 0 0 1 1 1 0 0 0 0 0 0 0 0 0 0 0 0 0 0 0 0 0 0 0 0 0 0 0 0 0 0 0 0 1 0 0 0 0 0 0 0 0 0 0 0 0 0 0 0 0 0 0 0 0 0 0 0 0 0 0 0 0 0 |
| 0 0 0 1 0 0 0 0 0 0 1 1 0 0 1 0 1 0 0 0 0 0 0 0 0 0 0 0 0 0 0 0 0 0 0 0 0 0 0 1 0 0 0 0 0 0 0 0 0 0 0 0 0 0 0 0 0 0 0 0 0 0 0 0 0 0 0 0 |
| 0 1 0 0 0 0 1 0 0 0 1 0 0 0 0 0 0 0 0 0 0 0 0 0 1 1 0 0 0 0 0 0 0 0 0 0 0 0 0 0 1 0 0 0 0 0 0 0 0 0 0 0 0 0 0 0 0 0 0 0 0 0 0 0 0 0 0 0 |
| 1 0 0 0 0 0 0 1 0 0 0 0 0 0 0 0 1 0 0 0 0 1 0 0 0 0 1 0 0 0 0 0 0 0 0 0 0 0 0 0 0 1 0 0 0 0 0 0 0 0 0 0 0 0 0 0 0 0 0 0 0 0 0 0 0 0 0 0 |
| 0 1 0 0 0 0 0 0 0 0 0 0 0 0 1 0 0 0 0 1 0 0 0 0 1 0 1 0 0 0 0 0 0 0 0 0 0 0 0 0 0 0 1 0 0 0 0 0 0 0 0 0 0 0 0 0 0 0 0 0 0 0 0 0 0 0 0 0 |
| 1 0 0 0 0 0 0 0 1 0 0 0 0 1 0 0 0 0 0 0 0 0 1 0 0 1 0 0 0 0 0 0 0 0 0 0 0 0 0 0 0 0 0 1 0 0 0 0 0 0 0 0 0 0 0 0 0 0 0 0 0 0 0 0 0 0 0 0 |
| 0 1 0 0 0 0 1 0 0 0 0 0 0 0 0 0 1 0 0 0 1 0 0 0 0 0 1 0 0 0 0 0 0 0 0 0 0 0 0 0 0 0 0 0 1 0 0 0 0 0 0 0 0 0 0 0 0 0 0 0 0 0 0 0 0 0 0 0 |
| 1 0 0 0 1 1 0 0 0 0 0 1 0 0 1 0 0 0 0 0 0 0 0 0 0 0 0 0 0 0 0 0 0 0 0 0 0 0 0 0 0 0 0 0 0 1 0 0 0 0 0 0 0 0 0 0 0 0 0 0 0 0 0 0 0 0 0 0 |
| 0 1 0 1 0 0 0 0 0 1 0 0 0 0 0 0 0 0 0 0 1 0 0 1 0 0 0 0 0 0 0 0 0 0 0 0 0 0 0 0 0 0 0 0 0 0 1 0 0 0 0 0 0 0 0 0 0 0 0 0 0 0 0 0 0 0 0 0 |
| 1 0 0 0 0 0 1 0 0 0 0 0 0 1 1 0 0 0 0 0 0 0 0 0 0 0 1 0 0 0 0 0 0 0 0 0 0 0 0 0 0 0 0 0 0 0 0 1 0 0 0 0 0 0 0 0 0 0 0 0 0 0 0 0 0 0 0 0 |
| 1 0 0 1 1 0 0 0 0 0 0 0 0 0 0 0 0 1 0 0 0 0 0 0 0 0 0 0 0 0 0 0 0 0 0 0 0 0 0 0 0 0 0 0 0 0 0 0 1 0 0 0 0 0 0 0 0 0 0 0 0 0 0 0 0 0 0 0 |
| 0 1 0 0 0 0 1 0 0 1 0 0 0 0 0 1 0 0 0 0 0 0 0 0 0 0 1 0 0 0 0 0 0 0 0 0 0 0 0 0 0 0 0 0 0 0 0 0 0 1 0 0 0 0 0 0 0 0 0 0 0 0 0 0 0 0 0 0 |

-continued

| |
|---|
| 0 1 0 0 0 0 0 0 0 0 0 0 0 0 0 0 0 0 0 1 0 0 0 0 1 0 1 0 0 0 0 0 0 0 0 0 0 0 0 0 0 0 0 0 0 0 0 0 0 0 1 0 0 0 0 0 0 0 0 0 0 0 0 0 0<br>0 0 0 |
| 1 0 0 0 0 0 0 0 0 0 0 0 1 0 0 1 0 0 0 0 1 0 0 0 0 0 0 0 0 0 0 0 0 0 0 0 0 0 0 0 0 0 0 0 0 0 0 0 0 0 0 1 0 0 0 0 0 0 0 0 0 0 0 0 0<br>0 0 0 |
| 0 1 0 1 0 0 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0 0 1 0 0 0 0 0 0 0 0 0 0 0 0<br>0 0 0 |
| 1 0 0 0 0 0 0 0 0 0 1 0 0 0 0 0 0 0 1 0 0 1 0 0 1 0 0 0 0 0 0 0 0 0 0 0 0 0 0 0 0 0 0 0 0 0 0 0 0 0 0 0 0 1 0 0 0 0 0 0 0 0 0 0 0<br>0 0 0 |
| 0 0 0 0 0 0 0 0 0 0 0 0 0 0 1 0 0 0 0 0 0 0 0 0 1 1 1 0 0 0 0 0 0 0 0 0 0 0 0 0 0 0 0 0 0 0 0 0 0 0 0 0 0 0 1 0 0 0 0 0 0 0 0 0 0<br>0 0 0 |
| 1 1 0 0 0 0 0 0 0 0 0 0 0 0 0 0 0 0 0 0 0 0 1 1 0 0 0 0 0 0 0 0 0 0 0 0 0 0 0 0 0 0 0 0 0 0 0 0 0 0 0 0 0 0 0 1 0 0 0 0 0 0 0 0 0<br>0 0 0 |
| 1 0 0 0 0 0 0 0 1 0 1 0 0 0 0 0 1 0 0 0 0 0 0 0 0 0 0 0 0 0 0 0 0 0 0 0 0 0 0 0 0 0 0 0 0 0 0 0 0 0 0 0 0 0 0 0 1 0 0 0 0 0 0 0 0<br>0 0 0 |
| 0 1 0 0 0 0 0 0 0 0 0 0 0 0 1 0 0 0 0 0 0 0 0 0 0 1 1 0 0 0 0 0 0 0 0 0 0 0 0 0 0 0 0 0 0 0 0 0 0 0 0 0 0 0 0 0 0 1 0 0 0 0 0 0 0<br>0 0 0 |
| 1 0 1 0 0 1 0 0 0 0 0 0 0 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0 1 0 0 0 0 0 0<br>0 0 0 |
| 0 1 0 0 0 0 0 0 1 0 0 0 0 0 0 0 0 0 0 0 0 0 1 0 1 0 0 0 0 0 0 0 0 0 0 0 0 0 0 0 0 0 0 0 0 0 0 0 0 0 0 0 0 0 0 0 0 0 0 1 0 0 0 0 0<br>0 0 0 |
| 1 0 0 0 0 0 0 0 0 0 0 0 0 0 0 0 0 0 0 0 0 0 0 1 0 0 1 0 0 0 0 0 0 0 0 0 0 0 0 0 0 0 0 0 0 0 0 0 0 0 0 0 0 0 0 0 0 0 0 0 1 0 0 0 0<br>0 0 0 |
| 0 1 1 0 0 0 0 0 0 0 1 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 1 0 0 0<br>0 0 0 |
| 0 1 0 0 0 0 0 1 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 1 0 0<br>0 0 0 |
| 1 0 0 0 1 0 0 0 0 0 0 0 0 0 0 0 0 0 0 0 0 1 0 1 0 0 0 0 0 0 0 0 0 0 0 0 0 0 0 0 0 0 0 0 0 0 0 0 0 0 0 0 0 0 0 0 0 0 0 0 0 0 0 1 0<br>0 0 0 |
| 0 1 0 0 1 0 0 0 0 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 0 1<br>0 0 0 |
| 1 0 0 0 0 0 0 0 0 0 0 1 0 0 0 0 0 1 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0 0<br>1 0 0 |
| 0 1 0 0 0 1 0 0 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0<br>0 1 0 |
| 1 0 0 0 0 0 1 0 0 0 0 0 0 0 0 0 0 0 0 0 0 0 1 0 0 1 0 0 0 0 0 0 0 0 0 0 0 0 0 0 0 0 0 0 0 0 0 0 0 0 0 0 0 0 0 0 0 0 0 0 0 0 0 0 0<br>0 0 1 |

the base graph Hb7 is

| |
|---|
| 0 1 1 1 1 1 1 1 1 0 1 1 1 0 1 1 1 0 1 0 1 1 1 1 0 0 0 0 0 0 0 0 0 0 0 0 0 0 0 0 0 0 0 0 0 0 0 0 0 0 0 0 0 0 0 0 0 0 0 0 0 0 0 0 0<br>0 0 0 |
| 1 1 1 0 0 1 1 1 0 1 1 1 0 1 1 1 0 1 0 1 1 1 0 1 1 0 0 0 0 0 0 0 0 0 0 0 0 0 0 0 0 0 0 0 0 0 0 0 0 0 0 0 0 0 0 0 0 0 0 0 0 0 0 0 0<br>0 0 0 |
| 1 1 1 1 1 0 0 0 1 1 1 1 1 1 0 1 1 1 1 1 0 0 1 0 1 1 0 0 0 0 0 0 0 0 0 0 0 0 0 0 0 0 0 0 0 0 0 0 0 0 0 0 0 0 0 0 0 0 0 0 0 0 0 0 0<br>0 0 0 |
| 1 0 0 1 1 1 1 1 1 1 0 0 1 1 1 0 1 1 1 1 1 1 1 0 0 1 0 0 0 0 0 0 0 0 0 0 0 0 0 0 0 0 0 0 0 0 0 0 0 0 0 0 0 0 0 0 0 0 0 0 0 0 0 0 0<br>0 0 0 |
| 1 1 0 0 0 0 0 0 0 0 0 0 0 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0<br>0 0 0 |
| 1 1 1 0 0 1 0 0 0 0 0 0 0 0 1 0 1 0 0 0 1 0 1 0 1 0 0 1 0 0 0 0 0 0 0 0 0 0 0 0 0 0 0 0 0 0 0 0 0 0 0 0 0 0 0 0 0 0 0 0 0 0 0 0 0<br>0 0 0 |
| 1 0 1 0 1 0 0 1 0 0 1 1 0 0 0 1 0 0 0 0 0 1 0 0 0 0 0 0 1 0 0 0 0 0 0 0 0 0 0 0 0 0 0 0 0 0 0 0 0 0 0 0 0 0 0 0 0 0 0 0 0 0 0 0 0<br>0 0 0 |
| 1 1 0 0 0 1 0 0 0 0 1 0 0 0 1 0 1 1 0 0 0 0 1 0 0 0 0 0 0 1 0 0 0 0 0 0 0 0 0 0 0 0 0 0 0 0 0 0 0 0 0 0 0 0 0 0 0 0 0 0 0 0 0 0 0<br>0 0 0 |
| 0 1 0 0 0 0 0 1 0 0 0 1 0 0 0 1 1 0 0 0 0 0 0 0 1 0 0 0 0 0 1 0 0 0 0 0 0 0 0 0 0 0 0 0 0 0 0 0 0 0 0 0 0 0 0 0 0 0 0 0 0 0 0 0 0<br>0 0 0 |
| 1 1 1 0 0 0 0 0 1 0 0 0 0 0 0 0 0 0 0 1 0 1 1 0 0 0 0 0 0 0 0 1 0 0 0 0 0 0 0 0 0 0 0 0 0 0 0 0 0 0 0 0 0 0 0 0 0 0 0 0 0 0 0 0 0<br>0 0 0 |
| 0 1 0 0 0 1 0 0 0 1 1 0 0 0 1 1 0 0 0 0 0 0 1 0 0 0 0 0 0 0 0 0 1 0 0 0 0 0 0 0 0 0 0 0 0 0 0 0 0 0 0 0 0 0 0 0 0 0 0 0 0 0 0 0 0<br>0 0 0 |
| 0 1 1 0 0 0 0 0 0 0 0 1 0 0 1 0 1 0 1 0 0 0 0 1 0 0 0 0 0 0 0 0 0 1 0 0 0 0 0 0 0 0 0 0 0 0 0 0 0 0 0 0 0 0 0 0 0 0 0 0 0 0 0 0 0<br>0 0 0 |
| 1 1 0 0 0 0 0 0 0 0 1 0 0 1 0 1 1 0 0 0 0 0 1 0 0 0 0 0 0 0 0 0 0 0 1 0 0 0 0 0 0 0 0 0 0 0 0 0 0 0 0 0 0 0 0 0 0 0 0 0 0 0 0 0 0<br>0 0 0 |
| 1 0 1 0 0 0 0 0 0 0 0 0 1 0 1 0 0 0 0 0 0 1 0 0 0 0 0 0 0 0 0 0 0 0 0 1 0 0 0 0 0 0 0 0 0 0 0 0 0 0 0 0 0 0 0 0 0 0 0 0 0 0 0 0 0<br>0 0 0 |
| 0 1 0 0 0 0 0 0 1 0 1 1 0 0 0 0 0 0 0 0 0 0 0 0 1 0 0 0 0 0 0 0 0 0 0 0 1 0 0 0 0 0 0 0 0 0 0 0 0 0 0 0 0 0 0 0 0 0 0 0 0 0 0 0 0<br>0 0 0 |
| 1 1 1 0 0 0 0 0 0 0 0 0 0 0 0 1 1 0 0 0 0 0 1 0 1 1 0 0 0 0 0 0 0 0 0 0 0 1 0 0 0 0 0 0 0 0 0 0 0 0 0 0 0 0 0 0 0 0 0 0 0 0 0 0 0<br>0 0 0 |
| 1 0 0 0 1 1 0 0 0 0 0 0 0 0 1 0 0 0 0 0 0 0 0 0 1 0 0 0 0 0 0 0 0 0 0 0 0 0 1 0 0 0 0 0 0 0 0 0 0 0 0 0 0 0 0 0 0 0 0 0 0 0 0 0 0<br>0 0 0 |
| 0 1 0 0 0 0 0 0 1 0 0 0 0 0 0 1 1 0 1 0 0 1 1 0 0 0 0 0 0 0 0 0 0 0 0 0 0 0 0 1 0 0 0 0 0 0 0 0 0 0 0 0 0 0 0 0 0 0 0 0 0 0 0 0 0<br>0 0 0 |
| 0 1 0 1 0 0 0 0 0 0 0 0 0 0 1 0 0 0 0 0 0 0 1 0 0 0 0 0 0 0 0 0 0 0 0 0 0 0 0 0 1 0 0 0 0 0 0 0 0 0 0 0 0 0 0 0 0 0 0 0 0 0 0 0 0<br>0 0 0 |
| 0 1 1 0 0 0 0 0 0 0 1 0 0 0 1 1 0 0 1 0 0 0 0 0 0 0 0 0 0 0 0 0 0 0 0 0 0 0 0 0 0 1 0 0 0 0 0 0 0 0 0 0 0 0 0 0 0 0 0 0 0 0 0 0 0<br>0 0 0 |
| 1 0 0 0 0 0 1 0 0 0 1 0 0 0 0 0 0 0 0 0 0 0 1 0 0 0 0 0 0 0 0 0 0 0 0 0 0 0 0 0 0 0 1 0 0 0 0 0 0 0 0 0 0 0 0 0 0 0 0 0 0 0 0 0 0<br>0 0 0 |
| 0 1 1 0 0 0 0 0 0 0 0 0 0 0 0 0 1 0 0 0 0 0 0 0 0 1 0 0 0 0 0 0 0 0 0 0 0 0 0 0 0 0 0 1 0 0 0 0 0 0 0 0 0 0 0 0 0 0 0 0 0 0 0 0 0<br>0 0 0 |

-continued 0 1 0 0 0 0 0 0 0 1 0 0 0 0 1 0 1 0 1 0 0 1 0 0 0 0 0 0 0 0 0 0 0 0 0 0 0 0 0 0 0 0 0 0 1 0 0 0 0 0 0 0 0 0 0 0 0 0 0 0 0 0 0 0 0 0 0 0
0 1 1 0 0 0 0 0 0 0 0 0 0 0 0 0 1 1 0 0 0 0 1 0 1 0 0 0 0 0 0 0 0 0 0 0 0 0 0 0 0 0 0 0 0 1 0 0 0 0 0 0 0 0 0 0 0 0 0 0 0 0 0 0 0 0 0 0
0 1 1 1 0 0 0 0 0 0 0 0 0 0 1 1 0 0 0 0 0 0 0 1 0 0 0 0 0 0 0 0 0 0 0 0 0 0 0 0 0 0 0 0 0 0 1 0 0 0 0 0 0 0 0 0 0 0 0 0 0 0 0 0 0 0 0 0
0 1 0 0 0 0 0 0 0 0 0 0 1 0 1 0 1 0 0 0 0 0 1 0 0 0 0 0 0 0 0 0 0 0 0 0 0 0 0 0 0 0 0 0 0 0 0 1 0 0 0 0 0 0 0 0 0 0 0 0 0 0 0 0 0 0 0 0
0 1 0 0 0 0 0 0 0 0 1 0 0 0 0 0 1 0 0 1 0 0 0 0 0 0 0 0 0 0 0 0 0 0 0 0 0 0 0 0 0 0 0 0 0 0 0 0 1 0 0 0 0 0 0 0 0 0 0 0 0 0 0 0 0 0 0 0
0 1 0 0 0 0 0 1 0 0 1 0 0 0 0 0 0 0 0 0 0 0 0 0 0 1 0 0 0 0 0 0 0 0 0 0 0 0 0 0 0 0 0 0 0 0 0 0 0 1 0 0 0 0 0 0 0 0 0 0 0 0 0 0 0 0 0 0
1 0 0 0 0 0 0 0 0 0 0 0 0 0 1 0 0 0 0 0 1 0 0 0 0 0 0 0 0 0 0 0 0 0 0 0 0 0 0 0 0 0 0 0 0 0 0 0 0 0 1 0 0 0 0 0 0 0 0 0 0 0 0 0 0 0 0 0
0 1 0 1 0 0 1 0 0 0 0 0 0 0 1 1 1 0 0 0 0 0 0 0 0 0 0 0 0 0 0 0 0 0 0 0 0 0 0 0 0 0 0 0 0 0 0 0 0 0 0 1 0 0 0 0 0 0 0 0 0 0 0 0 0 0 0 0
0 1 1 0 1 0 0 0 0 0 0 0 0 0 0 0 0 0 0 0 0 0 1 0 0 0 0 0 0 0 0 0 0 0 0 0 0 0 0 0 0 0 0 0 0 0 0 0 0 0 0 0 1 0 0 0 0 0 0 0 0 0 0 0 0 0 0 0
0 1 0 0 0 0 0 0 0 1 0 0 0 0 0 0 1 0 0 0 0 0 0 0 1 0 0 0 0 0 0 0 0 0 0 0 0 0 0 0 0 0 0 0 0 0 0 0 0 0 0 0 0 1 0 0 0 0 0 0 0 0 0 0 0 0 0 0
1 0 1 0 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 1 0 0 0 0 0 0 0 0 0 0 0 0 0
0 1 0 0 0 0 0 0 0 0 0 0 0 0 0 0 0 0 0 0 0 0 0 1 1 0 0 0 0 0 0 0 0 0 0 0 0 0 0 0 0 0 0 0 0 0 0 0 0 0 0 0 0 0 0 1 0 0 0 0 0 0 0 0 0 0 0 0
0 1 0 0 0 0 0 0 1 0 0 0 0 0 1 0 0 0 0 1 0 0 0 0 1 0 0 0 0 0 0 0 0 0 0 0 0 0 0 0 0 0 0 0 0 0 0 0 0 0 0 0 0 0 0 0 1 0 0 0 0 0 0 0 0 0 0 0
0 1 1 0 0 0 0 0 0 0 0 0 0 0 1 0 1 0 0 0 1 0 0 0 0 1 0 0 0 0 0 0 0 0 0 0 0 0 0 0 0 0 0 0 0 0 0 0 0 0 0 0 0 0 0 0 0 1 0 0 0 0 0 0 0 0 0 0
0 1 0 0 0 0 1 0 0 0 0 1 0 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 1 0 0 0 0 0 0 0 0 0
0 1 1 0 1 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0 0 1 0 0 0 0 0 0 0 0
0 1 0 0 0 0 0 0 1 0 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 1 0 0 0 0 0 0 0
0 1 0 0 0 0 0 1 0 0 0 0 1 0 1 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0 0 1 0 0 0 0 0 0
1 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 1 0 0 0 0 0
0 1 0 1 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 1 0 0 0 0
0 0 1 1 0 0 0 0 0 0 1 0 0 0 0 0 1 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 1 0 0 0
0 1 0 0 0 0 1 0 0 0 0 0 0 0 0 0 0 0 0 0 0 0 1 0 0 1 0 0 0 0 0 0 0 0 0 0 0 0 0 0 0 0 0 0 0 0 0 0 0 0 0 0 0 0 0 0 0 0 0 0 0 0 0 0 0 1 0 0
0 1 0 0 0 0 0 0 0 0 0 0 0 0 0 0 1 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0 0 1 0
0 1 0 0 0 0 0 0 0 0 0 1 0 1 1 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 1 the base graph Hb8 is 1 0 1 0 0 1 0 1 0 1 1 1 0 0 0 0 0 0 0 0 0 0 0 0 0 0 0 0 0 0 0 0 0 0 0 0 0 0 0 0 0 0 0 0 0 0 0 0 0 0 0
1 1 0 0 0 0 0 1 0 0 0 1 1 0 0 0 0 0 0 0 0 0 0 0 0 0 0 0 0 0 0 0 0 0 0 0 0 0 0 0 0 0 0 0 0 0 0 0 0 0 0
1 1 0 0 0 0 1 0 0 1 0 0 1 1 0 0 0 0 0 0 0 0 0 0 0 0 0 0 0 0 0 0 0 0 0 0 0 0 0 0 0 0 0 0 0 0 0 0 0 0 0
0 1 1 1 1 1 1 0 1 0 1 0 0 1 1 0 0 0 0 0 0 0 0 0 0 0 0 0 0 0 0 0 0 0 0 0 0 0 0 0 0 0 0 0 0 0 0 0 0 0 0
1 0 1 0 1 1 1 1 1 0 0 0 0 0 1 1 0 0 0 0 0 0 0 0 0 0 0 0 0 0 0 0 0 0 0 0 0 0 0 0 0 0 0 0 0 0 0 0 0 0 0
1 1 0 1 0 0 0 0 1 1 0 0 0 0 0 1 1 0 0 0 0 0 0 0 0 0 0 0 0 0 0 0 0 0 0 0 0 0 0 0 0 0 0 0 0 0 0 0 0 0 0
1 1 0 1 1 0 0 0 0 0 1 0 0 0 0 0 1 0 0 0 0 0 0 0 0 0 0 0 0 0 0 0 0 0 0 0 0 0 0 0 0 0 0 0 0 0 0 0 0 0 0
0 1 0 0 0 0 1 0 1 0 0 0 0 0 0 0 0 1 0 0 0 0 0 0 0 0 0 0 0 0 0 0 0 0 0 0 0 0 0 0 0 0 0 0 0 0 0 0 0 0 0
1 0 0 0 0 1 0 0 0 1 1 0 0 0 0 0 0 0 1 0 0 0 0 0 0 0 0 0 0 0 0 0 0 0 0 0 0 0 0 0 0 0 0 0 0 0 0 0 0 0 0
1 1 1 0 1 0 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0
1 0 0 1 0 0 0 1 0 0 0 0 0 0 0 0 0 0 0 0 1 0 0 0 0 0 0 0 0 0 0 0 0 0 0 0 0 0 0 0 0 0 0 0 0 0 0 0 0 0 0
1 1 0 0 0 0 1 0 1 0 0 0 0 0 0 0 0 0 0 0 0 1 0 0 0 0 0 0 0 0 0 0 0 0 0 0 0 0 0 0 0 0 0 0 0 0 0 0 0 0 0
1 1 0 0 1 0 0 0 0 1 0 0 0 0 0 0 0 0 0 0 0 0 1 0 0 0 0 0 0 0 0 0 0 0 0 0 0 0 0 0 0 0 0 0 0 0 0 0 0 0 0
0 1 0 1 0 0 0 0 0 0 0 1 0 0 0 0 0 0 0 0 0 0 0 1 0 0 0 0 0 0 0 0 0 0 0 0 0 0 0 0 0 0 0 0 0 0 0 0 0 0 0
1 1 0 0 0 0 0 0 0 0 0 0 0 0 1 0 0 0 0 0 0 0 0 0 1 0 0 0 0 0 0 0 0 0 0 0 0 0 0 0 0 0 0 0 0 0 0 0 0 0 0
1 0 0 0 1 0 0 0 0 1 0 1 0 0 0 0 0 0 0 0 0 0 0 0 0 1 0 0 0 0 0 0 0 0 0 0 0 0 0 0 0 0 0 0 0 0 0 0 0 0 0

-continued 1 0 0 0 0 0 1 0 0 0 1 0 0 0 0 0 0 0 0 0 0 0 0 0 0 0 1 0 0 0 0 0 0 0 0 0 0 0 0 0 0 0 0 0 0 0 0 0 0
0 0 0
0 1 0 0 0 0 0 0 0 1 0 0 0 0 1 0 0 0 0 0 0 0 0 0 0 0 0 1 0 0 0 0 0 0 0 0 0 0 0 0 0 0 0 0 0 0 0 0 0
0 0 0
1 0 1 0 0 0 0 1 0 0 0 0 0 0 0 0 0 0 0 0 0 0 0 0 0 0 0 0 1 0 0 0 0 0 0 0 0 0 0 0 0 0 0 0 0 0 0 0 0
0 0 0
1 0 0 1 0 0 0 0 1 0 0 1 0 0 0 0 0 0 0 0 0 0 0 0 0 0 0 0 0 1 0 0 0 0 0 0 0 0 0 0 0 0 0 0 0 0 0 0 0
0 0 0
1 1 0 0 0 1 0 0 0 0 0 0 0 0 0 0 0 0 0 0 0 0 0 0 0 0 0 0 0 0 1 0 0 0 0 0 0 0 0 0 0 0 0 0 0 0 0 0 0
0 0 0
1 0 0 0 1 0 0 0 0 0 0 0 0 0 1 0 0 0 0 0 0 0 0 0 0 0 0 0 0 0 0 1 0 0 0 0 0 0 0 0 0 0 0 0 0 0 0 0 0
0 0 0
0 1 0 0 0 0 0 0 0 0 0 0 0 0 0 1 0 0 0 0 0 0 0 0 0 0 0 0 0 0 0 0 1 0 0 0 0 0 0 0 0 0 0 0 0 0 0 0 0
0 0 0
1 0 0 0 0 0 1 1 0 0 0 0 0 0 0 0 0 0 0 0 0 0 0 0 0 0 0 0 0 0 0 0 0 1 0 0 0 0 0 0 0 0 0 0 0 0 0 0 0
0 0 0
1 0 0 0 0 0 0 0 0 0 0 1 0 0 0 1 0 0 0 0 0 0 0 0 0 0 0 0 0 0 0 0 0 0 1 0 0 0 0 0 0 0 0 0 0 0 0 0 0
0 0 0
1 0 0 0 0 0 0 1 0 0 1 0 0 0 0 0 0 0 0 0 0 0 0 0 0 0 0 0 0 0 0 0 0 0 0 1 0 0 0 0 0 0 0 0 0 0 0 0 0
0 0 0
1 0 0 0 0 0 0 0 0 0 0 1 0 0 1 0 0 0 0 0 0 0 0 0 0 0 0 0 0 0 0 0 0 0 0 0 1 0 0 0 0 0 0 0 0 0 0 0 0
0 0 0
0 1 0 0 0 0 1 0 0 0 0 0 0 0 0 1 0 0 0 0 0 0 0 0 0 0 0 0 0 0 0 0 0 0 0 0 0 1 0 0 0 0 0 0 0 0 0 0 0
0 0 0
1 0 0 0 0 1 0 0 0 1 0 0 0 0 0 0 0 0 0 0 0 0 0 0 0 0 0 0 0 0 0 0 0 0 0 0 0 0 1 0 0 0 0 0 0 0 0 0 0
0 0 0
1 0 0 0 0 0 0 0 0 0 0 0 0 0 0 0 1 0 0 0 0 0 0 0 0 0 0 0 0 0 0 0 0 0 0 0 0 0 0 1 0 0 0 0 0 0 0 0 0
0 0 0
0 0 0 0 0 0 0 1 0 0 0 1 0 0 1 0 0 0 0 0 0 0 0 0 0 0 0 0 0 0 0 0 0 0 0 0 0 0 0 0 1 0 0 0 0 0 0 0 0
0 0 0
0 1 0 0 0 0 0 0 1 0 0 0 0 0 0 0 0 0 0 0 0 0 0 0 0 0 0 0 0 0 0 0 0 0 0 0 0 0 0 0 0 1 0 0 0 0 0 0 0
0 0 0
0 0 0 0 0 0 0 1 0 0 0 1 0 0 0 1 0 0 0 0 0 0 0 0 0 0 0 0 0 0 0 0 0 0 0 0 0 0 0 0 0 0 1 0 0 0 0 0 0
0 0 0
1 0 1 0 0 0 0 0 0 0 0 0 0 0 0 0 0 0 0 0 0 0 0 0 0 0 0 0 0 0 0 0 0 0 0 0 0 0 0 0 0 0 0 1 0 0 0 0 0
0 0 0
0 0 0 1 0 0 1 0 0 0 0 0 0 0 0 1 0 0 0 0 0 0 0 0 0 0 0 0 0 0 0 0 0 0 0 0 0 0 0 0 0 0 0 0 1 0 0 0 0
0 0 0
0 1 0 0 0 1 0 0 0 0 0 0 0 0 0 0 0 0 0 0 0 0 0 0 0 0 0 0 0 0 0 0 0 0 0 0 0 0 0 0 0 0 0 0 0 1 0 0 0
0 0 0
0 0 0 0 0 0 0 1 0 0 0 1 0 0 1 0 0 0 0 0 0 0 0 0 0 0 0 0 0 0 0 0 0 0 0 0 0 0 0 0 0 0 0 0 0 0 1 0 0
0 0 0
1 0 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 1 0
0 0 0
0 0 0 0 0 0 1 0 0 0 0 0 0 0 1 1 0 0 0 0 0 0 0 0 0 0 0 0 0 0 0 0 0 0 0 0 0 0 0 0 0 0 0 0 0 0 0 0 1
0 0 0
0 0 0 0 0 0 0 1 0 1 0 1 0 0 0 0 0 0 0 0 0 0 0 0 0 0 0 0 0 0 0 0 0 0 0 0 0 0 0 0 0 0 0 0 0 0 0 0 0
1 0 0
0 1 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0
0 1 0
0 0 0 1 0 0 0 0 1 0 0 1 0 0 0 0 0 0 0 0 0 0 0 0 0 0 0 0 0 0 0 0 0 0 0 0 0 0 0 0 0 0 0 0 0 0 0 0 0
0 0 1 the base graph Hb9 is 1 0 1 1 0 1 1 1 0 0 1 1 0 0 0 0 0 0 0 0 0 0 0 0 0 0 0 0 0 0 0 0 0 0 0 0 0 0 0 0 0 0 0 0 0 0 0 0 0
0 0 0
0 1 0 0 1 0 1 1 1 0 0 1 1 0 0 0 0 0 0 0 0 0 0 0 0 0 0 0 0 0 0 0 0 0 0 0 0 0 0 0 0 0 0 0 0 0 0 0 0
0 0 0
1 0 1 1 0 1 0 0 0 1 0 0 1 1 0 0 0 0 0 0 0 0 0 0 0 0 0 0 0 0 0 0 0 0 0 0 0 0 0 0 0 0 0 0 0 0 0 0 0
0 0 0
0 1 0 0 1 0 1 0 1 0 1 0 0 1 1 0 0 0 0 0 0 0 0 0 0 0 0 0 0 0 0 0 0 0 0 0 0 0 0 0 0 0 0 0 0 0 0 0 0
0 0 0
1 1 1 1 0 0 0 1 0 1 0 0 0 0 1 1 0 0 0 0 0 0 0 0 0 0 0 0 0 0 0 0 0 0 0 0 0 0 0 0 0 0 0 0 0 0 0 0 0
0 0 0
1 1 0 0 1 1 0 0 1 1 1 0 0 0 0 1 0 0 0 0 0 0 0 0 0 0 0 0 0 0 0 0 0 0 0 0 0 0 0 0 0 0 0 0 0 0 0 0 0
0 0 0
1 1 0 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0 0
0 0 0
1 1 0 0 1 1 0 0 0 0 1 0 0 0 0 0 0 1 0 0 0 0 0 0 0 0 0 0 0 0 0 0 0 0 0 0 0 0 0 0 0 0 0 0 0 0 0 0 0
0 0 0
0 1 0 0 1 1 1 0 0 0 0 0 0 0 0 0 0 0 1 0 0 0 0 0 0 0 0 0 0 0 0 0 0 0 0 0 0 0 0 0 0 0 0 0 0 0 0 0 0
0 0 0
1 0 0 0 1 1 0 0 0 1 0 0 0 0 0 0 0 0 0 1 0 0 0 0 0 0 0 0 0 0 0 0 0 0 0 0 0 0 0 0 0 0 0 0 0 0 0 0 0
0 0 0
1 0 0 1 0 1 0 0 0 0 0 0 0 1 0 0 0 0 0 0 1 0 0 0 0 0 0 0 0 0 0 0 0 0 0 0 0 0 0 0 0 0 0 0 0 0 0 0 0
0 0 0
1 1 0 0 1 0 0 0 0 0 0 0 0 1 0 0 0 0 0 0 0 1 0 0 0 0 0 0 0 0 0 0 0 0 0 0 0 0 0 0 0 0 0 0 0 0 0 0 0
0 0 0
0 1 0 1 0 0 1 0 0 0 0 0 0 0 1 0 0 0 0 0 0 0 1 0 0 0 0 0 0 0 0 0 0 0 0 0 0 0 0 0 0 0 0 0 0 0 0 0 0
0 0 0
1 0 0 0 0 0 0 0 1 1 0 0 0 0 0 0 1 0 0 0 0 0 0 1 0 0 0 0 0 0 0 0 0 0 0 0 0 0 0 0 0 0 0 0 0 0 0 0 0
0 0 0

-continued 1 1 0 0 0 0 0 1 0 0 0 0 0 0 0 0 0 0 0 0 0 0 0 0 1 0 0 0 0 0 0 0 0 0 0 0 0 0 0 0 0 0 0 0 0 0 0 0 0
0 0 0
0 1 1 0 0 1 0 0 0 0 0 0 0 0 0 0 0 0 0 0 0 0 0 0 0 1 0 0 0 0 0 0 0 0 0 0 0 0 0 0 0 0 0 0 0 0 0 0 0
0 0 0
1 0 0 1 1 0 0 0 0 0 0 0 0 0 0 0 0 0 0 0 0 0 0 0 0 0 1 0 0 0 0 0 0 0 0 0 0 0 0 0 0 0 0 0 0 0 0 0 0
0 0 0
1 0 0 1 0 1 0 0 0 0 0 0 0 0 0 1 0 0 0 0 0 0 0 0 0 0 0 1 0 0 0 0 0 0 0 0 0 0 0 0 0 0 0 0 0 0 0 0 0
0 0 0
1 0 0 0 0 0 1 0 0 0 0 0 0 0 0 0 0 0 0 0 0 0 0 0 0 0 0 0 1 0 0 0 0 0 0 0 0 0 0 0 0 0 0 0 0 0 0 0 0
0 0 0
1 0 1 1 0 0 0 0 0 0 0 0 0 0 0 0 0 0 0 0 0 0 0 0 0 0 0 0 0 1 0 0 0 0 0 0 0 0 0 0 0 0 0 0 0 0 0 0 0
0 0 0
1 0 0 0 0 0 0 0 1 0 0 0 0 1 0 0 0 0 0 0 0 0 0 0 0 0 0 0 0 0 1 0 0 0 0 0 0 0 0 0 0 0 0 0 0 0 0 0 0
0 0 0
1 0 0 0 0 1 0 0 0 0 1 0 0 1 0 0 0 0 0 0 0 0 0 0 0 0 0 0 0 0 0 1 0 0 0 0 0 0 0 0 0 0 0 0 0 0 0 0 0
0 0 0
1 0 0 1 0 0 0 0 0 1 0 0 0 1 0 0 0 0 0 0 0 0 0 0 0 0 0 0 0 0 0 0 1 0 0 0 0 0 0 0 0 0 0 0 0 0 0 0 0
0 0 0
0 1 0 0 0 0 0 1 0 0 0 0 0 0 0 0 0 0 0 0 0 0 0 0 0 0 0 0 0 0 0 0 0 1 0 0 0 0 0 0 0 0 0 0 0 0 0 0 0
0 0 0
1 0 1 0 0 0 0 0 0 1 0 0 0 0 0 0 0 0 0 0 0 0 0 0 0 0 0 0 0 0 0 0 0 0 1 0 0 0 0 0 0 0 0 0 0 0 0 0 0
0 0 0
1 0 0 0 0 0 0 0 0 0 0 0 0 1 1 0 0 0 0 0 0 0 0 0 0 0 0 0 0 0 0 0 0 0 0 1 0 0 0 0 0 0 0 0 0 0 0 0 0
0 0 0
1 0 1 0 0 1 0 0 0 0 0 0 0 0 0 0 0 0 0 0 0 0 0 0 0 0 0 0 0 0 0 0 0 0 0 0 1 0 0 0 0 0 0 0 0 0 0 0 0
0 0 0
1 0 0 0 0 0 0 0 0 0 0 0 1 1 0 0 0 0 0 0 0 0 0 0 0 0 0 0 0 0 0 0 0 0 0 0 0 1 0 0 0 0 0 0 0 0 0 0 0
0 0 0
1 0 0 0 0 0 0 0 0 0 1 0 0 1 0 0 0 0 0 0 0 0 0 0 0 0 0 0 0 0 0 0 0 0 0 0 0 0 1 0 0 0 0 0 0 0 0 0 0
0 0 0
0 1 0 0 1 0 0 0 0 0 0 0 0 0 0 0 0 0 0 0 0 0 0 0 0 0 0 0 0 0 0 0 0 0 0 0 0 0 0 1 0 0 0 0 0 0 0 0 0
0 0 0
1 0 0 0 0 0 0 0 0 1 0 1 0 0 0 0 0 0 0 0 0 0 0 0 0 0 0 0 0 0 0 0 0 0 0 0 0 0 0 0 1 0 0 0 0 0 0 0 0
0 0 0
1 0 0 0 0 0 0 0 0 1 0 0 0 0 1 0 0 0 0 0 0 0 0 0 0 0 0 0 0 0 0 0 0 0 0 0 0 0 0 0 0 1 0 0 0 0 0 0 0
0 0 0
1 0 0 1 0 1 0 0 0 0 0 0 0 0 0 0 0 0 0 0 0 0 0 0 0 0 0 0 0 0 0 0 0 0 0 0 0 0 0 0 0 0 1 0 0 0 0 0 0
0 0 0
1 0 0 0 0 0 0 0 0 0 0 0 0 1 0 1 0 0 0 0 0 0 0 0 0 0 0 0 0 0 0 0 0 0 0 0 0 0 0 0 0 0 0 1 0 0 0 0 0
0 0 0
1 0 0 0 0 0 0 1 0 0 0 0 0 1 0 0 0 0 0 0 0 0 0 0 0 0 0 0 0 0 0 0 0 0 0 0 0 0 0 0 0 0 0 0 1 0 0 0 0
0 0 0
1 0 0 0 0 0 1 0 0 0 0 0 0 1 0 0 0 0 0 0 0 0 0 0 0 0 0 0 0 0 0 0 0 0 0 0 0 0 0 0 0 0 0 0 0 1 0 0 0
0 0 0
1 0 0 0 0 0 0 0 0 1 0 1 0 0 0 0 0 0 0 0 0 0 0 0 0 0 0 0 0 0 0 0 0 0 0 0 0 0 0 0 0 0 0 0 0 0 1 0 0
0 0 0
1 0 0 0 0 0 0 0 1 0 0 0 0 1 0 0 0 0 0 0 0 0 0 0 0 0 0 0 0 0 0 0 0 0 0 0 0 0 0 0 0 0 0 0 0 0 0 1 0
0 0 0
1 0 1 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0 1
0 0 0
1 0 1 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0
1 0 0 the base graph Hb10 is 1 1 0 1 0 0 1 0 0 1 1 1 0 0 0 0 0 0 0 0 0 0 0 0 0 0 0 0 0 0 0 0 0 0 0 0 0 0 0 0 0 0 0 0 0 0 0 0 0
0 0 0
1 0 1 0 1 1 1 1 1 1 0 1 1 0 0 0 0 0 0 0 0 0 0 0 0 0 0 0 0 0 0 0 0 0 0 0 0 0 0 0 0 0 0 0 0 0 0 0 0
0 0 0
1 1 1 0 1 0 0 0 1 0 1 0 1 1 0 0 0 0 0 0 0 0 0 0 0 0 0 0 0 0 0 0 0 0 0 0 0 0 0 0 0 0 0 0 0 0 0 0 0
0 0 0
0 1 0 1 1 1 1 1 1 1 1 0 0 1 0 0 0 0 0 0 0 0 0 0 0 0 0 0 0 0 0 0 0 0 0 0 0 0 0 0 0 0 0 0 0 0 0 0 0
0 0 0
1 1 1 0 0 0 0 0 0 0 0 1 1 0 1 0 0 0 0 0 0 0 0 0 0 0 0 0 0 0 0 0 0 0 0 0 0 0 0 0 0 0 0 0 0 0 0 0 0
0 0 0
1 0 0 0 0 1 0 1 0 0 0 1 0 0 0 1 0 0 0 0 0 0 0 0 0 0 0 0 0 0 0 0 0 0 0 0 0 0 0 0 0 0 0 0 0 0 0 0 0
0 0 0
1 1 0 0 0 0 0 1 0 0 0 1 0 0 0 0 1 0 0 0 0 0 0 0 0 0 0 0 0 0 0 0 0 0 0 0 0 0 0 0 0 0 0 0 0 0 0 0 0
0 0 0
1 1 0 0 1 1 0 0 0 0 0 0 0 0 0 0 0 1 0 0 0 0 0 0 0 0 0 0 0 0 0 0 0 0 0 0 0 0 0 0 0 0 0 0 0 0 0 0 0
0 0 0
0 1 0 0 0 0 0 0 0 1 0 1 1 0 0 0 0 0 1 0 0 0 0 0 0 0 0 0 0 0 0 0 0 0 0 0 0 0 0 0 0 0 0 0 0 0 0 0 0
0 0 0
1 1 1 0 0 0 0 1 0 0 0 0 0 0 0 0 0 0 0 1 0 0 0 0 0 0 0 0 0 0 0 0 0 0 0 0 0 0 0 0 0 0 0 0 0 0 0 0 0
0 0 0
0 1 0 0 0 1 0 1 0 0 1 0 0 0 0 0 0 0 0 0 1 0 0 0 0 0 0 0 0 0 0 0 0 0 0 0 0 0 0 0 0 0 0 0 0 0 0 0 0
0 0 0
1 0 0 0 0 0 0 0 0 0 0 1 0 1 0 0 0 0 0 0 0 1 0 0 0 0 0 0 0 0 0 0 0 0 0 0 0 0 0 0 0 0 0 0 0 0 0 0 0
0 0 0
0 1 1 0 0 0 0 1 0 1 0 0 0 0 0 0 0 0 0 0 0 0 1 0 0 0 0 0 0 0 0 0 0 0 0 0 0 0 0 0 0 0 0 0 0 0 0 0 0
0 0 0
0 1 0 0 0 0 0 0 1 0 0 1 1 0 0 0 0 0 0 0 0 0 0 1 0 0 0 0 0 0 0 0 0 0 0 0 0 0 0 0 0 0 0 0 0 0 0 0 0
0 0 0

-continued

| |
|---|
| 1 0 0 0 0 0 0 1 0 0 0 0 0 1 0 0 0 0 0 0 0 0 0 0 1 0 0 0 0 0 0 0 0 0 0 0 0 0 0 0 0 0 0 0 0 0 0 0 0 0 0 0 |
| 0 1 1 0 0 1 0 1 0 0 0 0 0 0 0 0 0 0 0 0 0 0 0 0 0 1 0 0 0 0 0 0 0 0 0 0 0 0 0 0 0 0 0 0 0 0 0 0 0 0 0 0 |
| 0 1 1 0 0 1 0 0 0 0 0 1 0 0 0 0 0 0 0 0 0 0 0 0 0 0 1 0 0 0 0 0 0 0 0 0 0 0 0 0 0 0 0 0 0 0 0 0 0 0 0 0 |
| 0 1 0 1 0 0 0 0 0 0 0 1 0 0 0 0 0 0 0 0 0 0 0 0 0 0 0 1 0 0 0 0 0 0 0 0 0 0 0 0 0 0 0 0 0 0 0 0 0 0 0 0 |
| 1 1 0 0 0 0 1 0 0 0 0 0 0 0 0 0 0 0 0 0 0 0 0 0 0 0 0 0 1 0 0 0 0 0 0 0 0 0 0 0 0 0 0 0 0 0 0 0 0 0 0 0 |
| 1 1 0 0 0 0 0 0 0 0 0 0 0 1 0 0 0 0 0 0 0 0 0 0 0 0 0 0 0 1 0 0 0 0 0 0 0 0 0 0 0 0 0 0 0 0 0 0 0 0 0 0 |
| 0 1 0 0 0 0 1 0 0 0 0 1 0 0 0 0 0 0 0 0 0 0 0 0 0 0 0 0 0 0 1 0 0 0 0 0 0 0 0 0 0 0 0 0 0 0 0 0 0 0 0 0 |
| 0 1 0 0 0 0 0 0 0 0 1 0 1 0 0 0 0 0 0 0 0 0 0 0 0 0 0 0 0 0 0 1 0 0 0 0 0 0 0 0 0 0 0 0 0 0 0 0 0 0 0 0 |
| 1 0 0 0 1 0 0 0 0 0 0 0 0 0 0 0 0 0 0 0 0 0 0 0 0 0 0 0 0 0 0 0 1 0 0 0 0 0 0 0 0 0 0 0 0 0 0 0 0 0 0 0 |
| 0 1 0 0 0 0 0 0 0 0 0 0 1 1 0 0 0 0 0 0 0 0 0 0 0 0 0 0 0 0 0 0 0 1 0 0 0 0 0 0 0 0 0 0 0 0 0 0 0 0 0 0 |
| 0 1 0 0 0 0 0 0 1 0 0 0 1 0 0 0 0 0 0 0 0 0 0 0 0 0 0 0 0 0 0 0 0 0 1 0 0 0 0 0 0 0 0 0 0 0 0 0 0 0 0 0 |
| 0 1 0 0 0 0 0 0 0 1 0 1 0 1 0 0 0 0 0 0 0 0 0 0 0 0 0 0 0 0 0 0 0 0 0 1 0 0 0 0 0 0 0 0 0 0 0 0 0 0 0 0 |
| 0 1 0 1 0 0 0 0 0 0 0 1 0 0 0 0 0 0 0 0 0 0 0 0 0 0 0 0 0 0 0 0 0 0 0 0 1 0 0 0 0 0 0 0 0 0 0 0 0 0 0 0 |
| 0 0 0 1 0 0 0 0 0 0 0 1 1 0 0 0 0 0 0 0 0 0 0 0 0 0 0 0 0 0 0 0 0 0 0 0 0 1 0 0 0 0 0 0 0 0 0 0 0 0 0 0 |
| 0 1 1 0 0 1 0 0 0 0 0 0 0 0 0 0 0 0 0 0 0 0 0 0 0 0 0 0 0 0 0 0 0 0 0 0 0 0 1 0 0 0 0 0 0 0 0 0 0 0 0 0 |
| 0 1 0 0 0 0 0 0 0 0 0 1 0 1 0 0 0 0 0 0 0 0 0 0 0 0 0 0 0 0 0 0 0 0 0 0 0 0 0 1 0 0 0 0 0 0 0 0 0 0 0 0 |
| 0 1 1 0 1 0 0 0 0 0 0 0 0 0 0 0 0 0 0 0 0 0 0 0 0 0 0 0 0 0 0 0 0 0 0 0 0 0 0 0 1 0 0 0 0 0 0 0 0 0 0 0 |
| 0 1 0 1 0 0 0 0 1 0 0 0 0 0 0 0 0 0 0 0 0 0 0 0 0 0 0 0 0 0 0 0 0 0 0 0 0 0 0 0 0 1 0 0 0 0 0 0 0 0 0 0 |
| 0 1 1 1 0 0 0 0 0 0 0 0 0 0 0 0 0 0 0 0 0 0 0 0 0 0 0 0 0 0 0 0 0 0 0 0 0 0 0 0 0 0 1 0 0 0 0 0 0 0 0 0 |
| 0 1 0 0 0 1 0 0 0 0 0 0 1 0 0 0 0 0 0 0 0 0 0 0 0 0 0 0 0 0 0 0 0 0 0 0 0 0 0 0 0 0 0 1 0 0 0 0 0 0 0 0 |
| 0 0 0 0 0 0 0 1 0 0 1 1 0 0 0 0 0 0 0 0 0 0 0 0 0 0 0 0 0 0 0 0 0 0 0 0 0 0 0 0 0 0 0 0 1 0 0 0 0 0 0 0 |
| 0 1 0 0 0 0 0 0 0 0 1 0 0 0 0 0 0 0 0 0 0 0 0 0 0 0 0 0 0 0 0 0 0 0 0 0 0 0 0 0 0 0 0 0 0 1 0 0 0 0 0 0 |
| 0 0 0 0 0 1 0 0 0 0 1 1 0 0 0 0 0 0 0 0 0 0 0 0 0 0 0 0 0 0 0 0 0 0 0 0 0 0 0 0 0 0 0 0 0 0 1 0 0 0 0 0 |
| 0 0 0 0 0 0 0 0 1 0 0 1 1 0 0 0 0 0 0 0 0 0 0 0 0 0 0 0 0 0 0 0 0 0 0 0 0 0 0 0 0 0 0 0 0 0 0 1 0 0 0 0 |
| 0 0 1 0 0 0 0 1 0 0 0 0 1 0 0 0 0 0 0 0 0 0 0 0 0 0 0 0 0 0 0 0 0 0 0 0 0 0 0 0 0 0 0 0 0 0 0 0 1 0 0 0 |
| 0 1 0 0 0 1 0 0 0 0 0 0 0 1 0 0 0 0 0 0 0 0 0 0 0 0 0 0 0 0 0 0 0 0 0 0 0 0 0 0 0 0 0 0 0 0 0 0 0 1 0 0 |
| 0 0 0 0 0 0 1 0 0 0 0 1 1 0 0 0 0 0 0 0 0 0 0 0 0 0 0 0 0 0 0 0 0 0 0 0 0 0 0 0 0 0 0 0 0 0 0 0 0 0 1 0 |
| 0 1 0 0 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 1 |

the base graph Hb11 is

| |
|---|
| 1 0 1 1 1 1 1 1 0 1 0 0 1 0 0 1 0 0 0 1 1 0 0 1 1 0 0 0 0 0 0 0 0 0 0 0 0 0 0 0 0 0 0 0 0 0 0 0 0 0 0 0 0 0 0 0 0 0 0 0 0 0 0 0 0 0 0 0 |
| 1 1 0 0 1 0 1 0 0 0 1 1 0 1 0 0 1 1 1 1 1 1 0 0 1 1 0 0 0 0 0 0 0 0 0 0 0 0 0 0 0 0 0 0 0 0 0 0 0 0 0 0 0 0 0 0 0 0 0 0 0 0 0 0 0 0 0 0 |
| 1 1 0 0 1 0 0 1 1 0 1 1 1 1 1 1 1 0 0 1 0 1 0 1 0 1 1 0 0 0 0 0 0 0 0 0 0 0 0 0 0 0 0 0 0 0 0 0 0 0 0 0 0 0 0 0 0 0 0 0 0 0 0 0 0 0 0 0 |
| 0 1 1 1 0 1 1 0 1 1 1 0 1 1 1 1 0 1 1 0 1 1 0 0 0 0 1 1 0 0 0 0 0 0 0 0 0 0 0 0 0 0 0 0 0 0 0 0 0 0 0 0 0 0 0 0 0 0 0 0 0 0 0 0 0 0 0 0 |
| 1 1 1 1 0 1 0 1 1 1 0 1 0 0 1 0 1 1 1 0 0 0 0 1 0 0 0 1 0 0 0 0 0 0 0 0 0 0 0 0 0 0 0 0 0 0 0 0 0 0 0 0 0 0 0 0 0 0 0 0 0 0 0 0 0 0 0 0 |
| 1 1 0 0 0 0 0 0 0 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 |
| 1 1 0 0 1 0 0 0 0 0 0 1 0 0 0 0 0 0 0 0 0 1 1 0 0 0 0 0 1 0 0 0 0 0 0 0 0 0 0 0 0 0 0 0 0 0 0 0 0 0 0 0 0 0 0 0 0 0 0 0 0 0 0 0 0 0 0 0 |
| 0 1 0 0 0 0 0 1 0 0 0 0 0 1 1 0 1 0 1 1 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0 |
| 1 1 1 1 0 1 0 0 0 1 1 0 0 0 0 0 0 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 |
| 1 1 0 0 1 0 0 0 0 0 0 1 1 0 0 1 0 0 0 0 0 0 1 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 |
| 1 1 0 0 0 0 0 1 1 0 0 0 0 0 0 0 1 0 0 0 1 1 0 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 |
| 1 1 1 0 0 1 0 0 0 0 0 0 0 0 0 0 0 1 0 1 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0 0 0 0 |

-continued 1 0 0 0 1 0 1 0 0 1 0 1 0 0 0 0 0 0 0 0 0 0 1 0 0 0 0 0 0 0 0 0 0 0 1 0 0 0 0 0 0 0 0 0 0 0 0 0 0 0 0 0 0 0 0 0 0 0 0 0 0 0 0 0 0
0 0 0

0 1 0 0 0 0 0 1 0 0 0 0 0 0 1 0 1 0 0 0 0 1 0 0 0 0 0 0 0 0 0 0 0 0 0 1 0 0 0 0 0 0 0 0 0 0 0 0 0 0 0 0 0 0 0 0 0 0 0 0 0 0 0 0 0
0 0 0

1 1 1 1 0 0 0 0 0 0 0 0 0 0 0 0 0 0 0 1 0 0 0 0 1 0 0 0 0 0 0 0 0 0 0 0 1 0 0 0 0 0 0 0 0 0 0 0 0 0 0 0 0 0 0 0 0 0 0 0 0 0 0 0 0
0 0 0

1 0 0 0 1 1 0 0 0 1 0 1 0 0 0 0 0 0 0 0 0 0 0 0 0 0 0 0 0 0 0 0 0 0 0 0 0 1 0 0 0 0 0 0 0 0 0 0 0 0 0 0 0 0 0 0 0 0 0 0 0 0 0 0 0
0 0 0

1 1 0 0 0 0 0 1 0 0 0 0 0 0 1 0 1 0 0 0 0 0 1 1 0 0 0 0 0 0 0 0 0 0 0 0 0 0 1 0 0 0 0 0 0 0 0 0 0 0 0 0 0 0 0 0 0 0 0 0 0 0 0 0 0
0 0 0

0 1 1 0 0 0 0 0 0 0 0 0 0 0 0 0 0 0 1 1 0 0 0 0 0 0 0 0 0 0 0 0 0 0 0 0 0 0 0 1 0 0 0 0 0 0 0 0 0 0 0 0 0 0 0 0 0 0 0 0 0 0 0 0 0
0 0 0

1 0 0 0 1 1 0 0 0 0 0 1 0 0 0 0 0 0 0 0 0 0 0 0 0 1 0 0 0 0 0 0 0 0 0 0 0 0 0 0 1 0 0 0 0 0 0 0 0 0 0 0 0 0 0 0 0 0 0 0 0 0 0 0 0
0 0 0

1 1 0 0 0 0 0 0 1 1 0 0 0 0 0 0 0 0 0 0 0 1 0 0 0 0 0 0 0 0 0 0 0 0 0 0 0 0 0 0 0 1 0 0 0 0 0 0 0 0 0 0 0 0 0 0 0 0 0 0 0 0 0 0 0
0 0 0

1 1 0 0 0 0 0 1 0 0 0 0 0 0 1 0 0 0 0 0 0 0 0 0 0 0 1 0 0 0 0 0 0 0 0 0 0 0 0 0 0 0 1 0 0 0 0 0 0 0 0 0 0 0 0 0 0 0 0 0 0 0 0 0 0
0 0 0

0 1 0 1 0 0 0 0 0 0 0 0 0 0 0 0 1 0 0 1 0 0 0 0 0 0 0 0 0 0 0 0 0 0 0 0 0 0 0 0 0 0 0 1 0 0 0 0 0 0 0 0 0 0 0 0 0 0 0 0 0 0 0 0 0
0 0 0

1 1 1 0 0 1 0 0 0 0 0 0 0 0 0 1 0 0 0 0 0 0 0 0 0 0 0 0 0 0 0 0 0 0 0 0 0 0 0 0 0 0 0 0 1 0 0 0 0 0 0 0 0 0 0 0 0 0 0 0 0 0 0 0 0
0 0 0

1 0 0 0 1 0 0 0 0 1 0 1 0 1 0 0 0 0 0 0 0 0 0 0 0 0 0 0 0 0 0 0 0 0 0 0 0 0 0 0 0 0 0 0 0 1 0 0 0 0 0 0 0 0 0 0 0 0 0 0 0 0 0 0 0
0 0 0

0 1 0 0 0 0 0 1 0 0 1 0 0 0 1 0 0 0 0 0 0 0 0 0 0 0 0 0 0 0 0 0 0 0 0 0 0 0 0 0 0 0 0 0 0 0 1 0 0 0 0 0 0 0 0 0 0 0 0 0 0 0 0 0 0
0 0 0

1 0 0 0 0 0 0 0 0 0 0 0 1 0 0 0 0 0 0 1 0 0 1 0 0 0 0 0 0 0 0 0 0 0 0 0 0 0 0 0 0 0 0 0 0 0 0 1 0 0 0 0 0 0 0 0 0 0 0 0 0 0 0 0 0
0 0 0

1 1 0 0 0 0 0 0 0 0 0 0 0 0 0 0 1 0 0 0 1 0 0 0 0 0 0 0 0 0 0 0 0 0 0 0 0 0 0 0 0 0 0 0 0 0 0 0 1 0 0 0 0 0 0 0 0 0 0 0 0 0 0 0 0
0 0 0

1 0 0 0 0 0 1 0 0 0 0 1 0 0 0 0 0 1 0 0 0 0 0 0 0 0 0 0 0 0 0 0 0 0 0 0 0 0 0 0 0 0 0 0 0 0 0 0 0 1 0 0 0 0 0 0 0 0 0 0 0 0 0 0 0
0 0 0

1 0 1 0 0 0 0 1 0 1 0 0 0 0 0 0 0 0 0 0 0 0 0 0 0 0 0 0 0 0 0 0 0 0 0 0 0 0 0 0 0 0 0 0 0 0 0 0 0 0 1 0 0 0 0 0 0 0 0 0 0 0 0 0 0
0 0 0

1 1 0 0 0 0 0 0 0 0 0 0 0 0 1 0 0 0 0 1 0 0 0 0 1 0 0 0 0 0 0 0 0 0 0 0 0 0 0 0 0 0 0 0 0 0 0 0 0 0 0 1 0 0 0 0 0 0 0 0 0 0 0 0 0
0 0 0

1 1 0 0 0 0 0 0 0 0 1 0 0 1 0 0 0 0 0 0 0 0 0 0 0 0 0 0 0 0 0 0 0 0 0 0 0 0 0 0 0 0 0 0 0 0 0 0 0 0 0 0 1 0 0 0 0 0 0 0 0 0 0 0 0
0 0 0

0 1 0 0 1 0 0 0 0 0 0 0 0 0 0 0 0 0 0 0 0 0 0 0 0 1 0 0 0 0 0 0 0 0 0 0 0 0 0 0 0 0 0 0 0 0 0 0 0 0 0 0 0 1 0 0 0 0 0 0 0 0 0 0 0
0 0 0

1 0 0 0 0 1 0 0 0 0 0 0 0 0 0 0 1 1 0 0 0 0 0 0 0 0 0 0 0 0 0 0 0 0 0 0 0 0 0 0 0 0 0 0 0 0 0 0 0 0 0 0 0 0 1 0 0 0 0 0 0 0 0 0 0
0 0 0

1 1 0 0 0 0 0 1 0 0 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0 1 0 0 0 0 0 0 0 0 0
0 0 0

1 1 0 0 0 0 0 0 1 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 1 0 0 0 0 0 0 0 0
0 0 0

1 1 0 0 0 0 0 0 0 0 0 1 0 0 0 0 0 0 0 1 0 0 0 0 0 0 1 0 0 0 0 0 0 0 0 0 0 0 0 0 0 0 0 0 0 0 0 0 0 0 0 0 0 0 0 0 0 1 0 0 0 0 0 0 0
0 0 0

1 1 0 0 0 0 0 0 0 1 0 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 1 0 0 0 0 0 0
0 0 0

1 0 0 0 0 1 0 0 0 0 0 0 0 0 0 0 1 0 0 0 0 0 0 1 0 0 0 0 0 0 0 0 0 0 0 0 0 0 0 0 0 0 0 0 0 0 0 0 0 0 0 0 0 0 0 0 0 0 0 1 0 0 0 0 0
0 0 0

0 1 0 0 0 0 0 1 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 1 0 0 0 0
0 0 0

1 1 0 0 0 0 1 0 0 0 0 0 0 0 0 0 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 1 0 0 0
0 0 0

1 0 0 1 0 0 0 0 0 0 0 0 0 0 1 0 0 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 1 0 0
0 0 0

1 0 0 0 0 0 0 0 0 0 0 1 0 0 0 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0 1 0
0 0 0

1 1 0 0 0 0 0 0 0 0 0 0 0 0 0 0 0 0 0 0 1 1 0 0 0 0 0 0 0 0 0 0 0 0 0 0 0 0 0 0 0 0 0 0 0 0 0 0 0 0 0 0 0 0 0 0 0 0 0 0 0 0 0 0 1
0 0 0

1 0 0 0 0 0 0 0 0 1 0 0 0 0 0 0 1 0 0 0 0 0 0 0 0 0 1 0 0 0 0 0 0 0 0 0 0 0 0 0 0 0 0 0 0 0 0 0 0 0 0 0 0 0 0 0 0 0 0 0 0 0 0 0 0
1 0 0

0 1 0 0 0 0 0 0 0 0 1 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0
0 1 0

1 0 0 0 0 1 0 0 1 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0 0
0 0 1.

In an embodiment, the second base graph and the third base graph are the base graphs of the following base graphs Hb1 to Hb11 after adjustment.

where a proportion of the number of "1" elements in the base graph after adjustment increases c % and/or decreases c' % compared with the base graph before adjustment, where c and c' are non-negative real numbers, and c≤5, c'≤5.

Embodiment Five

Embodiment five of the present disclosure provides an electronic device for processing quasi-cyclic LDPC coding, including: a memory and a processor.

The memory is configured to store a program for processing the quasi-cyclic LDPC coding. When the program for processing the quasi-cyclic LDPC coding is read and executed by the processor, the following operations are performed:

determining, according to a data feature of an information bit sequence to be encoded, a processing strategy for the quasi-cyclic LDPC coding; and performing, according to the processing strategy and based on a base matrix and a lifting size, the quasi-cyclic LDPC coding and rate matching output on the information bit sequence.

Figure 1:
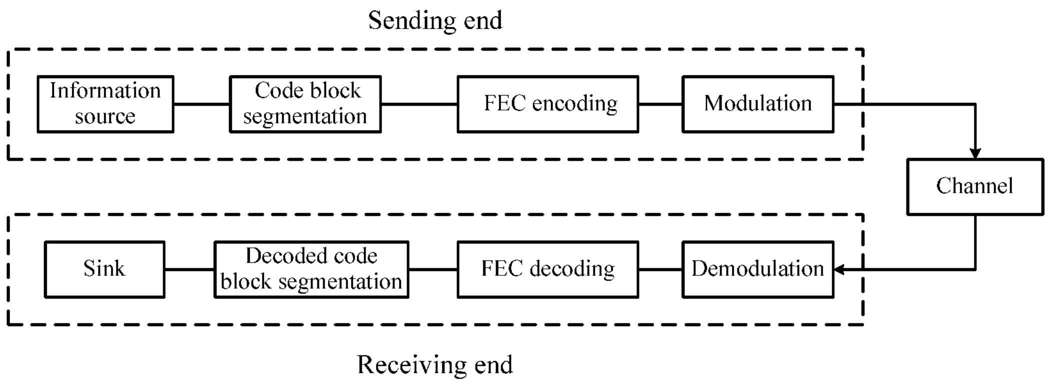
FIG. 1 is a block diagram of a digital communication system in the related art.
Figure 14:
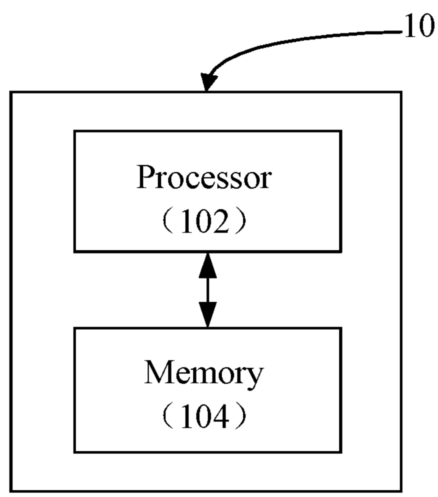
FIG. 14 is a schematic diagram of an electronic device for processing quasi-cyclic LDPC coding according to embodiment four of the present disclosure.

The method embodiment provided by embodiment one of the present disclosure may be executed by the electronic device provided by the embodiment three. FIG. 14 is a block diagram of hardware of an electronic device for processing quasi-cyclic LDPC coding according to the embodiment three of the present disclosure. As shown in FIG. 14, an electronic device 10 may include one or more (only one is shown in FIG. 1) processors 102 (the processor 102 may include, but is not limited to, a microprocessor such as an MCU, a programmable logic device such as an FPGA or other processing devices), a memory 104 used for storing data. It should be understood by those skilled in the art that the structure shown in FIG. 14 is merely illustrative and not intended to limit the structure of the electronic device described above. For example, the electronic device 10 may further include more or less components than the components shown in FIG. 14, or has a configuration different from the configuration shown in FIG. 14.

The memory 104 may be used for storing software programs and modules of application software, such as program instructions/modules corresponding to the processing method for quasi-cyclic LDPC coding in the embodiments of the present disclosure. The processor 102 executes the software programs and modules stored in the memory 104 so as to perform various function applications and data processing, that is, to implement the method described above. The memory 104 may include a high-speed random access memory, and may further include a nonvolatile memory, such as one or more magnetic storage apparatuses, flash memories or other nonvolatile solid-state memories. In some examples, the memory 104 may further include memories located remotely relative to the processor 1402 and these remote memories may be connected to the electronic device via networks. Examples of the above network include, but are not limited to, the Internet, an intranet, a local area network, a mobile communication network and a combination thereof.

Embodiment Six

Embodiment six of the present disclosure further provides a computer-readable storage medium configured to store computer-executable instructions for executing the above-mentioned method when executed by a processor.

It will be understood by those of ordinary skill in the art that functional modules/units in all or part of the steps of the method, the system and the device disclosed above may be implemented as software, firmware, hardware and appropriate combinations thereof. In the hardware implementation, the division of functional modules/units mentioned in the above description may not correspond to the division of physical units. For example, one physical component may have several functions, or one function or step may be executed jointly by several physical components. Some or all components may be implemented as software executed by processors such as digital signal processors or microcontrollers, hardware, or integrated circuits such as application specific integrated circuits. Such software may be distributed on a computer-readable medium, which may include a computer storage medium (or a non-transitory medium) and a communication medium (or a transitory medium). As is known to those of ordinary skill in the art, the term, computer storage medium, includes volatile and nonvolatile, removable and non-removable media implemented in any method or technology for storing information (such as computer-readable instructions, data structures, program modules or other data). The computer storage medium includes, but is not limited to, a random access memory (RAM), a read-only memory (ROM), an electrically erasable programmable read-only memory (EEPROM), a flash memory or other memory technologies, a compact disc-read only memory (CD-ROM), a digital versatile disc (DVD) or other optical disc storage, a magnetic cassette, a magnetic tape, a magnetic disk storage or other magnetic storage devices, or any other media used for storing desired information and accessed by a computer. In addition, as is known to those of ordinary skill in the art, the communication medium generally includes computer-readable instructions, data structures, program modules or other data in modulated data signals such as carriers or other transmission mechanisms, and may include any information delivery medium.

It is to be noted that the present disclosure may have other various embodiments. Corresponding changes and modifications may be made by those skilled in the art according to the present disclosure without departing from the spirit and essence of the present disclosure. However, these corresponding changes and modifications fall within the scope of the claims in the present disclosure.

INDUSTRIAL APPLICABILITY

Through embodiments of the present disclosure, according to a data feature of an information bit sequence to be encoded, a processing strategy for the quasi-cyclic LDPC coding is determined. According to the processing strategy and based on a base matrix and a lifting size, the quasi-cyclic LDPC coding and rate matching output are performed on the information bit sequence. Technical solution of embodiments of the present disclosure is able to improve adaptability and flexibility of the quasi-cyclic LDPC coding.

What is claimed is:

1. A method for a quasi-cyclic low density parity check (LDPC) coding, comprising:

performing the quasi-cyclic LDPC coding based on a base matrix and according to a maximum number of systematic columns used for the quasi-cyclic LDPC coding, wherein the maximum number of systematic columns used for the quasi-cyclic LDPC coding is a difference between a total number of columns and a total number of rows of the base matrix of the quasi-cyclic LDPC coding, and wherein the maximum number of systematic columns used for the quasi-cyclic LDPC coding and a characteristic of the base matrix are based on a length of an information bit sequence to be encoded and a modulation and coding scheme (MCS) index of the information bit sequence.

2. The method of claim 1, wherein the characteristic of the base matrix comprises an orthogonality of the base matrix;

wherein the orthogonality of the base matrix includes a quasi-orthogonal property and a non-orthogonal property, wherein the base matrix Hb is $$Hb = \begin{bmatrix} A & B & C \\ & D & E \end{bmatrix},$$

and wherein the orthogonality of the base matrix is orthogonality of a sub-matrix D.

3. The method of claim 2, wherein the quasi-orthogonal property includes:

a first column index number set ColSET0 and a second column index number set ColSET1, where the ColSET0 and the ColSET1 have no intersection set and a union set of the ColSET0 and the ColSET1 forms all column index numbers of the sub-matrix D, a first sub-matrix formed by all columns indicated by the first column index number set ColSET0 in the sub-matrix D is D0, a second sub-matrix formed by all columns indicated by the second column index number set ColSET1 in the sub-matrix D is D1, and wherein D1 has an orthogonal property and D0 does not have the orthogonal property.

4. The method of claim 2, wherein the non-orthogonal property includes that the sub-matrix D does not have the quasi-orthogonal property.

5. The method of claim 3, wherein the orthogonal property includes that:

there is no intersection set among row index number sets RowSETi (i=0, 1, . . . , (I−1)), a union set of all row index number sets RowSETi (i=0, 1, . . . , (I−1)) forms all row index numbers of the sub-matrix D, and in the sub-matrix D, a sub-matrix Di formed by all rows indicated by a row index number set RowSETi has at most one non-−1 element in all elements indicated by any one column index number, wherein I is a positive integer less than a number of rows of the sub-matrix D, and wherein RowSETi (i=0, 1, . . . , (I−1)) includes at least two elements, wherein the at most one non-−1 element indicates a cyclic shifting value of an identity matrix.

6. The method of claim 3, wherein the first column index number set ColSET0={0, 1}.

7. The method of claim 1, wherein the characteristic of the base matrix comprises a minimum code rate of the base matrix at a maximum length of the information bit sequence.

8. The method of claim 7, wherein the minimum code rate of the base matrix at the maximum length of the information bit sequence is either 1/5 or 1/3.

9. The method of claim 1, wherein the characteristic of the base matrix comprises a maximum information length supported by the quasi-cyclic LDPC coding.

10. The method of claim 9, wherein the maximum information length supported by the quasi-cyclic LDPC coding is equal to the maximum number of systematic columns of the base matrix times a maximum lifting size.

11. A device for a quasi-cyclic low density parity check (LDPC) coding, comprising:

a processor configured to:

perform the quasi-cyclic LDPC coding based on a base matrix and according to a maximum number of systematic columns used for the quasi-cyclic LDPC coding, wherein the maximum number of systematic columns used for the quasi-cyclic LDPC coding is a difference between a total number of columns and a total number of rows of the base matrix of the quasi-cyclic LDPC coding, and wherein the maximum number of systematic columns used for the quasi-cyclic LDPC coding and a characteristic of the base matrix are based on a length of an information bit sequence to be encoded and a modulation and coding scheme (MCS) index of the information bit sequence.

12. The device of claim 11, wherein the characteristic of the base matrix comprises an orthogonality of the base matrix;

wherein the orthogonality of the base matrix includes a quasi-orthogonal property and a non-orthogonal property, wherein the base matrix Hb is $$Hb = \begin{bmatrix} A & B & C \\ & D & E \end{bmatrix},$$

and wherein the orthogonality of the base matrix is orthogonality of a sub-matrix D.

13. The device of claim 12, wherein the quasi-orthogonal property includes:

a first column index number set ColSET0 and a second column index number set ColSET1, where the ColSET0 and the ColSET1 have no intersection set and a union set of the ColSET0 and the ColSET1 forms all column index numbers of the sub-matrix D, a first sub-matrix formed by all columns indicated by the first column index number set ColSET0 in the sub-matrix D is D0, a second sub-matrix formed by all columns indicated by the second column index number set ColSET1 in the sub-matrix D is D1, and wherein D1 has an orthogonal property and D0 does not have the orthogonal property.

14. The device of claim 12, wherein the non-orthogonal property includes that the sub-matrix D does not have the quasi-orthogonal property.

15. The device of claim 13, wherein the orthogonal property includes that:

there is no intersection set among row index number sets RowSETi (i=0, 1, . . . , (I−1)), a union set of all row index number sets RowSETi (i=0, 1, . . . , (I−1)) forms all row index numbers of the sub-matrix D, and in the sub-matrix D, a sub-matrix Di formed by all rows indicated by a row index number set RowSETi has at most one non-−1 element in all elements indicated by any one column index number, wherein I is a positive integer less than a number of rows of the sub-matrix D, and wherein RowSETi (i=0, 1, . . . , (I−1)) includes at least two elements, wherein the at most one non-−1 element indicates a cyclic shifting value of an identity matrix.

16. The device of claim 13, wherein the first column index number set ColSET0={0,1}.

17. The device of claim 11, wherein the characteristic of the base matrix comprises a minimum code rate of the base matrix at a maximum length of the information bit sequence.

18. The device of claim 17, wherein the minimum code rate of the base matrix at the maximum length of the information bit sequence is either 1/5 or 1/3.

19. The device of claim 11, wherein the characteristic of the base matrix comprises a maximum information length supported by the quasi-cyclic LDPC coding.

20. The device of claim 19, wherein the maximum information length supported by the quasi-cyclic LDPC coding is equal to the maximum number of systematic columns of the base matrix times a maximum lifting size.

* * * * *